(12) United States Patent
Peng et al.

(10) Patent No.: US 9,859,456 B2
(45) Date of Patent: Jan. 2, 2018

(54) DISPLAY DEVICE

(71) Applicant: InnoLux Corporation, Miao-Li County (TW)

(72) Inventors: Jen-Chieh Peng, Miao-Li County (TW); Tsau-Hua Hsieh, Miao-Li County (TW); Bo-Feng Chen, Miao-Li County (TW); Shun-Yuan Hu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/257,445

(22) Filed: Sep. 6, 2016

(65) Prior Publication Data
US 2017/0069784 A1  Mar. 9, 2017

(30) Foreign Application Priority Data

Sep. 9, 2015  (TW) .............................. 104129743 A
Feb. 5, 2016  (TW) .............................. 105103992 A
Jun. 3, 2016  (TW) .............................. 105117520 A

(51) Int. Cl.
H01L 33/00  (2010.01)
H01L 33/50  (2010.01)
(Continued)

(52) U.S. Cl.
CPC ........ *H01L 33/0041* (2013.01); *H01L 27/124* (2013.01); *H01L 27/15* (2013.01);
(Continued)

(58) Field of Classification Search
CPC ... H01L 25/0753; H01L 27/153; H01L 33/62; H01L 33/20
See application file for complete search history.

(56) References Cited

U.S. PATENT DOCUMENTS 7,491,975 B2 *  2/2009  Kubota ............... H01L 51/5234
                                                    257/103
9,267,664 B2    2/2016  Chen et al.
(Continued)

FOREIGN PATENT DOCUMENTS

CN  101510029 B  1/2012
TW  201427893 A  7/2014

OTHER PUBLICATIONS

Chinese language office action dated Oct. 23, 2017, issued in application No. TW 105117520.

*Primary Examiner* — Quoc Hoang
(74) *Attorney, Agent, or Firm* — McClure, Qualey & Rodack, LLP

(57) ABSTRACT

A display device is provided. The display device includes a first substrate; a first transistor and a second transistor disposed over the first substrate; a common electrode disposed over the first substrate; and a light-emitting diode chip (LED chip) disposed over the first substrate and disposed corresponding to the first transistor and the second transistor. The light-emitting diode chip includes a first light-emitting unit and a second light-emitting unit, wherein the first light-emitting unit is electrically connected to the first transistor and the common electrode, and the second light-emitting unit is electrically connected to the second transistor and the common electrode.

20 Claims, 58 Drawing Sheets

(51) Int. Cl.
   *H01L 33/58*  (2010.01)
   *H01L 33/62*  (2010.01)
   *H01L 33/38*  (2010.01)
   *H01L 27/12*  (2006.01)
   *H01L 27/15*  (2006.01)

(52) U.S. Cl.
   CPC ............ *H01L 33/002* (2013.01); *H01L 33/38* (2013.01); *H01L 33/502* (2013.01); *H01L 33/58* (2013.01); *H01L 33/62* (2013.01)

(56) References Cited

U.S. PATENT DOCUMENTS

| | | | |
|---|---|---|---|
| 9,343,691 B2 * | 5/2016 | Seo | ..................... H01L 51/5215 |
| 2007/0273305 A1 | 11/2007 | Kubota | |
| 2008/0198440 A1 | 8/2008 | Cho | |
| 2013/0303777 A1 * | 11/2013 | Okamoto | .............. C07F 15/002 548/103 |

* cited by examiner

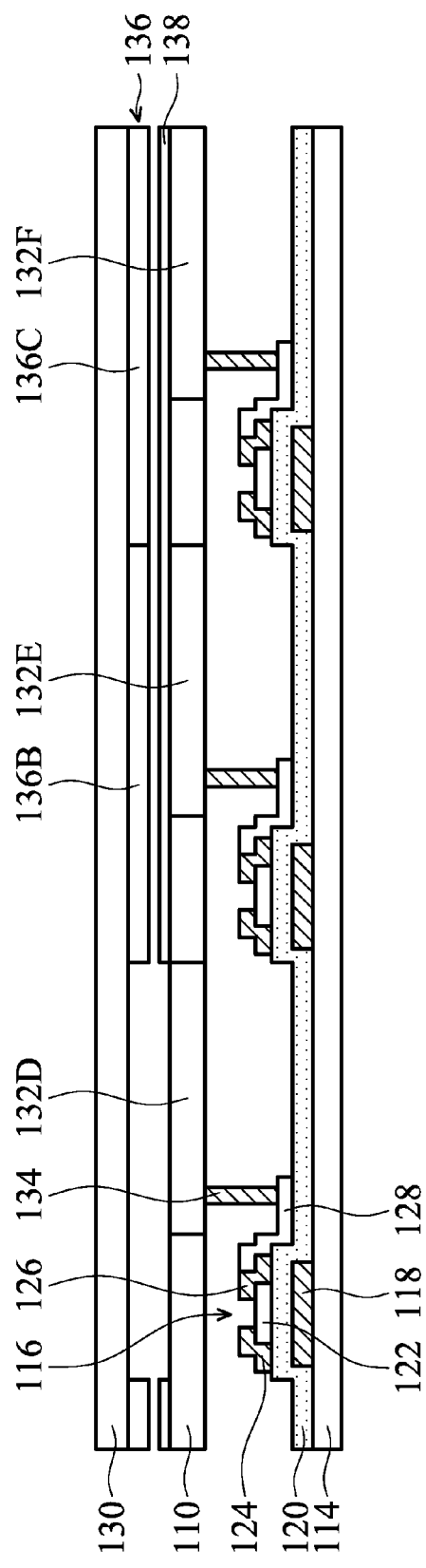

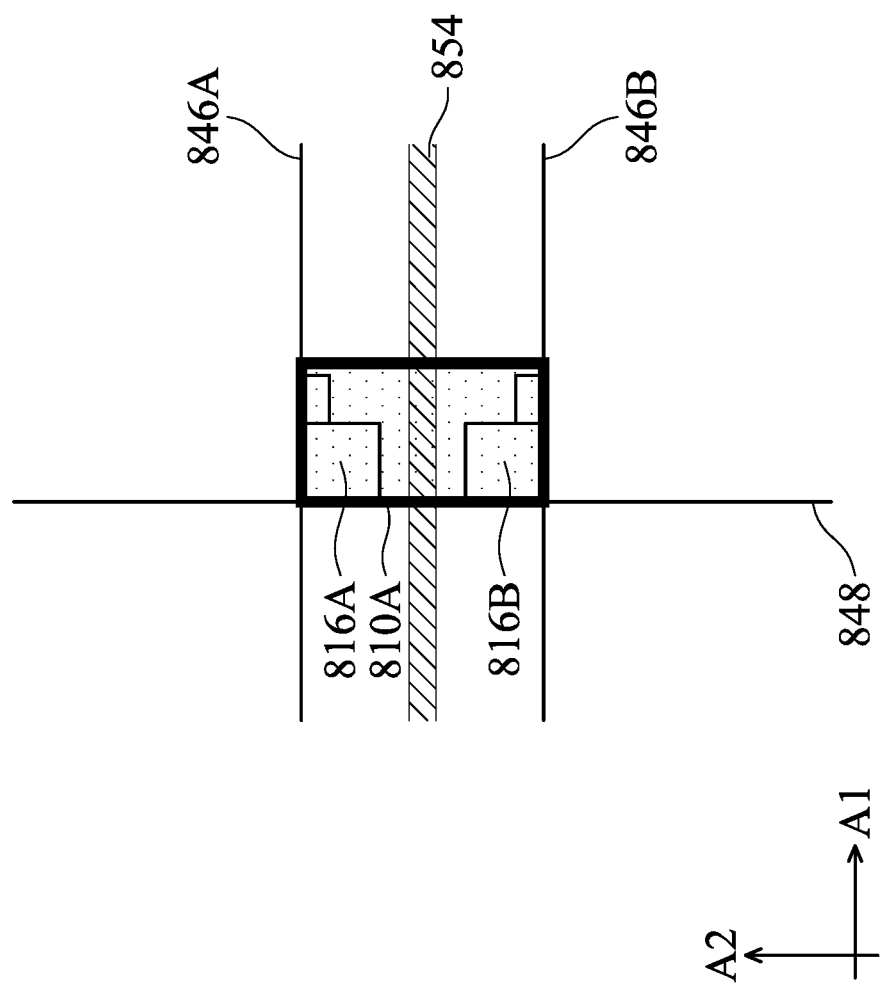

DISPLAY DEVICE

CROSS REFERENCE TO RELATED APPLICATIONS

This application claims priority of Taiwan Patent Application No. 105117520, filed on Jun. 3, 2016, the entirety of which is incorporated by reference herein. This application also claims priority of Taiwan Patent Application No. 105103992, filed on Feb. 5, 2016, the entirety of which is incorporated by reference herein. This application further claims priority of Taiwan Patent Application No. 104129743, filed on Sep. 9, 2015, the entirety of which is incorporated by reference herein.

BACKGROUND

Technical Field

The disclosure relates to a display device, and in particular to a display device with a light-emitting diode chip.

Description of the Related Art

As digital technology develops, display devices are becoming more widely used in our society. For example, display devices have been applied in modern information and communication devices such as televisions, notebooks, computers, mobile phones and smartphones. In addition, each generation of display devices has been developed to be thinner, lighter, smaller, and more fashionable. The display devices include light-emitting diode display devices.

The recombination radiation of electron and hole in the light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors.

Since mass production has become the tendency recently in the light-emitting diode industry, any increase in the yield of manufacturing light-emitting diodes will reduce costs and result in huge economic benefits. However, the existing display devices have not been satisfactory in every respect. Therefore, a cost-effective display device is needed.

SUMMARY

The present disclosure provides a display device, including: a first substrate; a first transistor and a second transistor disposed over the first substrate; a common electrode disposed over the first substrate; and a light-emitting diode chip (LED chip) disposed over the first substrate and disposed corresponding to the first transistor and the second transistor, wherein the light-emitting diode chip includes a first light-emitting unit and a second light-emitting unit, wherein the first light-emitting unit is electrically connected to the first transistor and the common electrode, and the second light-emitting unit is electrically connected to the second transistor and the common electrode.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 1H is a cross-sectional view of a display device in accordance with another embodiment of the present disclosure;

FIG. 8C is a partial top view of a display device in accordance with another embodiment of the present disclosure;

DETAILED DESCRIPTION

Figure 1A:
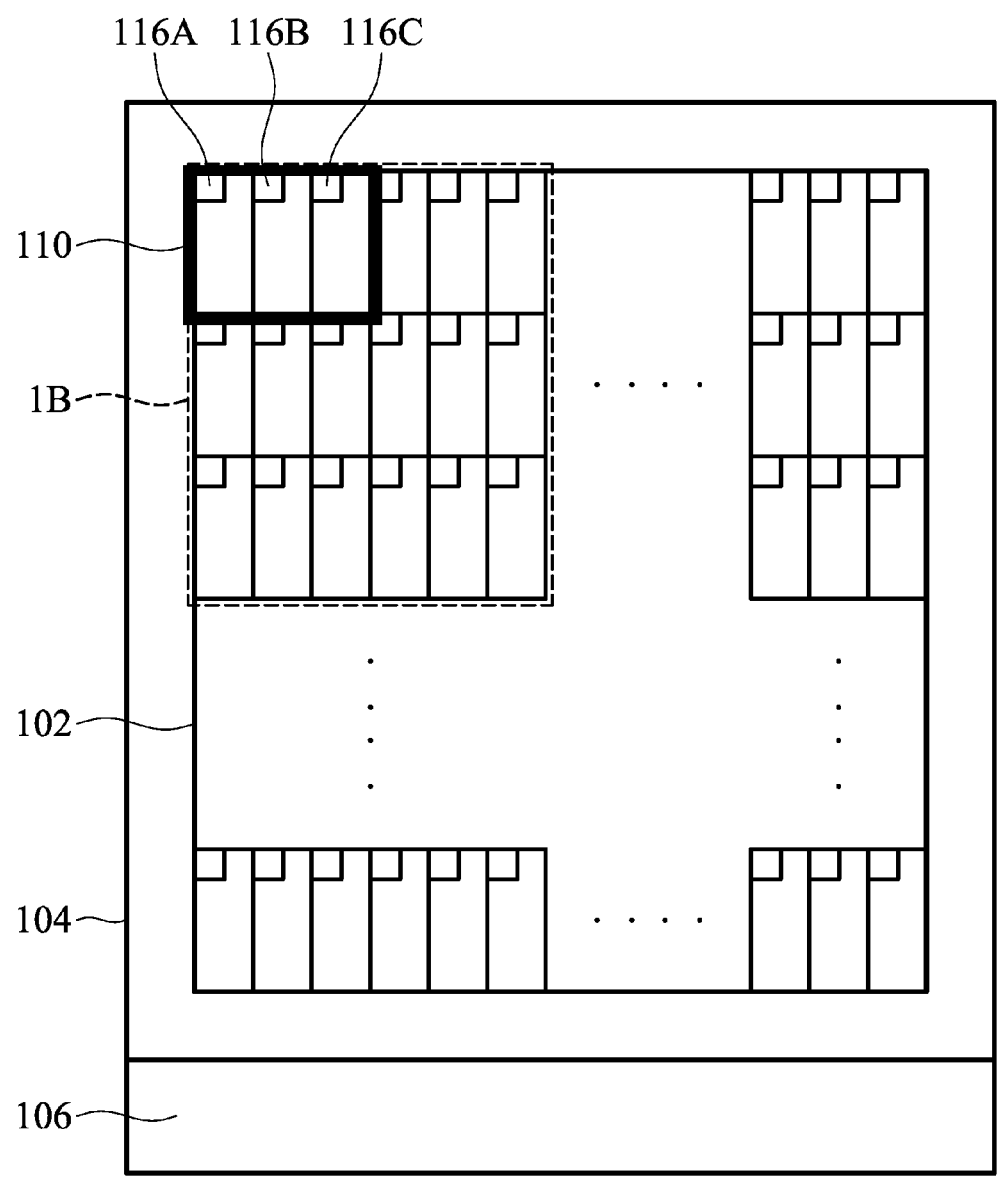
FIG. 1A is a top view of a display device in accordance with some embodiments of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a semiconductor wafer and the layers overlying the wafer. All semiconductor element needed may be already formed over the substrate. However, the substrate is represented with a flat surface in order to simplify the drawing. The term "substrate surface" is meant to include the uppermost exposed layers on a semiconductor wafer, such as silicon surface, and insulating layer and/or metallurgy lines.

The embodiment of the present disclosure disposes the light-emitting diode chip corresponding to at least two transistors in the display device such that the amount of light-emitting diode chips used in the display device may be reduced. Therefore, the number of times that the light-emitting diode chips are attached during the manufacturing process may be reduced, which in turn reduces the manufacturing time and cost, and improves the yield.

Figure 1B:
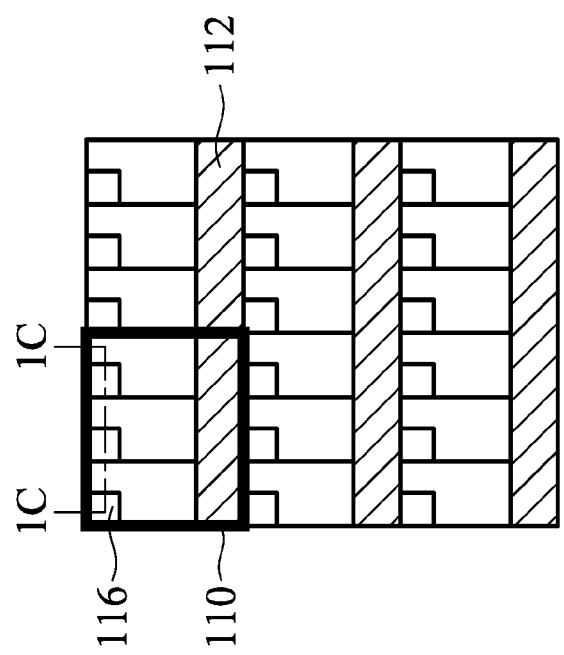
FIG. 1B is a partially enlarged figure of region 1B of the display device in FIG. 1A.

FIG. 1A is a top view of a display device 100 in accordance with some embodiments of the present disclosure. FIG. 1B is a partially enlarged figure of region 1B of the display device 100 in FIG. 1A. Referring to FIG. 1A, the display device 100 includes a display region 102 and a non-display region 104 adjacent to the display region 102. In this embodiment, the non-display region 104 surrounds or encloses the display region 102. The display region 102 refers to the display region in the display device 100 in which the transistor is disposed. In other words, the display region 102 refers to the region other than the non-display region in the display device 100. The transistor may include, but is not limited to, a thin film transistor. In addition, the non-display region 104 may include an out lead bonding (OLB) region 106, as shown in FIG. 1A.

Referring to FIGS. 1A-1B, the display device 100 may include, but is not limited to, a light-emitting diode chip display device. The display device 100 includes a plurality of transistors 116 and a light-emitting diode chip 110 disposed corresponding to at least two transistors 116.

In the embodiment of the present disclosure, the light-emitting diode chip 110 is disposed corresponding to three transistors (for example 116A, 116B and 116C). The display device 100 further includes a common electrode 112.

The embodiment of the present disclosure disposes the light-emitting diode chip corresponding to three transistors in the display device such that the amount of light-emitting diode chips used in the display device may be reduced. Therefore, the number of times that the light-emitting diode chips are attached during the manufacturing process may be reduced, which in turn reduces the manufacturing time and cost, and improves the yield.

Figure 1C:
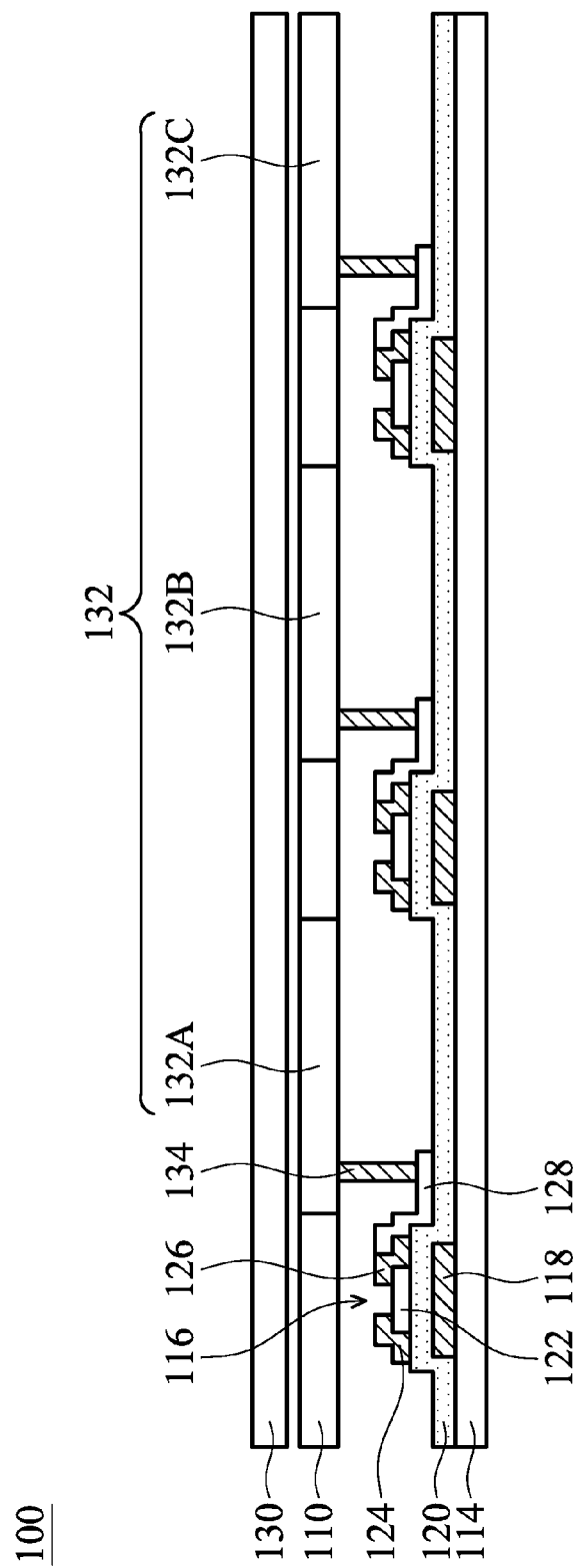
FIG. 1C is a cross-sectional view along line 1C-1C in FIG. 1B in accordance with some embodiments of the present disclosure.

FIG. 1C is a cross-sectional view along line 1C-1C in FIG. 1B in accordance with some embodiments of the present disclosure. Referring to FIG. 1C, the display device 100 includes a first substrate 114. In some embodiments, the first substrate 114 is a transistor substrate. The first substrate 114, which serves as a transistor substrate, may include a transparent substrate. The material of the transparent substrate may include, but is not limited to, a glass substrate, a ceramic substrate, a plastic substrate, or any other suitable transparent substrate. In addition, a transistor 116 such as a thin film transistor (not shown) is disposed over the first substrate 114. This transistor 116 is used to control the light-emitting diode chip 110 to emit light.

Transistor 116 may be a bottom gate electrode or a top gate electrode. In addition, referring to FIG. 1C, a transistor 116 of the bottom gate electrode type may include a gate electrode 118, gate dielectric layer 120, semiconductor layer 122, source electrode 124 and drain electrode 126. The gate electrode 118 is disposed over the first substrate 114. The gate dielectric layer 120 covers the gate electrode 118 and the first substrate 114. The semiconductor layer 122 is disposed over the gate dielectric layer 120 and is disposed corresponding to the gate electrode 118. The source electrode 124 is disposed over the semiconductor layer 122 and is overlapped with a portion of the semiconductor layer 122. The drain electrode 126 is also disposed over the semiconductor layer 122 and is overlapped with another portion of the semiconductor layer 122. The structure of a transistor 116 of the top gate electrode type is well known to those skilled in the art and will not be described herein for the sake of brevity.

The gate electrode 118 may include, but is not limited to, copper, aluminum, molybdenum, tungsten, gold, chromium, nickel, platinum, titanium, iridium, rhodium, an alloy thereof, a combination thereof, or any other conductive material. In other embodiments, gate electrode 118 may include a non-metal material with electrical conductivity. The gate electrode 118 may be electrically connected to the gate line.

The material of the gate dielectric layer 120 may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The gate dielectric layer 120 may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The semiconductor layer 122 may include, but is not limited to, an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof. The semiconductor layer 122 may also include, but is not limited to, metal oxide such as indium gallium zinc oxide (IGZO), indium zinc oxide (IZO), indium gallium zinc oxide (IG-ZTO), or organic semiconductor including polycyclic aromatic compound, or a combination thereof.

The source electrode 124 and drain electrode 126 may include, but is not limited to, copper, aluminum, molybdenum, tungsten, gold, chromium, nickel, platinum, titanium, iridium, rhodium, an alloy thereof, a combination thereof, or any other conductive material. In other embodiments, the source electrode 124 and drain electrode 126 may include a non-metal material with electrical conductivity. The source electrode 124 may be electrically connected to the data line. The transistor 116 may further include a connection electrode 128 disposed over the first substrate 114. The connection electrode 128 electrically connected to the drain electrode 126. In addition, in other embodiments, the drain electrode 126 may serve as the connection electrode 128 directly such that the need of the additional connection electrode 128 is saved.

The connection electrode 128 may include, but is not limited to, copper, aluminum, tungsten, gold, chromium, nickel, platinum, titanium, iridium, rhodium, an alloy thereof, a combination thereof, or any other conductive material. The connection electrode 128 may also include, but is not limited to, indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide material.

The display device 100 further includes a second substrate 130 disposed opposite the first substrate 114. The second substrate 130 may include, but is not limited to, a glass substrate, a ceramic substrate, a plastic substrate, or any other suitable transparent substrate. In addition, there is a gap between the light-emitting diode chip 110 and second substrate 130. This gap is a result of the spacer being disposed in the display region 102 or the spacer being disposed in the non-display region 104. The spacer may prevent the light-emitting diode chip 110 from touching the second substrate 130 and cause damage when the display device 100 is pressed or touched. In some embodiments, the spacer may include photosensitive organic material.

In addition, the light-emitting diode chip 110 of the display device 100 is disposed between the first substrate 114 and second substrate 130. The light-emitting diode chip 110 may include a plurality of light-emitting units 132 may include, but is not limited to, an ultraviolet light-emitting unit, a blue light-emitting unit, a green light-emitting unit, a red light-emitting unit, or any other suitable light-emitting unit, or any other suitable light-emitting unit.

In the embodiment shown in FIGS. 1B-1C, the light-emitting diode chip 110 includes three light-emitting units 132A, 132B and 132C. The light-emitting units 132A, 132B and 132C are electrically connected to three transistors 116A, 116B and 116C, respectively. The first light-emitting unit 132A is electrically connected to the connection electrode 128 through a first electrode 134, and is electrically connected to the common electrode 112 through a second electrode. The common electrode 112 may include, but is not limited to, copper, aluminum, tungsten, gold, chromium, nickel, platinum, titanium, iridium, rhodium, an alloy thereof, a combination thereof, or any other conductive material. The common electrode 112 may also include, but is not limited to, indium tin oxide (ITO), tin oxide (TO), indium zinc oxide (IZO), indium gallium zinc oxide (IGZO), indium tin zinc oxide (ITZO), antimony tin oxide (ATO), antimony zinc oxide (AZO), a combination thereof, or any other suitable transparent conductive oxide material.

In addition, current flows into the first light-emitting unit 132A through the transistor 116A and first electrode 134, and flows out from the first light-emitting unit 132A through the second electrode. Thereby the first light-emitting unit 132A may emit light. In the embodiment of the present disclosure, the material of the light-emitting unit may include any known or theoretically workable electroluminescent material such as inorganic light-emitting diode or organic light-emitting diode.

In addition, in the embodiment shown in FIGS. 1B-1C, the light-emitting diode chip 110 is disposed corresponding to a plurality of transistors 116. The light-emitting diode chip 110 may include two light-emitting units which emit light of different colors. In the present disclosure, the color emitted from the light-emitting unit is not limited to red, green and blue. The light-emitting unit may emit light of any color, which may be produced by an electroluminescent element by any known or theoretically workable method. For example, in some embodiments, the light-emitting unit 132A electrically connected to the transistor 116A emits blue light, the light-emitting unit 132B electrically connected to the transistor 116B emits red light, and the light-emitting unit 132C electrically connected to the transistor 116C emits green light. In other embodiments, the light-emitting units 132A, 132B and 132C may be arranged in a sequence other than that shown in FIG. 1C.

Figure 1D:
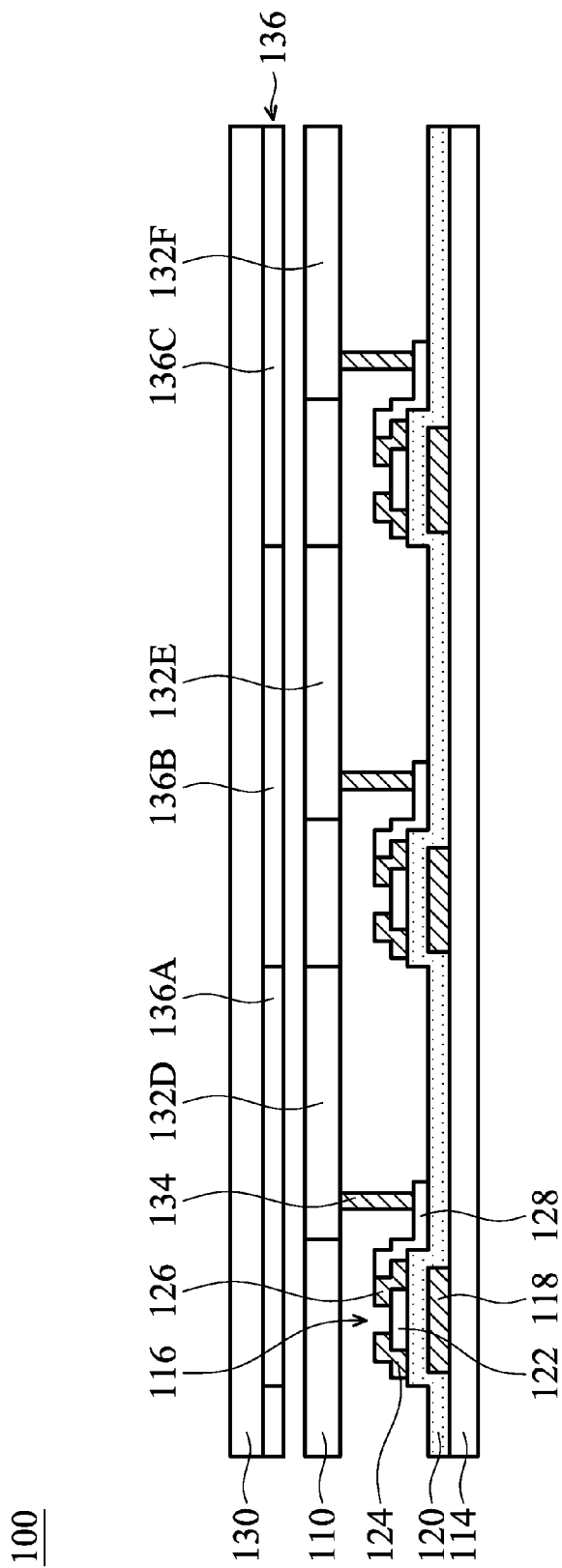
FIG. 1D is a cross-sectional view of a display device in accordance with another embodiment of the present disclosure.
Figure 1E:
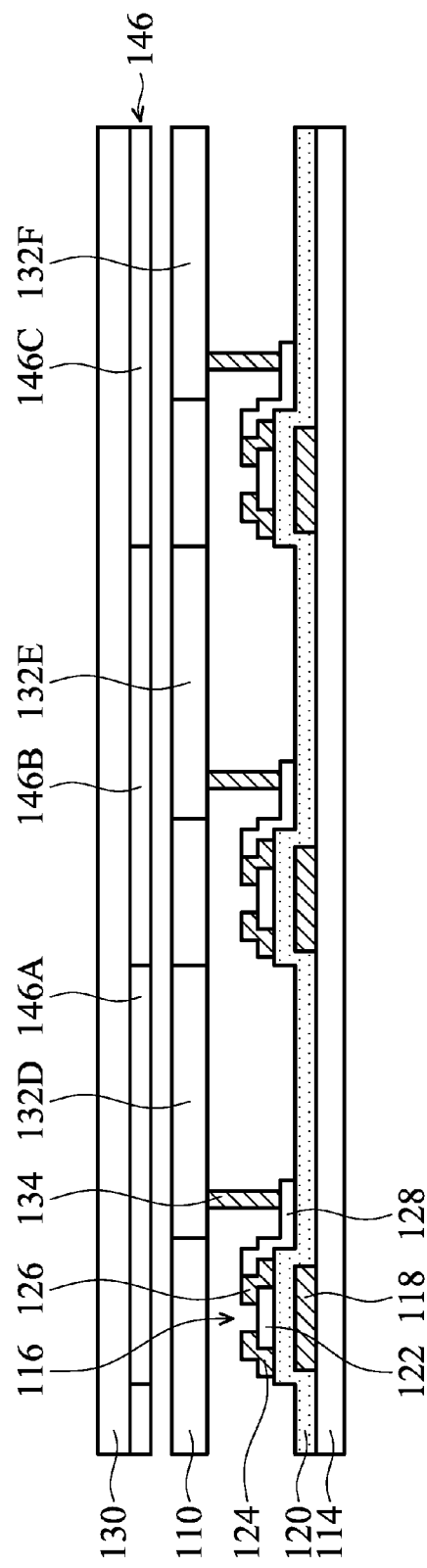
FIG. 1E is a cross-sectional view of a display device in accordance with another embodiment of the present disclosure.

It should be noted that the exemplary embodiment set forth in FIG. 1C is merely for the purpose of illustration. In addition to the embodiment set forth in FIG. 1C, the light-emitting diode chip which is disposed corresponding to a plurality of transistors may include light-emitting units which emit light of one color, as shown in FIGS. 1D-1E. This will be described in detail in the following description. Therefore, the inventive concept and scope are not limited to the exemplary embodiment shown in FIG. 1C. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

FIG. 1D is a cross-sectional view of a display device in accordance with another embodiment of the present disclosure. Referring to FIG. 1D, one light-emitting diode chip 110 is disposed corresponding to a plurality of transistors 116. The light-emitting diode chip 110 includes light-emitting units which emit light of one color. In other words, the light-emitting diode chip 110 shown in FIG. 1D is disposed corresponding to three transistors 116A, 116B and 116C, and the light-emitting units 132D, 132E and 132F which are electrically connected to the three transistors 116A, 116B and 116C emit the same color of light. For example, the light-emitting units 132D, 132E and 132F may emit red light, green light, blue light, or white light. However, the color of light emitted by the light-emitting units 132D, 132E and 132F is not limited to these colors.

In addition, in this embodiment, the light-emitting diode chip 110 includes the light-emitting unit which emits white light. The display device 100 further includes a color filter layer 136 disposed over the second substrate 130. In one embodiment, the color filter layer 136 includes a blue color filter layer 136A, a red color filter layer 136B, and a green color filter layer 136C disposed corresponding to the light-emitting units 132D, 132E and 132F.

It should be noted that the exemplary embodiment set forth in FIG. 1D is merely for the purpose of illustration. In addition to the embodiment set forth in FIG. 1D, the color filter layer may be replaced by other layers as shown in FIG. 1E. This will be described in detail in the following description. Therefore, the inventive concept and scope are not limited to the exemplary embodiment shown in FIG. 1D. This will be described in detail in the following description.

FIG. 1E is a cross-sectional view of a display device in accordance with another embodiment of the present disclosure. In this embodiment, the display device 100 further includes a quantum dot film 146 disposed over the second substrate 130. In one embodiment, the quantum dot film 146 includes the first quantum dot film 146A, second quantum dot film 146B and third quantum dot film 146C disposed corresponding to the light-emitting units 132D, 132E and 132F. The light-emitting units 132D, 132E and 132F all emit the same color of light. for example, the light-emitting units 132D, 132E and 132F all emit blue light with a wavelength ranging from about 380~500 nm.

The material of the quantum dot film 146 may include, but is not limited to, an organic layer blended with a quantum dot or an inorganic layer blended with a quantum dot. The quantum dot may be a nano three-dimensional structure including zinc, cadmium, selenium, sulfur, or a combination thereof. The grain diameter of the quantum dot may range from about 1 nm-10 nm. By tuning the grain diameter of the quantum dot, the spectrum of light resulting from the excitation of the quantum dot film 146 by the light source (for example, blue light with a wavelength ranging from about 380~500 nm) may be altered. For example, the first quantum dot film 146A blended with the quantum dot having the first grain diameter may emit light of a first color after excitation by blue light. The second quantum dot film 146B blended with the quantum dot having the second grain diameter may emit light of a second color after excitation by blue light. The third quantum dot film 146C blended with the quantum dot having the third grain diameter may emit light of a third color after excitation by blue light. Light of the first color, second color, and third color may each have a different spectrum.

Figure 1F:
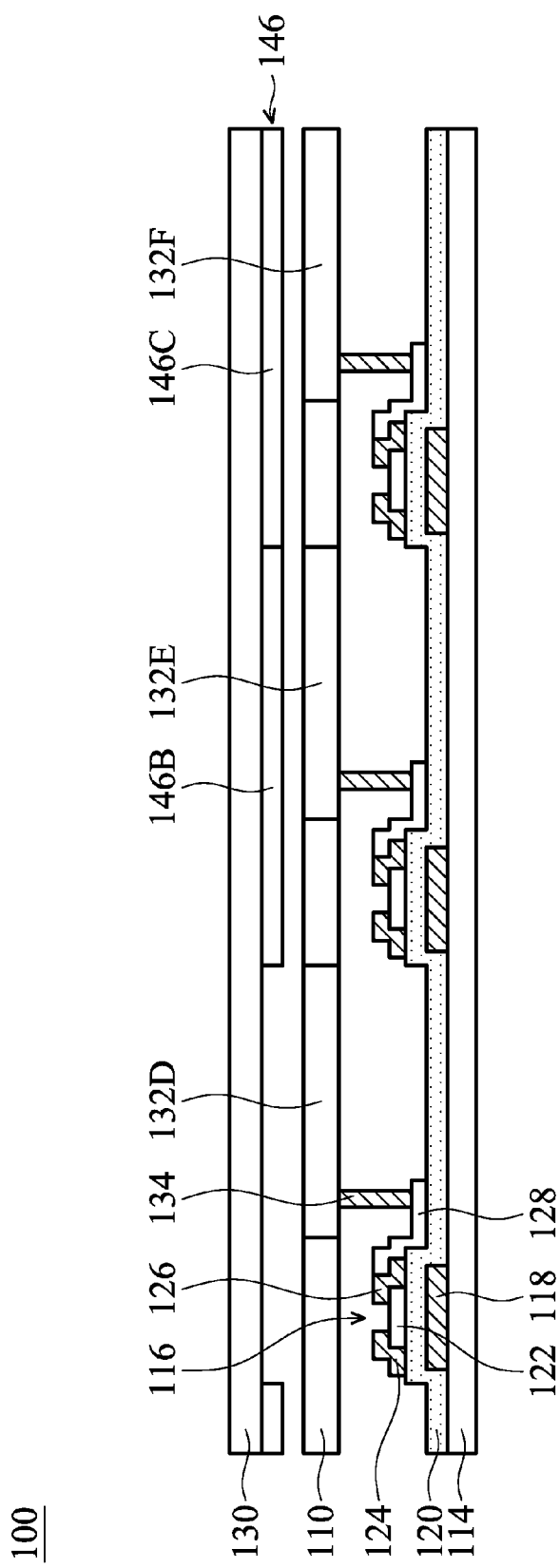
FIG. 1F is a cross-sectional view of a display device in accordance with another embodiment of the present disclosure.

FIG. 1F is a cross-sectional view of a display device in accordance with another embodiment of the present disclosure. In this embodiment, the quantum dot film 146 includes the second quantum dot film 146B and third quantum dot film 146C disposed corresponding to the light-emitting units 132E and 132F. The quantum dot film 146 may omit the first quantum dot film 146A disposed corresponding to the light-emitting unit 132D to reduce the cost. The light-emitting units 132D, 132E and 132F all emit the same color of light. for example, the light-emitting units 132D, 132E and 132F all emit blue light with a wavelength ranging from about 380~500 nm.

Figure 1G:
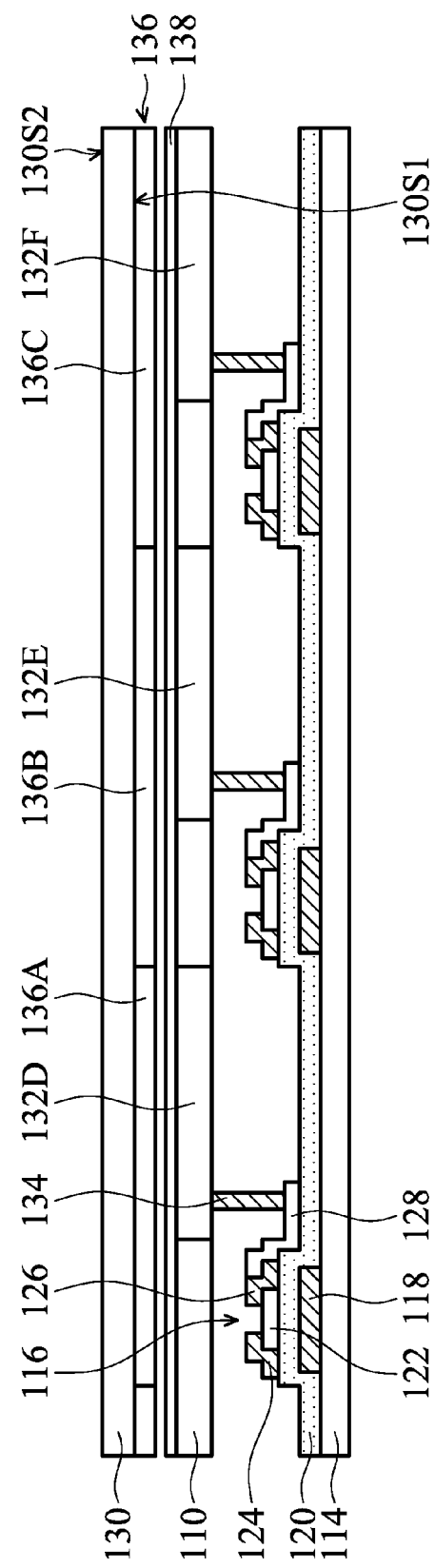
FIG. 1G is a cross-sectional view of a display device in accordance with another embodiment of the present disclosure.

FIG. 1G is a cross-sectional view of a display device in accordance with another embodiment of the present disclosure. In this embodiment, the light-emitting units 132D, 132E and 132F emit the same color of light. For example, the light-emitting units 132D, 132E and 132F may emit blue light, ultraviolet light, or light with any other suitable color. However, the color of light emitted by the light-emitting units 132D, 132E and 132F is not limited to these colors. The display device 100 includes a color filter layer 136 disposed over the second substrate 130. The color filter layer 136 includes a blue color filter layer 136A, a red color filter layer 136B, and a green color filter layer 136C disposed corresponding to the light-emitting units 132D, 132E and 132F. A photoluminescence layer 138 is disposed over the light-emitting diode chip 110. The light emitted from the light-emitting units 132D, 132E and 132F may be transferred to white light through the photoluminescence layer 138. The white light may be transferred to light with different colors through the color filter layer 136. The photoluminescence layer 138 may include fluorescent layer, phosphorescent layer, aforementioned quantum dot film, or any other suitable photoluminescence material. The material of the fluorescent layer may include, but is not limited to, aluminate, silicate, nitride, oxynitride, sulfide, halide, a combination thereof, or any other suitable fluorescent material.

In addition, the second substrate 130 has a front side 130S1 and a back side 130S2 which are opposite to each other. It should be noted that although the color filter layer 136 in FIG. 1G is disposed over the front side 130S1 of the second substrate 130, the color filter layer 136 may also be disposed over the back side 130S2 of the second substrate 130. In some other embodiments of the present disclosure, the color filter layer 136 may be disposed at any suitable position between the light-emitting diode chip 110 and the back side 130S2 of the second substrate 130. In this embodiment, the second substrate 130 is the outermost carrier of the display device 100 along the light emitting direction.

FIG. 1H is a cross-sectional view of a display device in accordance with another embodiment of the present disclosure. In this embodiment, the color filter layer 136 includes a red color filter layer 136B, and a green color filter layer 136C disposed corresponding to the light-emitting units 132E and 132F. The cost of material may be reduced by omitting the first color filter layer 136A of the color filter layer 136 disposed corresponding to the light-emitting units 132D. The cost of material may also be reduced by omitting the portion of the photoluminescence layer 138 disposed corresponding to the light-emitting units 132D. The light-emitting units 132D, 132E and 132F emit the same color of light. For example, the light-emitting units 132D, 132E and 132F may emit blue light, or light with any other suitable color.

Figure 1I:
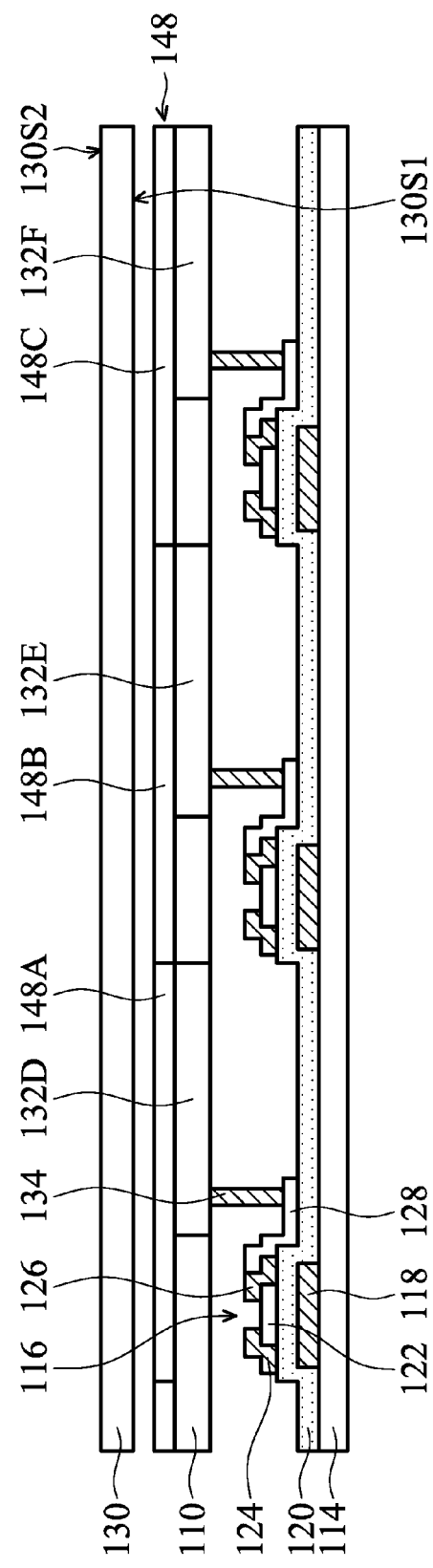
FIG. 1I is a cross-sectional view of a display device in accordance with another embodiment of the present disclosure.

FIG. 1I is a cross-sectional view of a display device in accordance with another embodiment of the present disclosure. In this embodiment, the display device 100 includes a photoluminescence layer 148 disposed over the light-emitting diode chip 110. The photoluminescence layer 148 may include a first photoluminescence layer 148A, a second photoluminescence layer 148B, and a third photoluminescence layer 148C disposed corresponding to the light-emitting units 132D, 132E and 132F respectively. The light-emitting units 132D, 132E and 132F emit the same color of light. For example, the light-emitting units 132D, 132E and 132F may emit blue light, ultraviolet light, or light with any other suitable color.

The photoluminescence layer 148 may include fluorescent layer, phosphorescent layer, aforementioned quantum dot film, or any other suitable photoluminescence material. The light-emitting units 132D, 132E and 132F may produce three different light (for example blue, red and green) through these three photoluminescence layers 148 (i.e. the first photoluminescence layer 148A, second photoluminescence layer 148B, and third photoluminescence layer 148C).

It should be noted that although the photoluminescence layer 148 in FIG. 1I is disposed over the light-emitting diode chip 110, the photoluminescence layer 148 may also be disposed in the light-emitting diode chip 110. In some other embodiments of the present disclosure, the photoluminescence material of the photoluminescence layer may be mixed or blended into the glue used to attach the array substrate (including elements such as the first substrate 114, transistor 116 and light-emitting diode chip 110) and the second substrate 130. In some other embodiments of the present disclosure, the second substrate 130 has a front side 130S1 and a back side 130S2 which are opposite to each other, and the photoluminescence layer 148 may be disposed over the front side 130S1 or the back side 130S2 of the second substrate 130. In some other embodiments of the present disclosure, the photoluminescence layer 148 may be disposed at any suitable position between the light-emitting diode chip 110 and the back side 130S2 of the second substrate 130. In this embodiment, the second substrate 130 is the outermost carrier of the display device 100 along the light emitting direction.

Figure 1J:
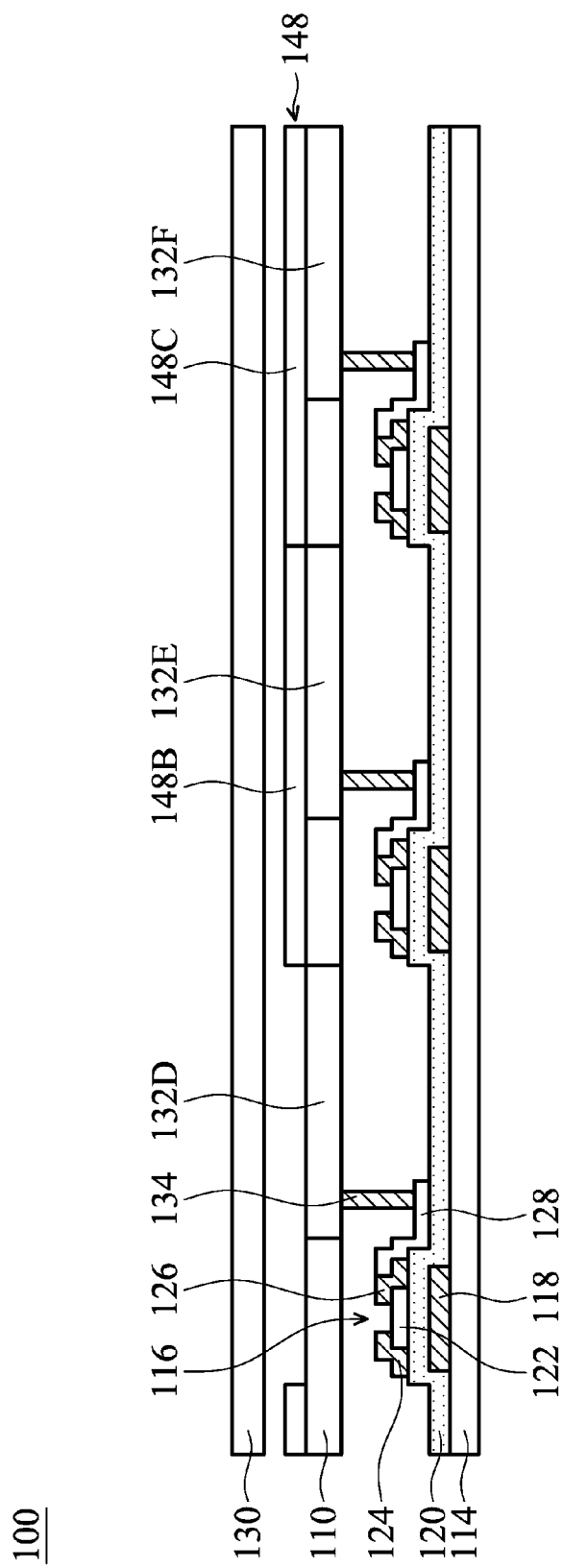
FIG. 1J is a cross-sectional view of a display device in accordance with another embodiment of the present disclosure.

FIG. 1J is a cross-sectional view of a display device in accordance with another embodiment of the present disclosure. In this embodiment, the photoluminescence layer 148 may include the second photoluminescence layer 148B and third photoluminescence layer 148C disposed corresponding to the light-emitting units 132E and 132F respectively. The cost of material may also be reduced by omitting the first photoluminescence layer 148A of the photoluminescence layer 148 disposed corresponding to the light-emitting units 132D. The light-emitting units 132D, 132E and 132F emit the same color of light. For example, the light-emitting units 132D, 132E and 132F may emit blue light, or light with any other suitable color.

In some embodiments of the present disclosure, the light-emitting diode chips emitting different light (for example red light, blue light or green light) are disposed over the array substrate. However, due to the variation in the manufacturing process, the spectrum between the light-emitting diode chips substantially emitting the same light may be different. In addition, before bonding the light-emitting diode chip onto the array substrate, selection for the light-emitting diode chip with suitable spectrum is needed. In addition, in the bonding processes, the light-emitting diode chips emitting different light are bonded in different step respectively, which in turn increases the manufacturing time. Therefore, in some embodiments of the present disclosure, by using the light-emitting diode chips emitting the same light with the color filter layer and/or the photoluminescence layer, the full-color may be achieved and the manufacturing time may be greatly reduced.

In addition, as shown in FIGS. 1A-1B, the light-emitting diode chip 110 completely covers the display region. In addition, the light-emitting diode chip 110 is disposed corresponding to 3N transistors 116, wherein N is a positive integer which is 1 or higher. Since the white light is composed of three primary colors (red, blue, and green), by disposing the light-emitting diode chip 110 corresponding to 3N transistors 116, the amount of light-emitting diode chip 110 used may be theoretically optimized. For example, in the embodiment shown in FIG. 1B, the light-emitting diode chip 110 is disposed corresponding to three transistors 116A, 116B and 116C.

Figure 2A:
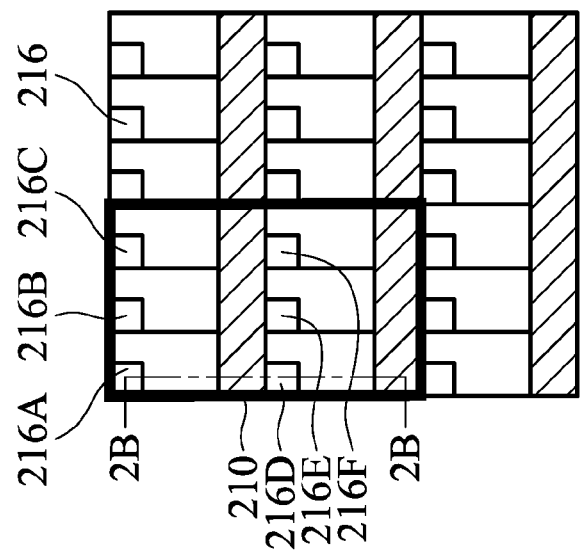
FIG. 2A is a top view of a display device in accordance with another embodiment of the present disclosure.

FIG. 2A is a top view of a display device 200 in accordance with another embodiment of the present disclosure. As shown in FIG. 2A, the light-emitting diode chip 210 is disposed corresponding to six transistors 216A, 216B, 216C, 216D, 216E and 216F.

Figure 2B:
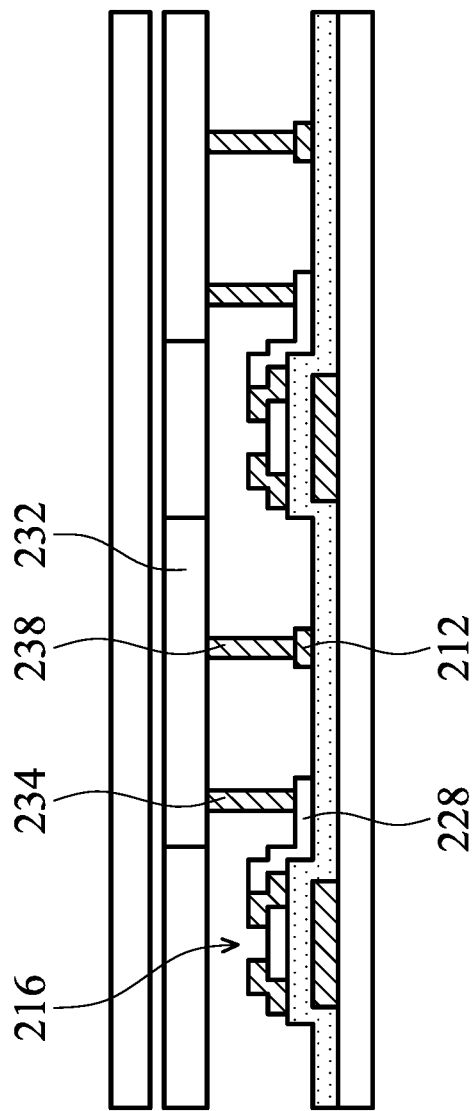
FIG. 2B is a cross-sectional view along line 2B-2B in FIG. 2A in accordance with some embodiments of the present disclosure.

In addition, FIG. 2B is a cross-sectional view along line 2B-2B in FIG. 2A in accordance with some embodiments of the present disclosure. The light-emitting unit 232 is electrically connected to the connection electrode 228 and transistor 216 through a first electrode 234, and is electrically connected to the common electrode 212 through a second electrode 238. In addition, current flows into the light-emitting unit 232 through the transistor 216 and first electrode 234, and flows out from the light-emitting unit 232 through the second electrode 238. Thereby the light-emitting unit 232 may emit light.

Figure 3:
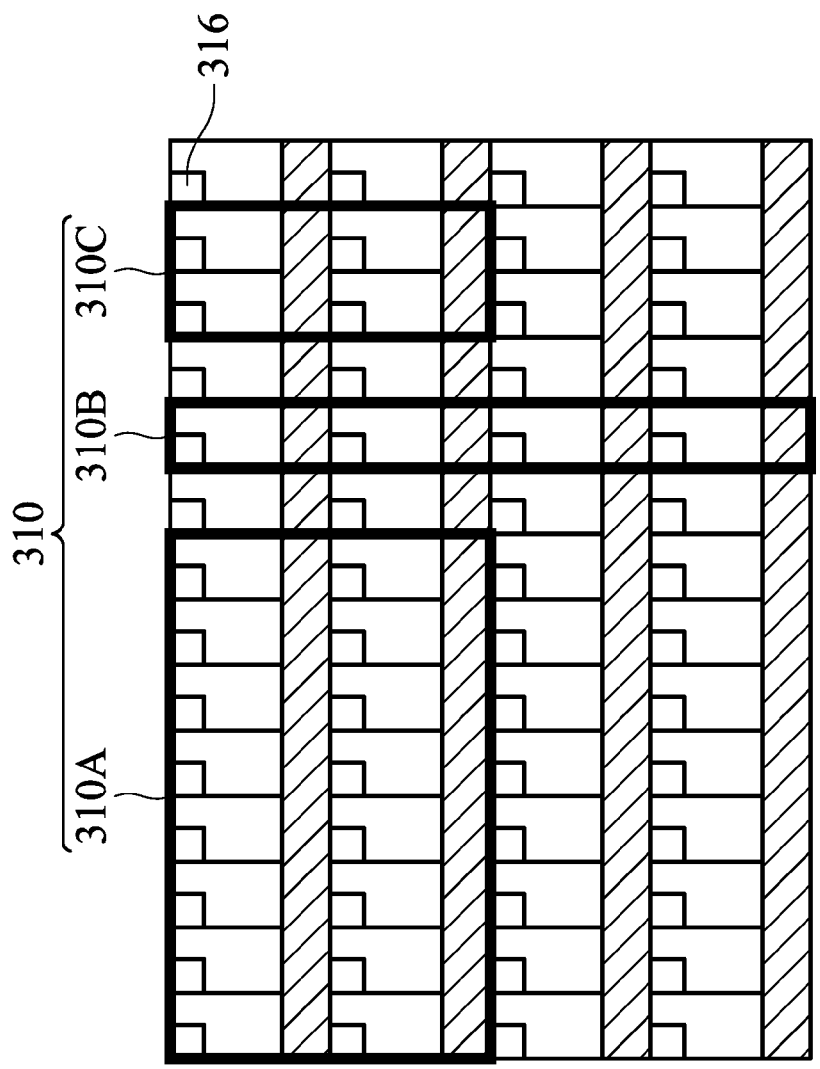
FIG. 3 is a top view of a display device used to present three types of the amount of transistors corresponded by the light-emitting diode chip in accordance with some embodiments of the present disclosure.

It should be noted that the exemplary embodiment set forth in FIG. 1A-2B is merely for the purpose of illustration. In addition to the embodiment set forth in FIGS. 1A-2B, the light-emitting diode chip may be disposed corresponding to other amount of transistors as shown in FIG. 3. This will be described in detail in the following description. Therefore, the inventive concept and scope are not limited to the exemplary embodiment shown in FIGS. 1A-2B. This will be described in detail in the following description.

FIG. 3 is a top view of a display device used to present three types of the amount of transistors corresponded by the light-emitting diode chip in accordance with some embodiments of the present disclosure. However, the amount of transistors corresponding to one light-emitting diode chip may be altered according to design requirements and is not limited to the three types. The light-emitting diode chip 310 (LED chip) is disposed corresponding to 2N transistors 316, wherein N is a positive integer which is 1 or higher. For example, the light-emitting diode chip 310A is disposed corresponding to sixteen transistors 316, the light-emitting diode chip 310B is disposed corresponding to four transistors 316, the light-emitting diode chip 310C is disposed corresponding to four transistors 316. Although the light-emitting diode chip 310B and the light-emitting diode chip 310C are disposed corresponding to the same amount of transistors 316, the light-emitting diode chip 310B includes light-emitting units which emit one light color, whereas the light-emitting diode chip 310C includes two or more light-emitting units which emit light of a different color.

It should be noted that the exemplary embodiment set forth in FIGS. 1A-3 is merely for the purpose of illustration.

Figure 4A:
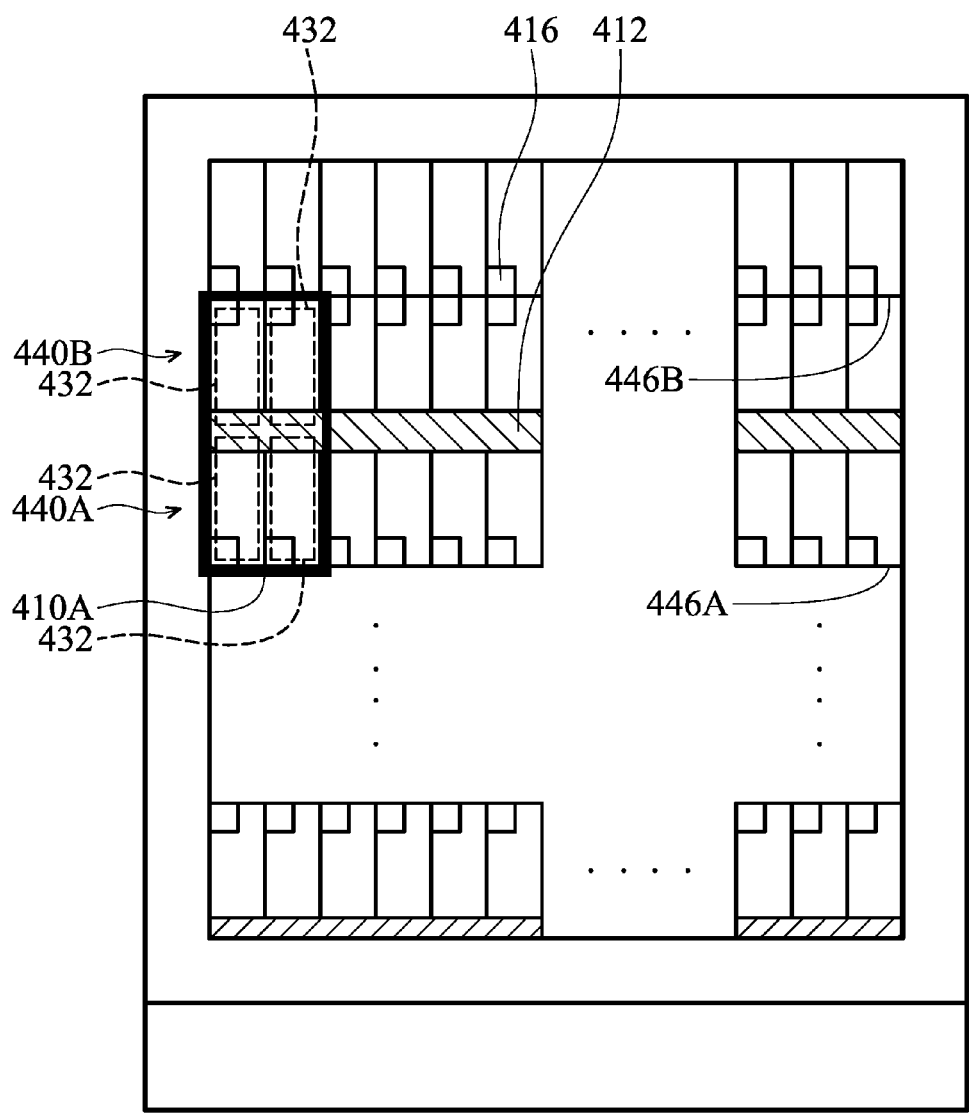
FIG. 4A is a top view of a display device in accordance with another embodiment of the present disclosure.
Figure 4B:
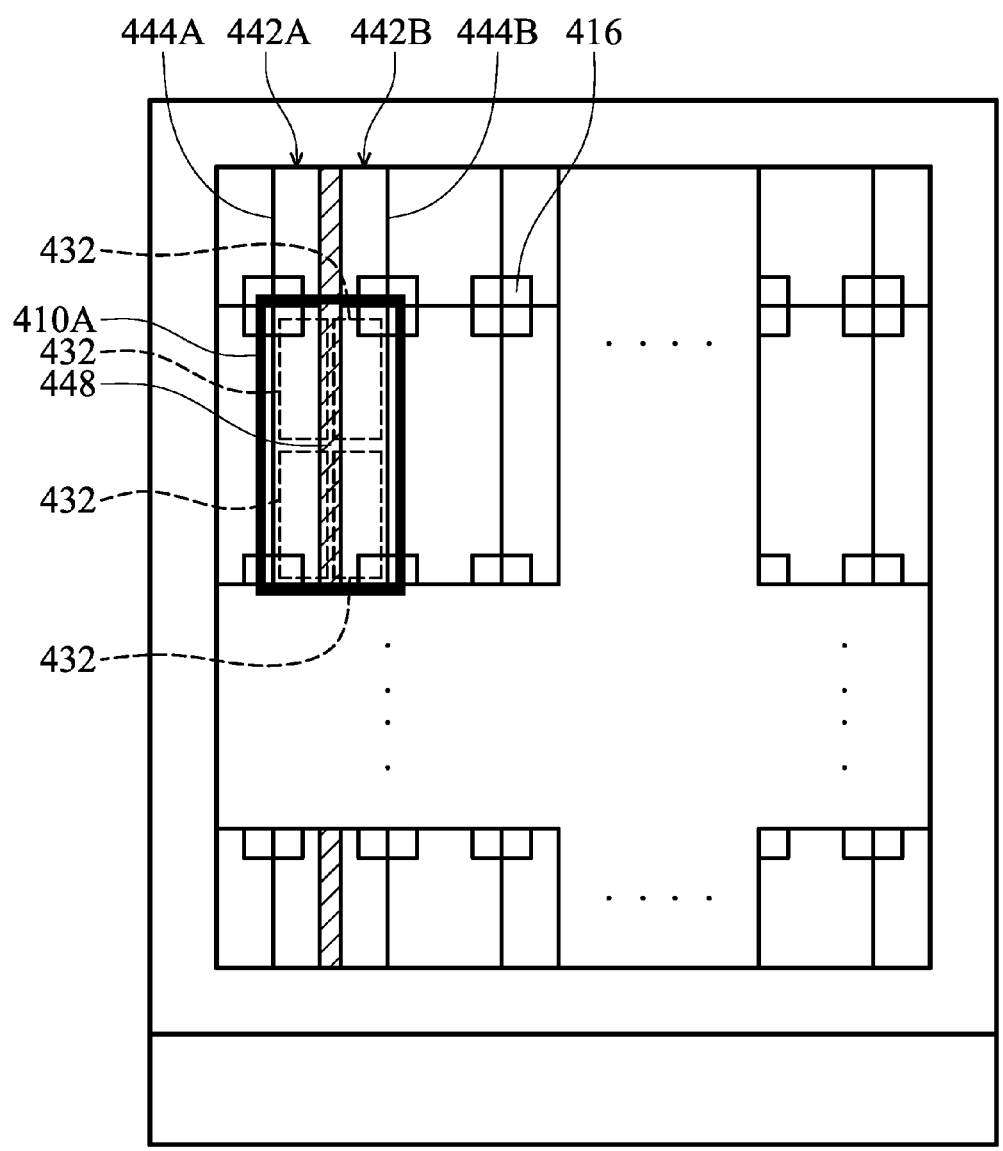
FIG. 4B is a top view of a display device in accordance with another embodiment of the present disclosure.

In addition to the embodiment set forth in FIGS. 1A-3, the transistors disposed in different rows may use the same common electrode as shown in FIGS. 4A-4B. This will be described in detail in the following description. Therefore, the inventive concept and scope are not limited to the exemplary embodiment shown in FIGS. 1A-3. This will be described in detail in the following description.

FIG. 4A is a top view of a display device 400A in accordance with another embodiment of the present disclosure. The display device 400A includes a first transistor row 440A and second transistor row 440B. The first transistor row 440A and second transistor row 440B may independently include a plurality of transistors 416. The first transistor row 440A is electrically connected to a first gate line 446A. The second transistor row 440B is electrically connected to a second gate line 446B.

The display device 400A further includes a row common electrode 412 disposed between the first gate line 446A and second gate line 446B. The light-emitting diode chip 410A is disposed corresponding to the first transistor row 440A and second transistor row 440B. The light-emitting diode chip 410A includes a plurality of light-emitting units 432. The plurality of light-emitting units 432 all electrically connect to the row common electrode 412. In particular, all of the second electrodes of the plurality of light-emitting units 432 electrically connects the row common electrode 412 disposed over the first substrate 114. The first electrodes of the plurality of light-emitting units 432 electrically connect the drain electrodes of the corresponding transistors 416, respectively.

For example, in one embodiment, as shown in FIG. 4A, the light-emitting diode chip 410A is disposed corresponding to four transistors 416 in the first transistor row 440A and second transistor row 440B. The four light-emitting units 432 of the light-emitting diode chip 410A are electrically connected to these four transistors 416, respectively. The four light-emitting units 432 of the light-emitting diode chip 410A are all electrically connected to the row common electrode 412. In particular, the second electrodes of the four light-emitting units 432 all electrically connect to the row common electrode 412 disposed over the first substrate 114.

It should be noted that the exemplary embodiment set forth in FIG. 4A is merely for the purpose of illustration. In addition to the embodiment set forth in FIG. 4A, the transistor and the light-emitting diode chip may have other configurations as shown in FIG. 4B. This will be described in detail in the following description. Therefore, the inventive concept and scope are not limited to the exemplary embodiment shown in FIG. 4A. This will be described in detail in the following description.

FIG. 4B is a top view of a display device 400A in accordance with another embodiment of the present disclosure. The display device 400A includes a first transistor column 442A and second transistor column 442B. The first transistor column 442A and second transistor column 442B may independently include a plurality of transistors 416. The first transistor column 442A is electrically connected to a first data line 444A. The second transistor column 442B is electrically connected to a second data line 444B.

The display device 400A further includes a column common electrode 448 disposed between the first data line 444A and second data line 444B. In this embodiment, as shown in FIG. 4B, the light-emitting diode chip 410A is disposed corresponding to the four transistors 416 in the first transistor column 442A and second transistor column 442B. The four light-emitting units 432 of the light-emitting diode chip 410A are electrically connected to these four transistors 416, respectively. The four light-emitting units 432 of the light-emitting diode chip 410A are all electrically connected to the column common electrode 448. In particular, the second electrodes of the four light-emitting units 432 all electrically connect to the column common electrode 448 disposed over the first substrate 114.

In the present disclosure, the direction of each row is parallel to the direction of the gate line of the display device, and the direction of the column is perpendicular to the direction of the gate line of the display device.

Figure 5A:
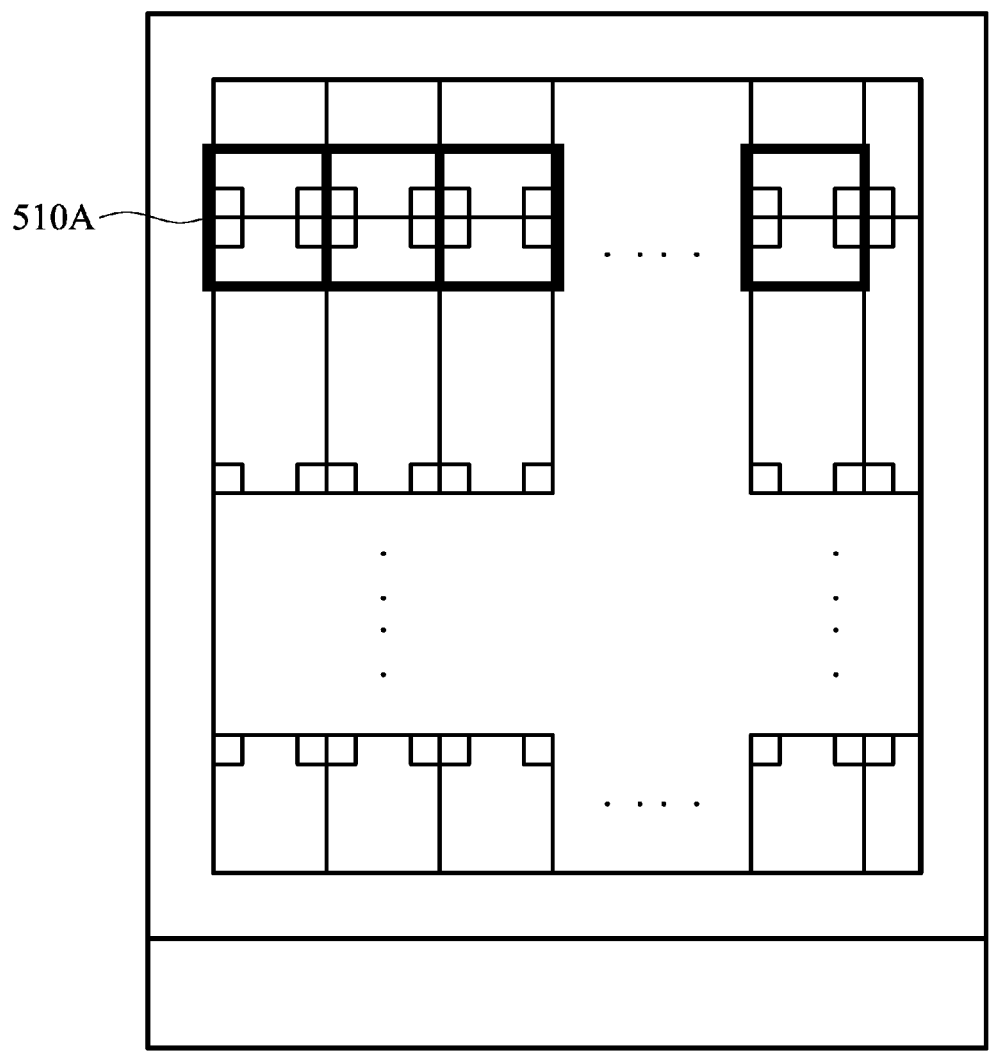
FIG. 5A is a top view of a display device in accordance with another embodiment of the present disclosure.

It should be noted that the exemplary embodiment set forth in FIGS. 4A-4B is merely for the purpose of illustration. In addition to the embodiment set forth in FIGS. 4A-4B, the light-emitting diode chip may have other configurations as shown in FIG. 5A. This will be described in detail in the following description. Therefore, the inventive concept and scope are not limited to the exemplary embodiment shown in FIGS. 4A-4B. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

FIG. 5A is a top view of a display device 500A in accordance with another embodiment of the present disclosure. The same part between the embodiment shown in FIG. 5A and the embodiment shown in FIGS. 4A-4B is that the light-emitting diode chip 510A is disposed corresponding to four transistors 516. The difference between the embodiment shown in FIG. 5A and the embodiment shown in FIGS. 4A-4B is that the light-emitting diode chip 510A partially covers the display region 102.

In the present disclosure, the light-emitting diode chip 510A partially covers the display region 102. The ratio of the area of the display region 102 partially covered by the light-emitting diode chip 510A may be calculated by the following method: the light-emitting diode chip 510A in the display region has a chip projection area A by being projected onto the first substrate 114. The display region 102 has a display projection area B by being projected onto the first substrate 114. The ratio of the area of the display region 102 partially covered by the light-emitting diode chip 510A is the ratio of the chip projection area A to the display projection area B (A/B).

The chip projection area A is the projection area achieved by projecting one light-emitting diode chip onto the first substrate 114 multiplies by the amount of light-emitting diode chips. The display projection area B is the area of the display region 102 known to those skilled in the art (the area of the black matrix in the display region 102 is not being subtracted).

In the present disclosure, the ratio of the chip projection area A to the display projection area B (A/B) may range from about 0~1.

Figure 5B:
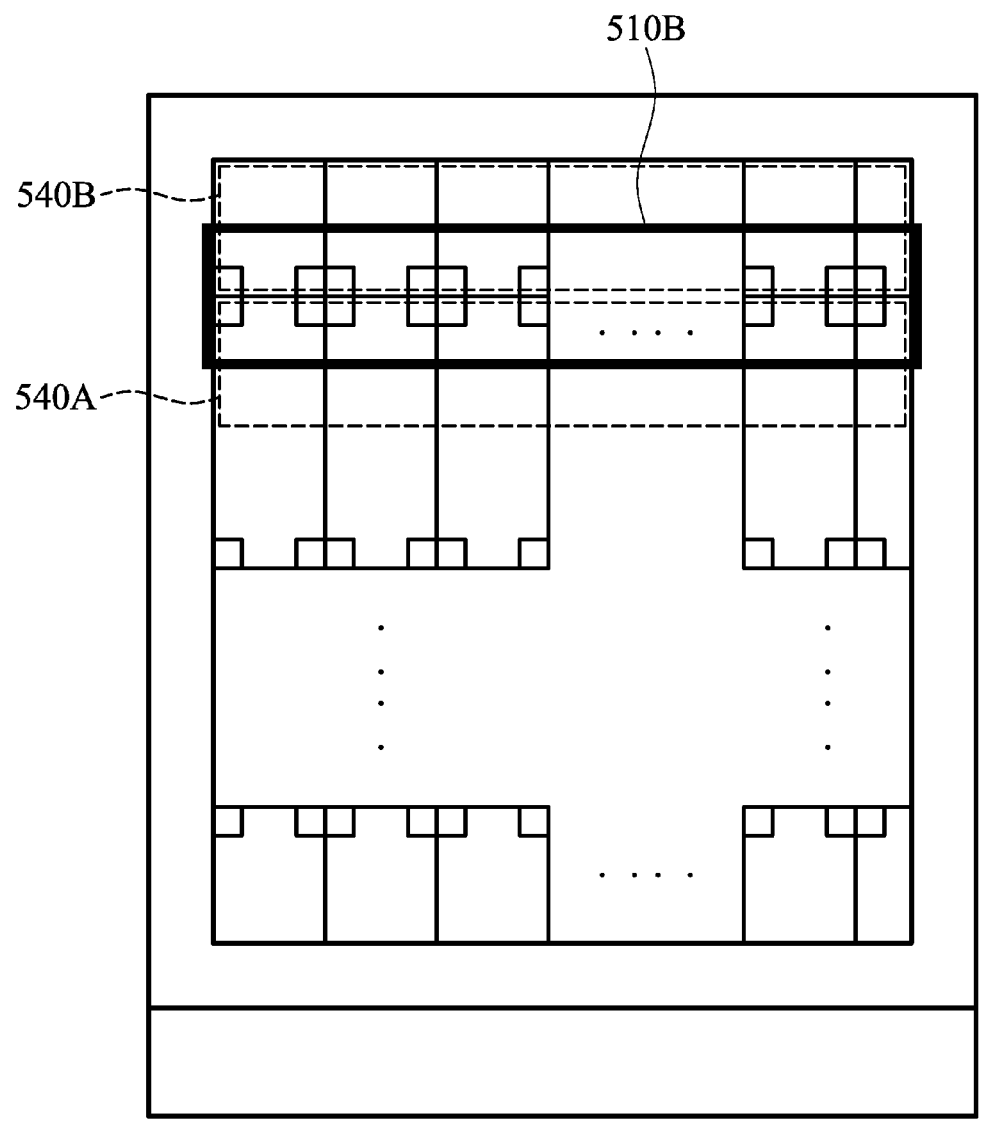
FIG. 5B is a top view of a display device in accordance with another embodiment of the present disclosure.

FIG. 5B is a top view of a display device 500B in accordance with another embodiment of the present disclosure. The difference between the embodiment shown in FIG. 5B and the embodiment shown in FIG. 5A is that the light-emitting diode chip 510B is disposed corresponding to the entire first transistor row 540A and second transistor row 540B.

It should be noted that the exemplary embodiment set forth in FIGS. 4A-4B is merely for the purpose of illustration. In addition to the embodiment set forth in FIGS. 4A-4B, the light-emitting diode chip may have other configurations as shown in FIGS. 6A-11E. This will be described in detail in the following description. Therefore, the inventive concept and scope are not limited to the exemplary embodiment shown in FIGS. 4A-4B. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 6A:
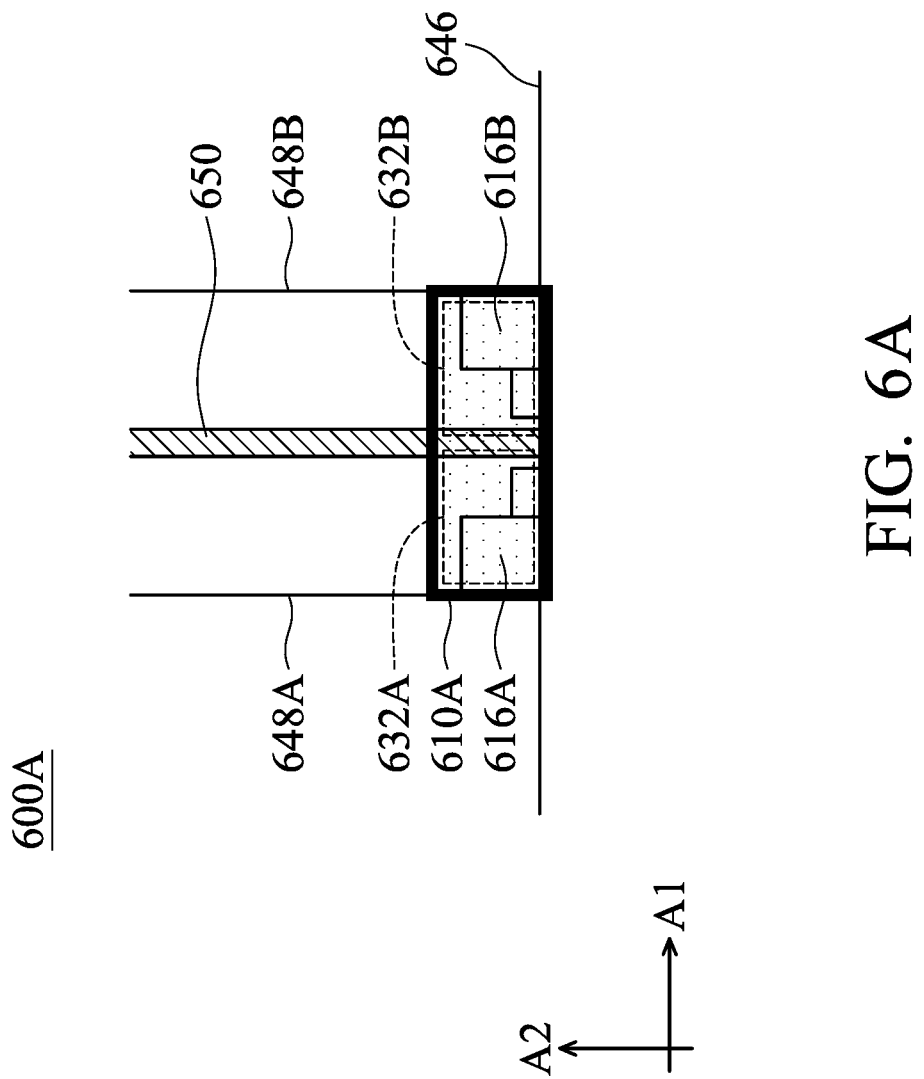
FIG. 6A is a partial top view of a display device in accordance with another embodiment of the present disclosure.

FIG. 6A is a partial top view of a display device 600A in accordance with another embodiment of the present disclosure. As shown in FIG. 6A, the plurality of transistors of the display device 600A includes a first transistor 616A and a second transistor 616B.

In addition, the display device 600A includes a gate line 646 and two data lines 648A and 648B. The gate line 646 and the two data lines 648A and 648B together control the first transistor 616A and the second transistor 616B. The gate line 646 extends along the direction A1, and the two data lines 648A and 648B extend along the direction A2. In addition, the display device 600A includes a column common electrode 650 disposed between the two data lines 648A and 648B. The column common electrode 650 also extends along the direction A2.

The light-emitting diode chip 610A is disposed corresponding to the first transistor 616A and the second transistor 616B. The light-emitting diode chip 610A includes a first light-emitting unit 632A and a second light-emitting unit 632B. The first light-emitting unit 632A and the second light-emitting unit 632B are electrically connected to the first transistor 616A and the second transistor 616B, respectively. The first light-emitting unit 632A and the second light-emitting unit 632B are both electrically connected to the column common electrode 650.

In addition, in the embodiment shown in FIG. 6A, although the light-emitting diode chip 610A partially covers the display region 102, the light-emitting diode chip 610A completely covers the first transistor 616A and the second transistor 616B which the light-emitting diode chip 610A corresponds to.

Figure 6B:
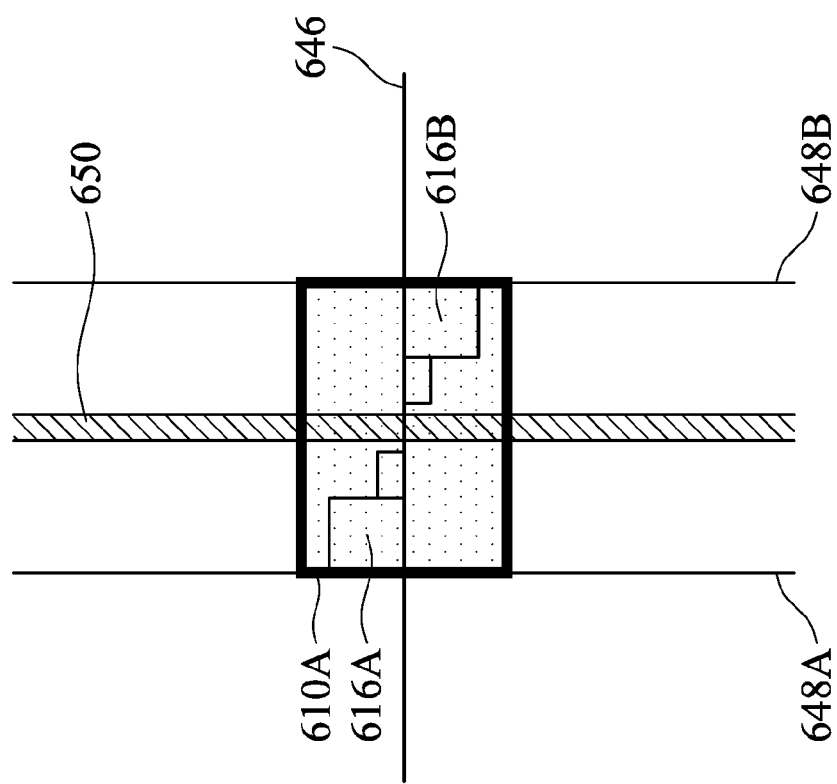
FIG. 6B is a partial top view of a display device in accordance with another embodiment of the present disclosure.
Figure 6C:
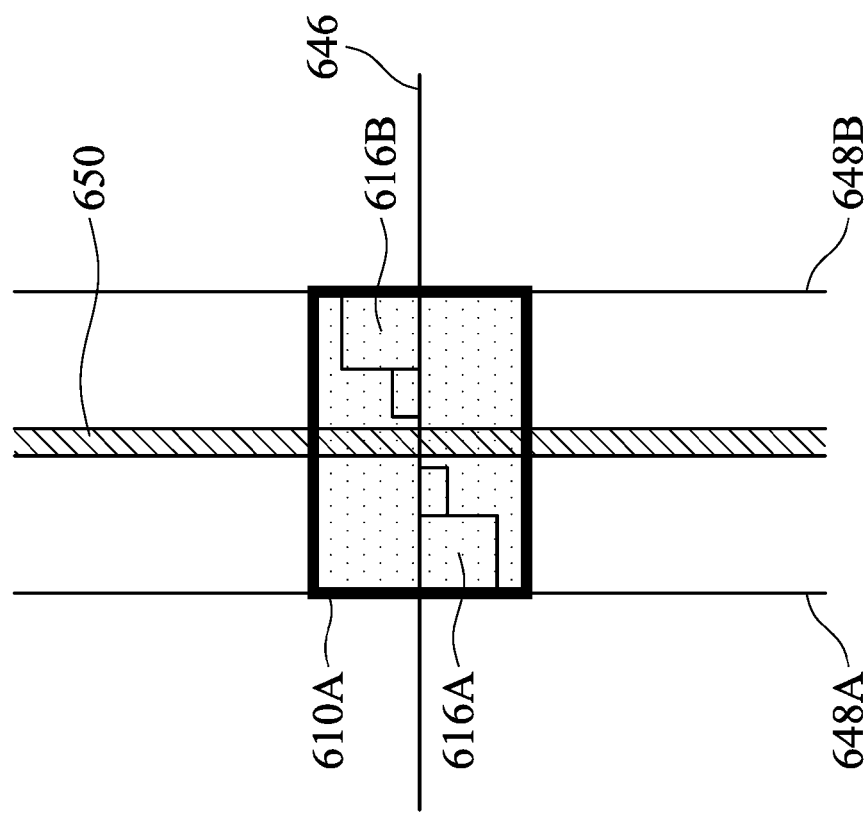
FIG. 6C is a partial top view of a display device in accordance with another embodiment of the present disclosure.

It should be noted that the exemplary embodiment set forth in FIG. 6A is merely for the purpose of illustration. In addition to the embodiment set forth in FIG. 6A, the light-emitting diode chip may have other configurations as shown in FIGS. 6B-6C. This will be described in detail in the following description. Therefore, the inventive concept and scope are not limited to the exemplary embodiment shown in FIG. 6A. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 6D:
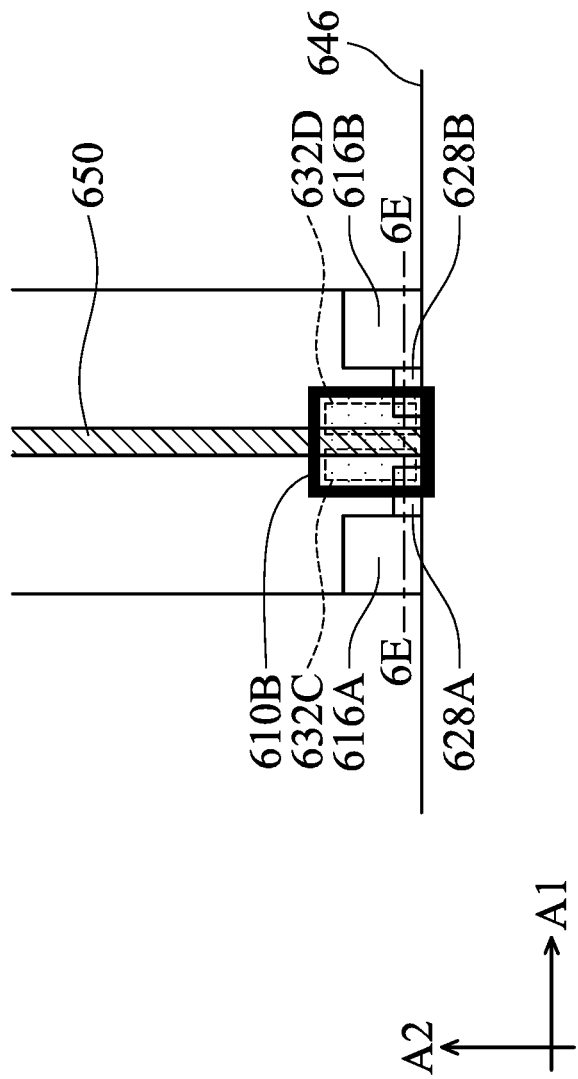
FIG. 6D is a partial top view of a display device in accordance with another embodiment of the present disclosure.

It should be noted that the exemplary embodiment set forth in FIGS. 6A-6C is merely for the purpose of illustration. In addition to the embodiment set forth in FIGS. 6A-6C, the light-emitting diode chip may have other configurations as shown in FIG. 6D. This will be described in detail in the following description. Therefore, the inventive concept and scope are not limited to the exemplary embodiment shown in FIGS. 6A-6C. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity. As shown in FIG. 6D, the light-emitting diode chip 610B partially covers the display region 102. The light-emitting diode chip 610B also partially covers the first transistor 616A and the second transistor 616B which the light-emitting diode chip 610B corresponds to. In particular, the light-emitting diode chip 610B covers the connection electrodes 628A and 628B of the transistors 616A and 616B. However, in other embodiments in which there is no connection electrodes 628A and 628B, the light-emitting diode chip 610B covers the drain electrodes of the transistors 616A and 616B.

Figure 6E:
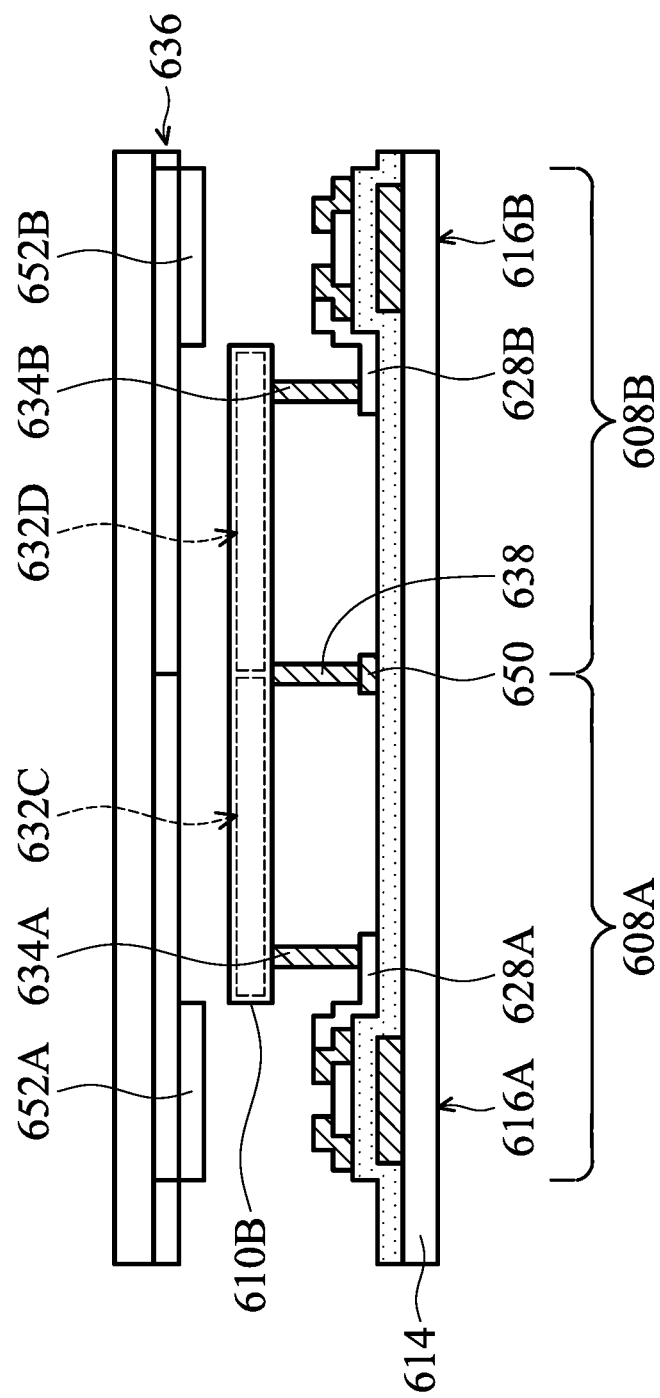
FIG. 6E is a cross-sectional view along line 6E-6E in FIG. 6D in accordance with some embodiments of the present disclosure.

FIG. 6E is a cross-sectional view along line 6E-6E in FIG. 6D in accordance with some embodiments of the present disclosure. As shown in FIG. 6E, the portion of the transistors 616A and 616B not covered by the light-emitting diode chip 610B is covered by the light-shielding layer 652A and 652B. The light-shielding layer 652A and 652B is disposed over the color filter layer 636. Or, in other embodiment, the light shielding layer is disposed over the transistors 616A and 616B. In addition, the light-emitting units 632C and 632D of the light-emitting diode chip 610B are both electrically connected to the column common electrode 650 through a second electrode 638. In other embodiments, the light-emitting units 632C and 632D may independently include their own respective second electrodes 638.

The light-shielding layers 652A and 652B may include, but is not limited to, black photoresist, black printing ink, black resin or any other suitable light-shielding materials of various colors.

Figure 6F:
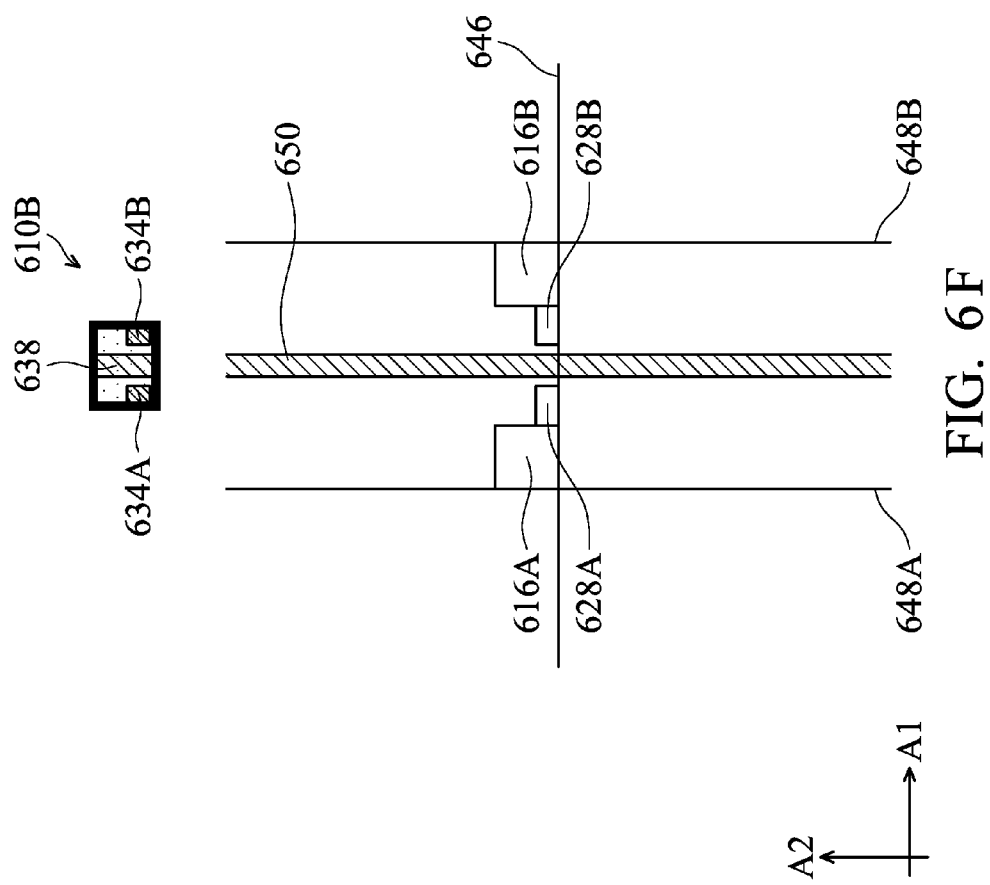
FIG. 6F is a schematic view of the light-emitting diode chip and the first substrate in accordance with some embodiments of the present disclosure shown in FIG. 6D.

FIG. 6F is a schematic view of the light-emitting diode chip and the first substrate in accordance with some embodiments of the present disclosure shown in FIG. 6D. FIG. 6F shows the first electrodes 634A, 634B and the second electrode 638 of the light-emitting diode chip 610B. FIG. 6F also shows the transistors 616A and 616B, connection electrodes 628A and 628B, column common electrode 650, the gate line 646 and two data lines 648A and 648B disposed over the first substrate 614.

It should be noted that the exemplary embodiment set forth in FIGS. 6A-6F is merely for the purpose of illustration. In addition to the embodiment set forth in FIGS. 6A-6F, the light-emitting diode chip may have other configurations as shown in FIGS. 7A-7D. This will be described in detail in the following description. Therefore, the inventive concept and scope are not limited to the exemplary embodiment shown in FIGS. 6A-6F. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 7A:
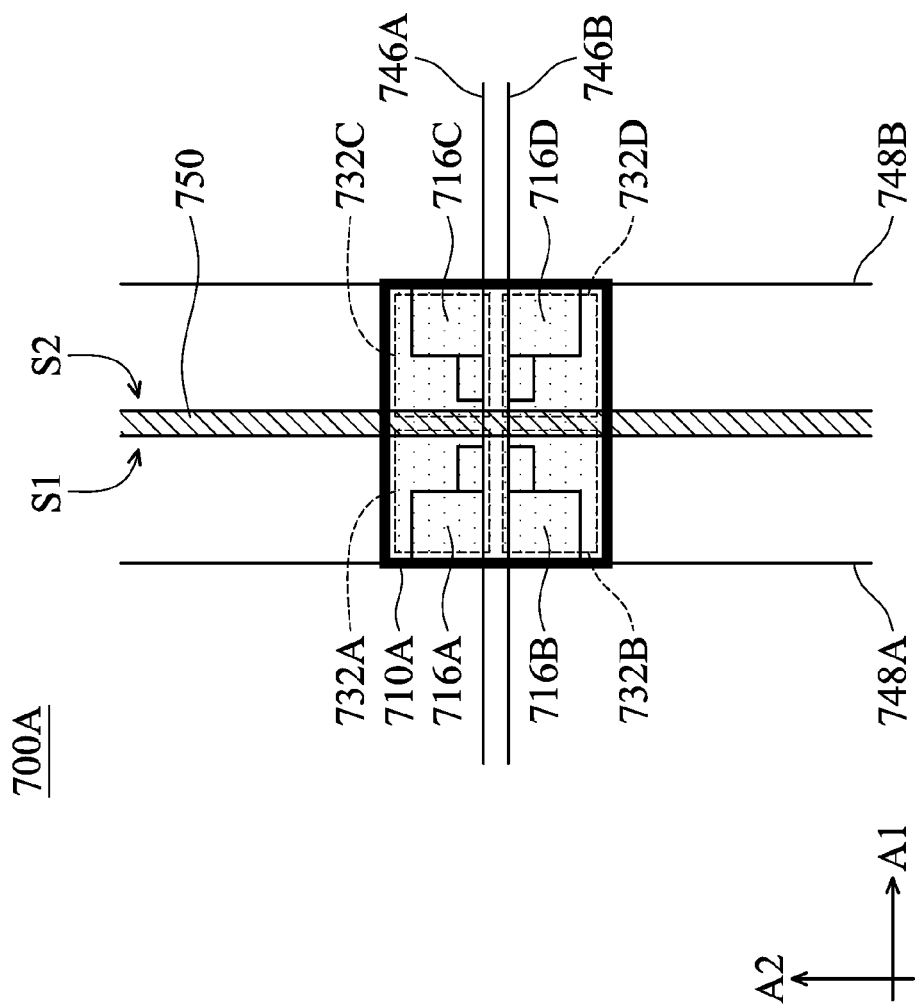
FIG. 7A is a partial top view of a display device in accordance with another embodiment of the present disclosure.

FIG. 7A is a partial top view of a display device 700A in accordance with another embodiment of the present disclosure. As shown in FIG. 7A, the display device 700A includes a first transistor 716A, a second transistor 716B, a third transistor 716C and a fourth transistor 716D.

In addition, the display device 700A includes two gate lines 746A and 746B, and two data lines 748A and 748B. The two gate lines 746A and 746B and the two data lines 748A and 748B together control the first transistor 716A, second transistor 716B, third transistor 716C and fourth transistor 716D.

In addition, the display device 700A includes a column common electrode 750. The column common electrode 750 has opposite sides S1 and S2. The first transistor 716A and second transistor 716B are disposed at the side Si of the column common electrode 750. The third transistor 716C and fourth transistor 716D are disposed at the side S2 of the column common electrode 750.

The light-emitting diode chip 710A is disposed corresponding to the first transistor 716A, second transistor 716B, third transistor 716C and fourth transistor 716D. The light-emitting diode chip 710A includes a first light-emitting unit 732A, a second light-emitting unit 732B, a third light-emitting unit 732C and a fourth light-emitting unit 732D. The first light-emitting unit 732A, second light-emitting unit 732B, third light-emitting unit 732C and fourth light-emitting unit 732D are electrically connected to the first transistor 716A, second transistor 716B, third transistor 716C and fourth transistor 716D, respectively. The first light-emitting unit 732A, second light-emitting unit 732B, third light-emitting unit 732C and fourth light-emitting unit 732D are all electrically connected to the column common electrode 750.

In addition, in the embodiment shown in FIG. 7A, although the light-emitting diode chip 710A partially covers the display region 102, the light-emitting diode chip 710A completely covers the first transistor 716A, second transistor 716B, third transistor 716C and fourth transistor 716D which the light-emitting diode chip 710A corresponds to.

Figure 7B:
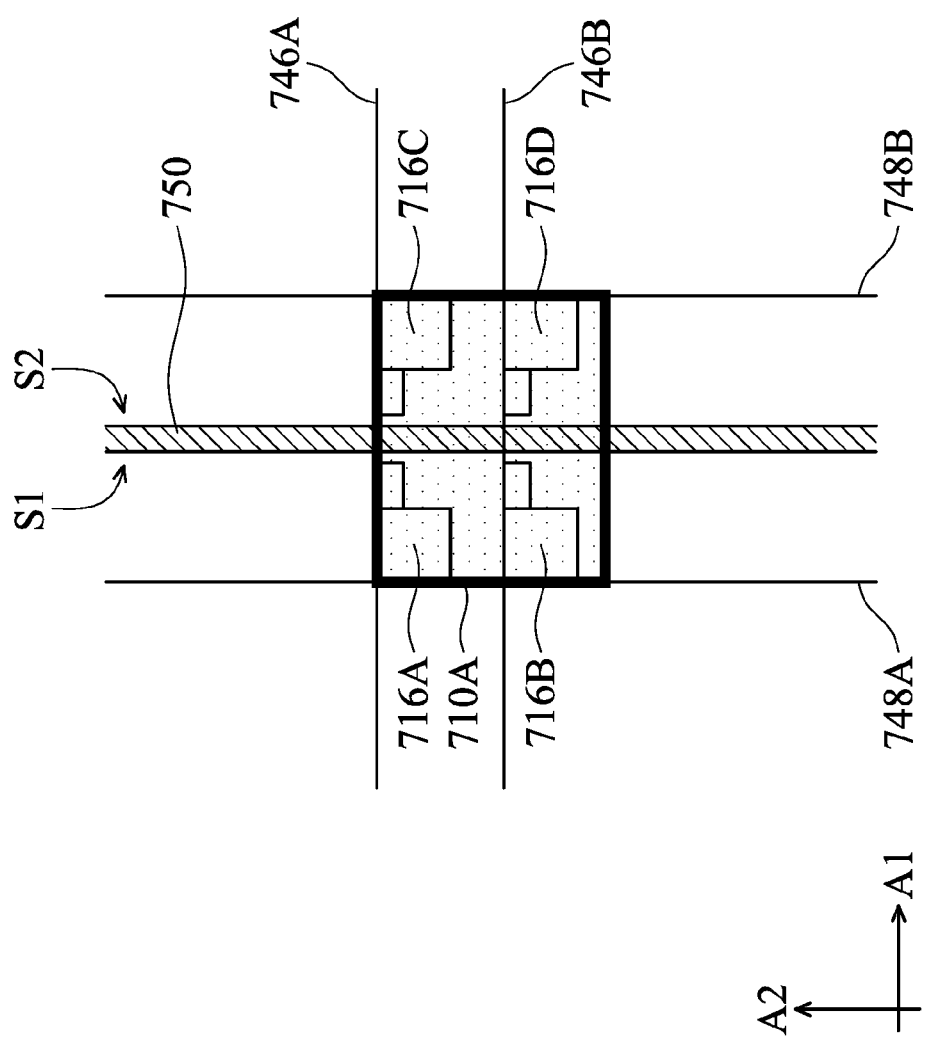
FIG. 7B is a partial top view of a display device in accordance with another embodiment of the present disclosure.
Figure 7C:
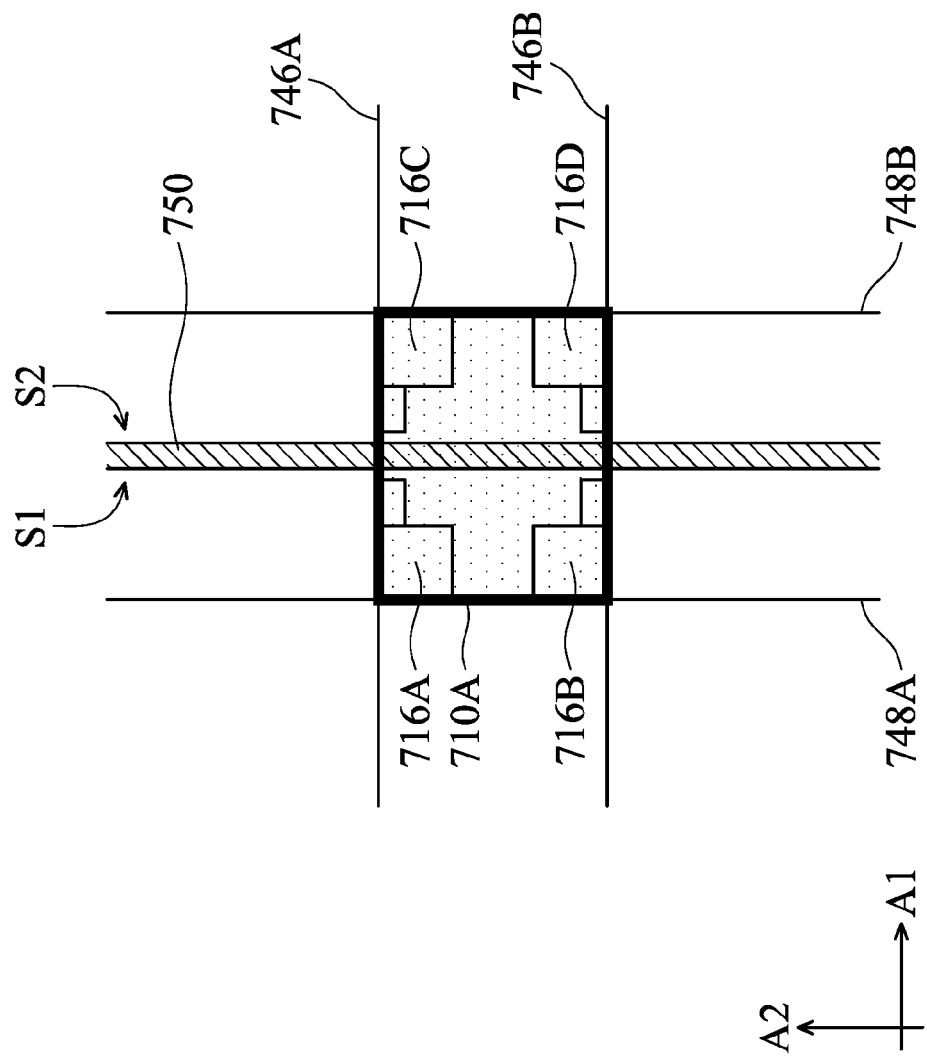
FIG. 7C is a partial top view of a display device in accordance with another embodiment of the present disclosure.

It should be noted that the exemplary embodiment set forth in FIG. 7A is merely for the purpose of illustration. In addition to the embodiment set forth in FIG. 7A, the light-emitting diode chip may have other configurations as shown in FIGS. 7B-7C. This will be described in detail in the following description. Therefore, the inventive concept and scope are not limited to the exemplary embodiment shown in FIG. 7A. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 7D:
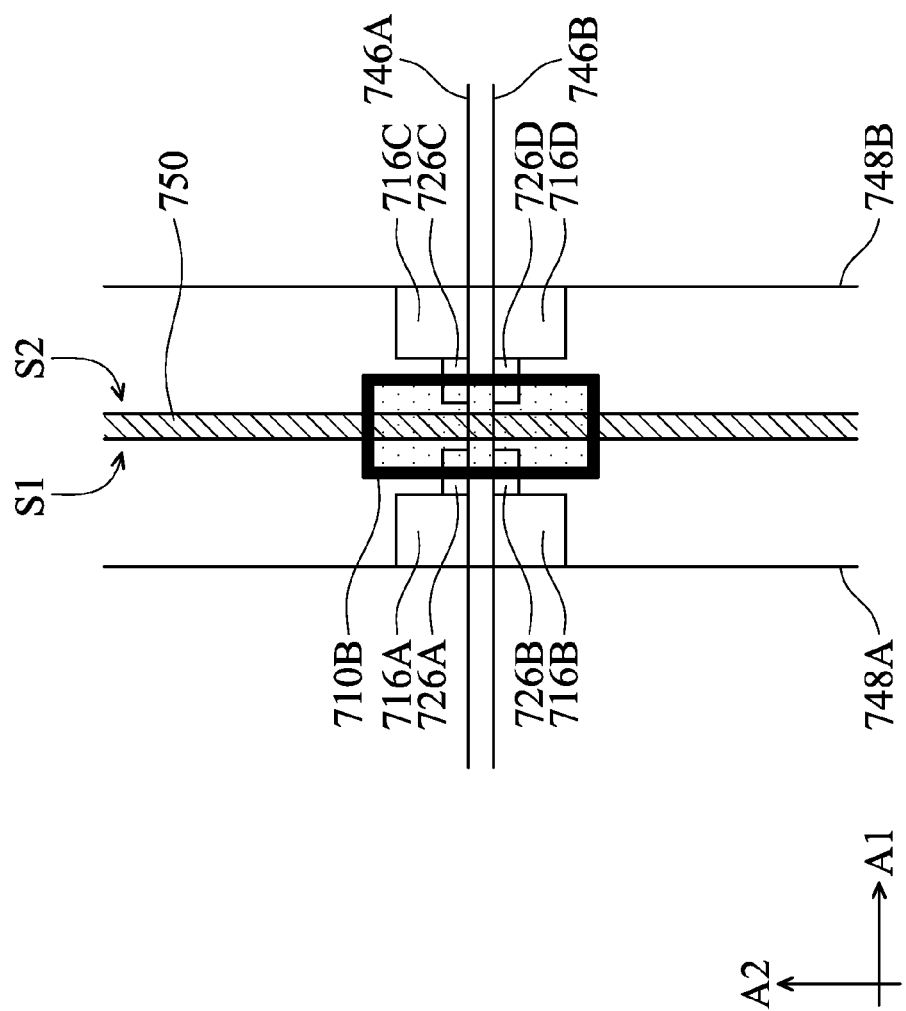
FIG. 7D is a partial top view of a display device in accordance with another embodiment of the present disclosure.

It should be noted that the exemplary embodiment set forth in FIGS. 7A-7C is merely for the purpose of illustration. In addition to the embodiment set forth in FIGS. 7A-7C, the light-emitting diode chip may have other configurations as shown in FIG. 7D. This will be described in detail in the following description. Therefore, the inventive concept and scope are not limited to the exemplary embodiment shown in FIGS. 7A-7C. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

The difference between the embodiment shown in FIG. 7D and the embodiment shown in FIGS. 7A-7C is that the light-emitting diode chip 710B partially covers the display region 102. The light-emitting diode chip 710B also partially covers the first transistor 716A, second transistor 716B, third transistor 716C and fourth transistor 716D which the light-emitting diode chip 710A corresponds to. In particular, the light-emitting diode chip 710B covers the connection electrodes 726A, 726B, 726C and 726D of the transistors 716A, 716B, 716C and 716D. However, in other embodiments in which there are no connection electrodes 726A, 726B, 726C and 726D, the light-emitting diode chip 710B covers the drain electrodes of the transistors 716A, 716B, 716C and 716D.

It should be noted that the exemplary embodiment set forth in FIGS. 6A-7D is merely for the purpose of illustration. In addition to the embodiment set forth in FIGS. 6A-7D, the light-emitting diode chip may have other configurations as shown in FIGS. 8A-8D. This will be described in detail in the following description. Therefore, the inventive concept and scope are not limited to the exemplary embodiment shown in FIGS. 6A-7D. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 8A:
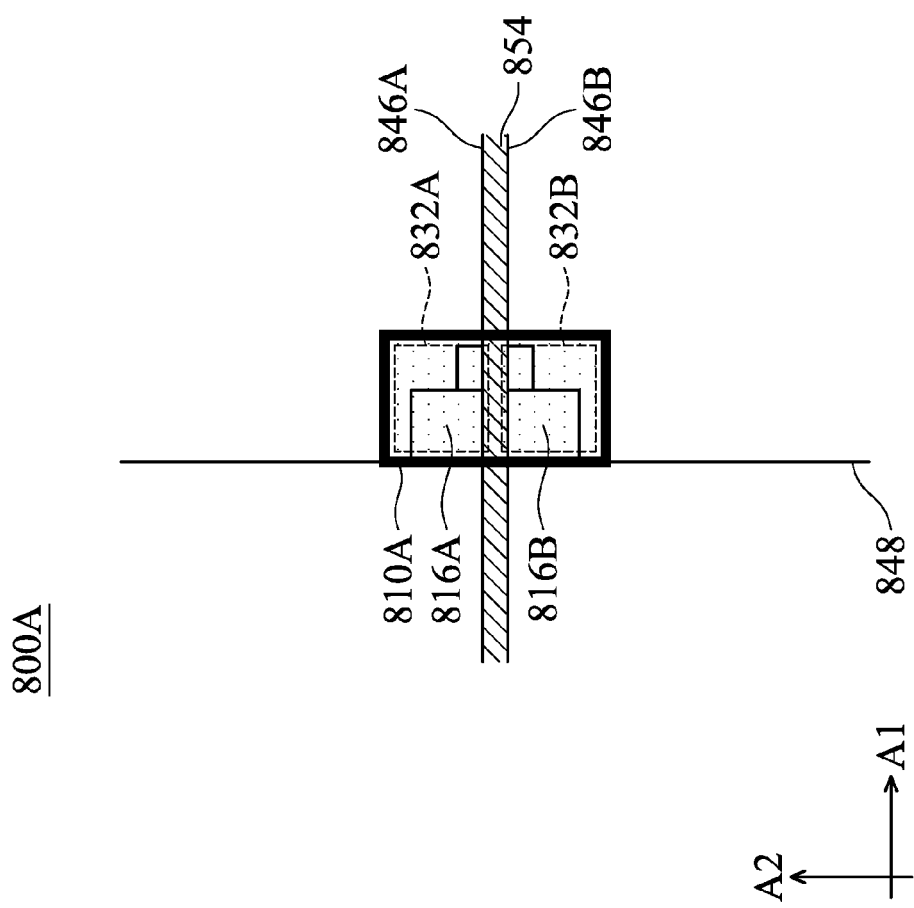
FIG. 8A is a partial top view of a display device in accordance with another embodiment of the present disclosure.

FIG. 8A is a partial top view of a display device 800A in accordance with another embodiment of the present disclosure. As shown in FIG. 8A, the plurality of transistors of the display device 800A includes a first transistor 816A and a second transistor 816B.

In addition, the display device 800A includes two gate lines 846A and 846B, and a data line 848. The two gate lines 846A and 846B and the data line 848 together control the first transistor 816A and second transistor 816B.

In addition, the display device 800A includes a row common electrode 854. The first transistor 816A and second transistor 816B are disposed at the opposite sides of the row common electrode 854, respectively. The light-emitting diode chip 810A is disposed corresponding to the first transistor 816A and second transistor 816B. The light-emitting diode chip 810A includes a first light-emitting unit 832A and a second light-emitting unit 832B. The first light-emitting unit 832A and second light-emitting unit 832B are electrically connected to the first transistor 816A and second transistor 816B, respectively. The first light-emitting unit 832A and second light-emitting unit 832B are all electrically connected to the row common electrode 854.

In addition, in the embodiment shown in FIG. 8A, although the light-emitting diode chip 810A partially covers the display region 102, the light-emitting diode chip 810A completely covers the first transistor 816A and second transistor 816B which the light-emitting diode chip 810A corresponds to.

Figure 8B:
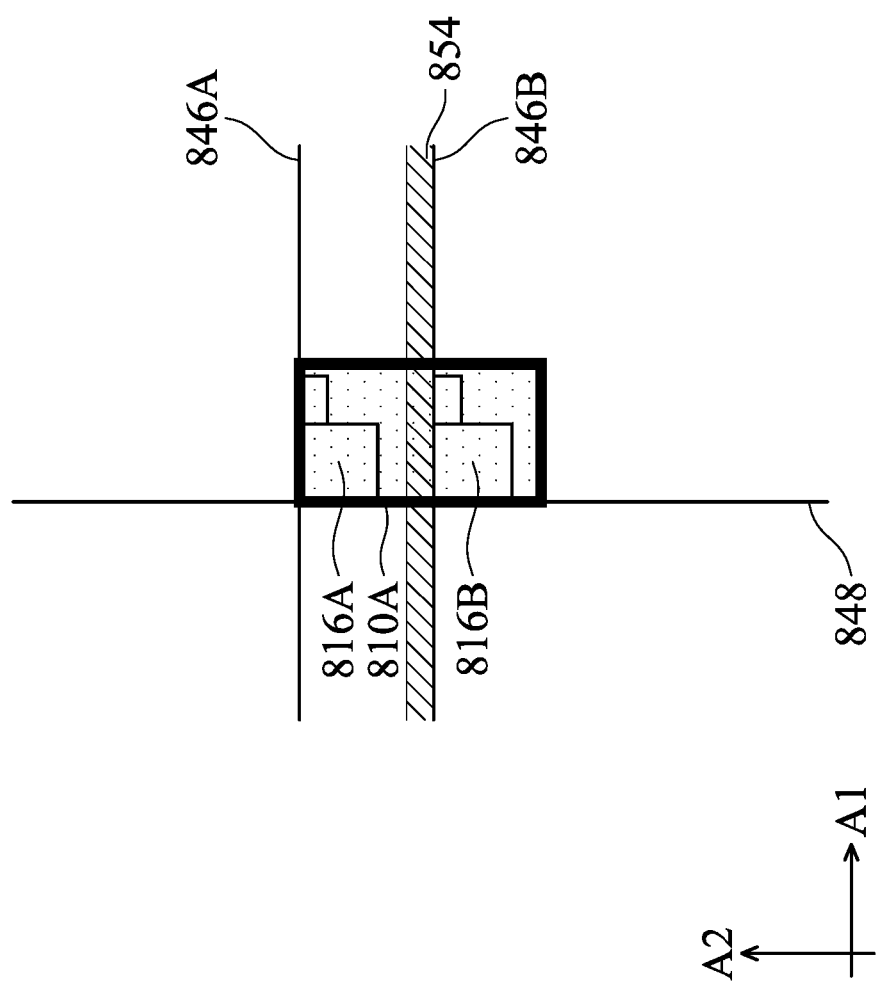
FIG. 8B is a partial top view of a display device in accordance with another embodiment of the present disclosure.

It should be noted that the exemplary embodiment set forth in FIG. 8A is merely for the purpose of illustration. In addition to the embodiment set forth in FIG. 8A, the light-emitting diode chip may have other configurations as shown in FIGS. 8B-8C. This will be described in detail in the following description. Therefore, the inventive concept and scope are not limited to the exemplary embodiment shown in FIG. 8A. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 8D:
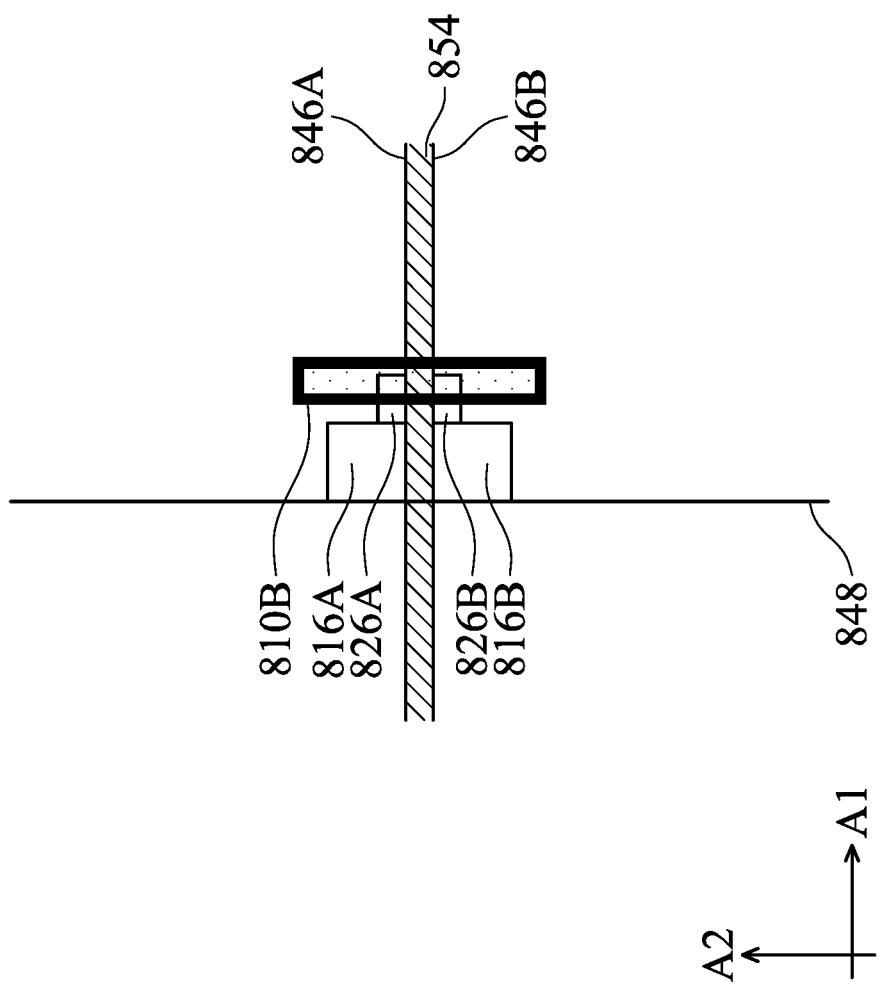
FIG. 8D is a partial top view of a display device in accordance with another embodiment of the present disclosure.

It should be noted that the exemplary embodiment set forth in FIGS. 8A-8C is merely for the purpose of illustration. In addition to the embodiment set forth in FIGS. 8A-8C, the light-emitting diode chip may have other configurations as shown in FIG. 8D. This will be described in detail in the following description. Therefore, the inventive concept and scope are not limited to the exemplary embodiment shown in FIGS. 8A-8C. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

The difference between the embodiment shown in FIG. 8D and the embodiment shown in FIGS. 8A-8C is that the light-emitting diode chip 810B partially covers the display region 102. The light-emitting diode chip 810B also partially covers the first transistor 816A and second transistor 816B which the light-emitting diode chip 810A corresponds to. In particular, the light-emitting diode chip 810B covers the connection electrodes 826A and 826B of the transistors 816A and 816B. However, in other embodiments in which there are no connection electrodes 826A and 826B, the light-emitting diode chip 810B covers the drain electrodes of the transistors 816A and 816B.

It should be noted that the exemplary embodiment set forth in FIGS. 8A-8D is merely for the purpose of illustration. In addition to the embodiment set forth in FIGS. 8A-8D, the light-emitting diode chip may have other configurations as shown in FIGS. 9A-9D. This will be described in detail in the following description. Therefore, the inventive concept and scope are not limited to the exemplary embodiment shown in FIGS. 8A-8D. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 9A:
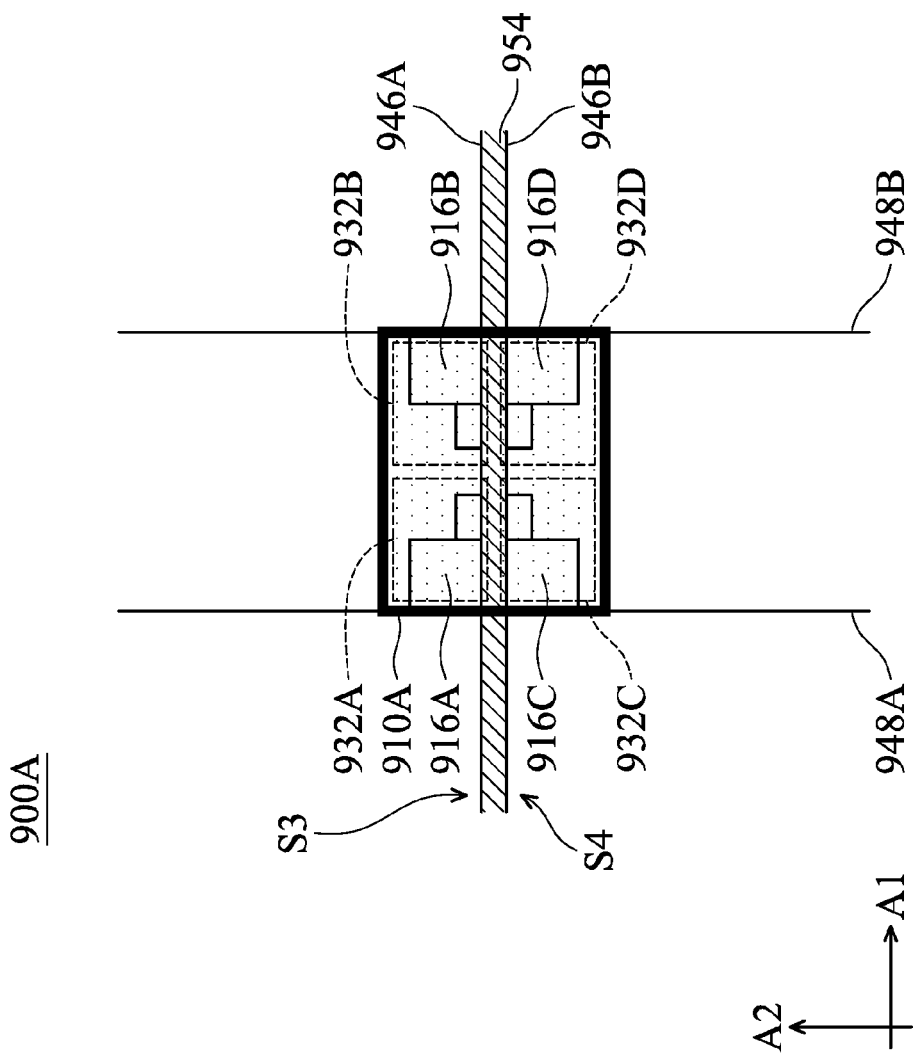
FIG. 9A is a partial top view of a display device in accordance with another embodiment of the present disclosure.

FIG. 9A is a partial top view of a display device 900A in accordance with another embodiment of the present disclosure. As shown in FIG. 9A, the display device 900A includes a first transistor 916A, a second transistor 916B, a third transistor 916C and a fourth transistor 916D.

In addition, the display device 900A includes two gate lines 946A and 946B, and two data lines 948A and 948B. The two gate lines 946A and 946B and the two data lines 948A and 948B together control the first transistor 916A, second transistor 916B, third transistor 916C and fourth transistor 916D.

In addition, the display device 900A includes a row common electrode 954. The row common electrode 954 has opposite sides S3 and S4. The first transistor 916A and second transistor 916B are disposed at the first side S3 of the row common electrode 954. The third transistor 916C and fourth transistor 916D are disposed at the second side S4 of the row common electrode 954.

The light-emitting diode chip 910A is disposed corresponding to the first transistor 916A, second transistor 916B, third transistor 916C and fourth transistor 916D. The light-emitting diode chip 910A includes a first light-emitting unit 932A, a second light-emitting unit 932B, a third light-emitting unit 932C and a fourth light-emitting unit 932D. The first light-emitting unit 932A, second light-emitting unit 932B, third light-emitting unit 932C and fourth light-emitting unit 932D are electrically connected to the first transistor 916A, second transistor 916B, third transistor 916C and fourth transistor 916D, respectively. The first light-emitting unit 932A, second light-emitting unit 932B, third light-emitting unit 932C and fourth light-emitting unit 932D are all electrically connected to the row common electrode 954.

In addition, in the embodiment shown in FIG. 9A, although the light-emitting diode chip 910A partially covers the display region 102, the light-emitting diode chip 910A completely covers the first transistor 916A, second transistor 916B, third transistor 916C and fourth transistor 916D which the light-emitting diode chip 910A corresponds to.

Figure 9B:
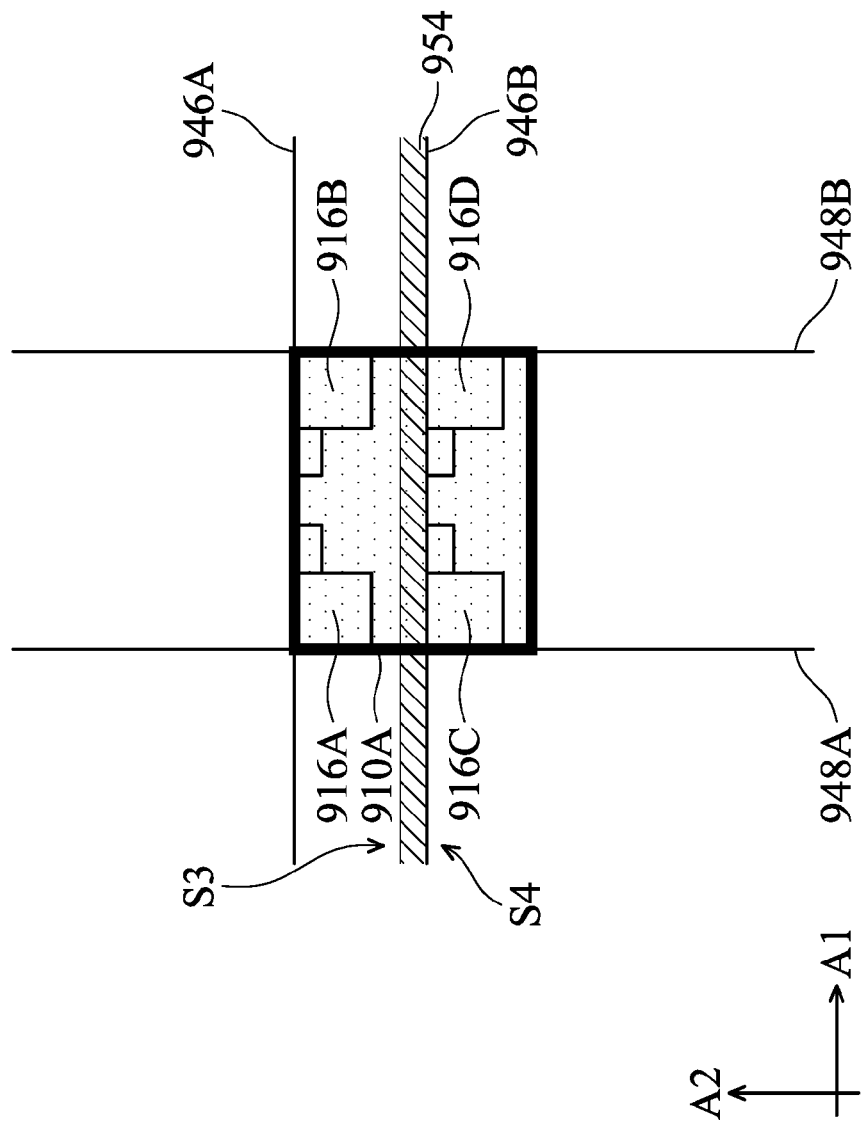
FIG. 9B is a partial top view of a display device in accordance with another embodiment of the present disclosure.
Figure 9C:
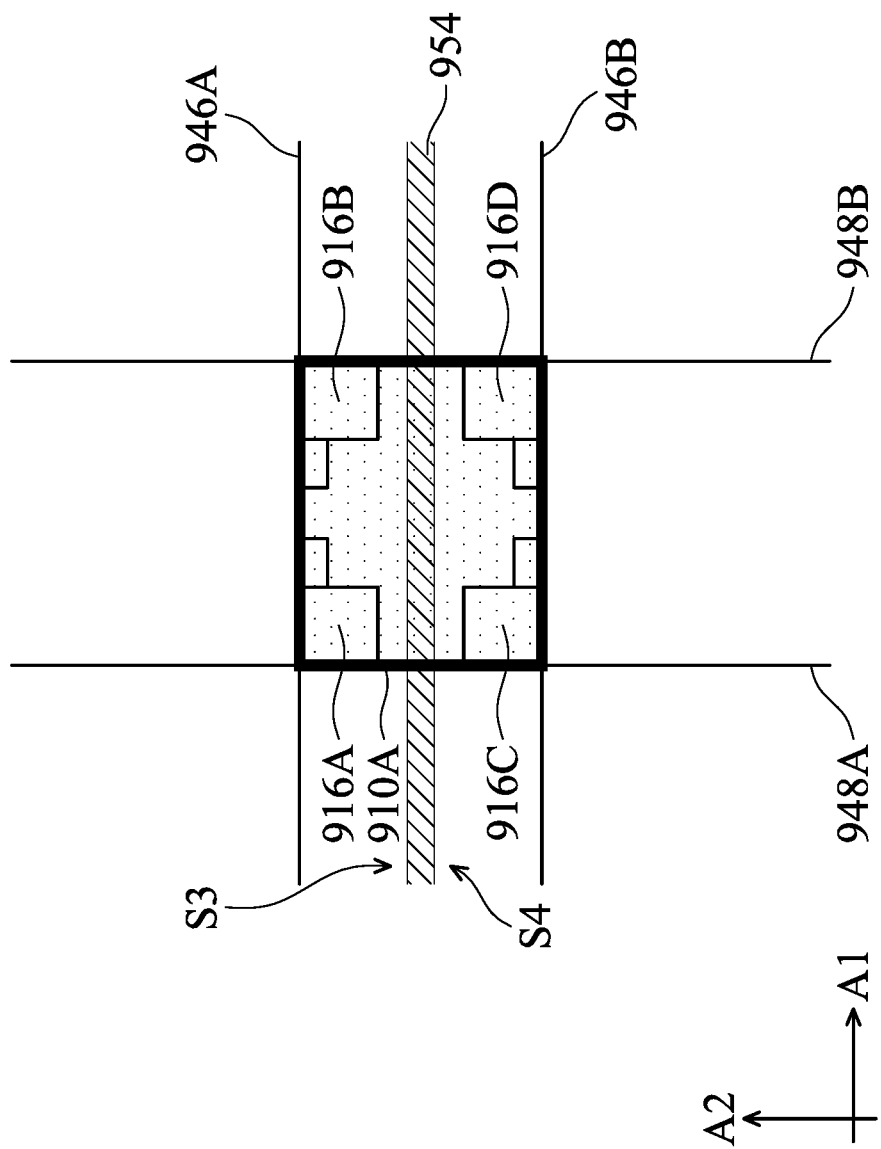
FIG. 9C is a partial top view of a display device in accordance with another embodiment of the present disclosure.

It should be noted that the exemplary embodiment set forth in FIG. 9A is merely for the purpose of illustration. In addition to the embodiment set forth in FIG. 9A, the light-emitting diode chip may have other configurations as shown in FIGS. 9B-9C. This will be described in detail in the following description. Therefore, the inventive concept and scope are not limited to the exemplary embodiment shown in FIG. 9A. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 9D:
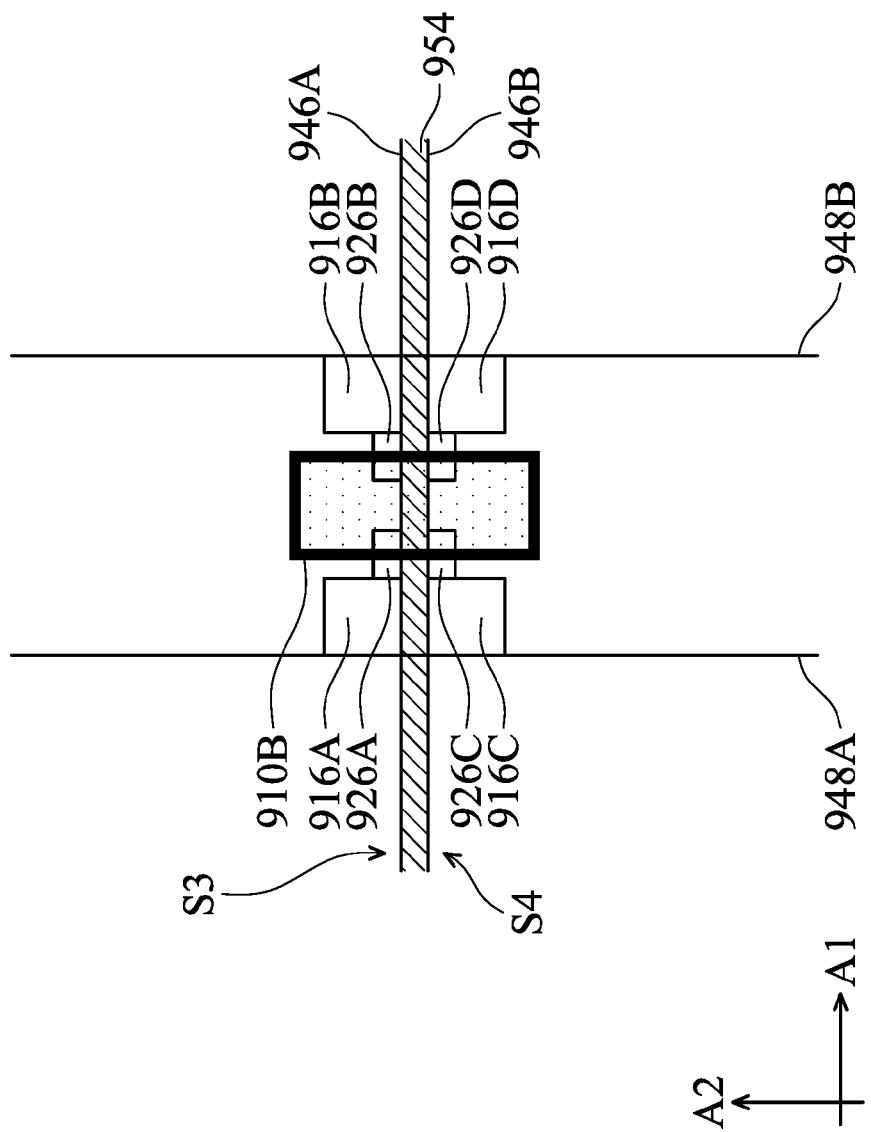
FIG. 9D is a partial top view of a display device in accordance with another embodiment of the present disclosure.

It should be noted that the exemplary embodiment set forth in FIGS. 9A-9C is merely for the purpose of illustration. In addition to the embodiment set forth in FIGS. 9A-9C, the light-emitting diode chip may have other configurations as shown in FIG. 9D. This will be described in detail in the following description. Therefore, the inventive concept and scope are not limited to the exemplary embodiment shown in FIGS. 9A-9C. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

The difference between the embodiment shown in FIG. 9D and the embodiment shown in FIGS. 9A-9C is that the light-emitting diode chip 910B partially covers the display region 102. The light-emitting diode chip 910B also partially covers the first transistor 916A, second transistor 916B, third transistor 916C and fourth transistor 916D which the light-emitting diode chip 910A corresponds to. In particular, the light-emitting diode chip 910B covers the connection electrodes 926A, 926B, 926C and 926D of the transistors 916A, 916B, 916C and 916D. However, in other embodiments in which there are no connection electrodes 926A, 926B, 926C and 926D, the light-emitting diode chip 910B covers the drain electrodes of the transistors 916A, 916B, 916C and 916D.

It should be noted that the exemplary embodiment set forth in FIGS. 9A-9D is merely for the purpose of illustration. In addition to the embodiment set forth in FIGS. 9A-9D, the light-emitting diode chip may have other configurations as shown in FIGS. 10A-10D. This will be described in detail in the following description. Therefore, the inventive concept and scope are not limited to the exemplary embodiment shown in FIGS. 9A-9D. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

FIG. 10A is a partial top view of a display device 1000A in accordance with another embodiment of the present disclosure. As shown in FIG. 10A, the display device 1000A includes a first transistor 1016A, a second transistor 1016B, a third transistor 1016C and a fourth transistor 1016D.

In addition, the display device 1000A includes two gate lines 1046A and 1046B, and two data lines 1048A and 1048B. The two gate lines 1046A and 1046B and the two data lines 1048A and 1048B together control the first transistor 1016A, second transistor 1016B, third transistor 1016C and fourth transistor 1016D.

In addition, the display device 1000A includes a column common electrode 1050 and row common electrode 1054. The column common electrode 1050 has a first side S5 and an opposing second side S6, which are opposite from each other. The row common electrode 1054 has a third side S7 and fourth side S8, which are opposite from each other. The row common electrode 1054 intersects the column common electrode 1050. When the row common electrode 1054 and the column common electrode 1050 are in equal potential, the row common electrode 1054 and the column common electrode 1050 may be electrically connected to each other. When the row common electrode 1054 and the column common electrode 1050 are not in equal potential, the row common electrode 1054 and the column common electrode 1050 may not be electrically connected to each other. The first transistor 1016A and second transistor 1016B are disposed at the first side S5 of the column common electrode 1050. The third transistor 1016C and fourth transistor 1016D are disposed at the second side S6 of the column common electrode 1050. In addition, the first transistor 1016A and third transistor 1016C are disposed at the third side S7 of the row common electrode 1054. The second transistor 1016B and fourth transistor 1016D are disposed at the fourth side S8 of the row common electrode 1054.

The light-emitting diode chip 1010A is disposed corresponding to the first transistor 1016A, second transistor 1016B, third transistor 1016C and fourth transistor 1016D. The light-emitting diode chip 1010A includes a first light-emitting unit 1032A, a second light-emitting unit 1032B, a third light-emitting unit 1032C and a fourth light-emitting unit 1032D. The first light-emitting unit 1032A, second light-emitting unit 1032B, third light-emitting unit 1032C and fourth light-emitting unit 1032D are electrically connected to the first transistor 1016A, second transistor 1016B, third transistor 1016C and fourth transistor 1016D, respectively. The first light-emitting unit 1032A, second light-emitting unit 1032B, third light-emitting unit 1032C and fourth light-emitting unit 1032D are all electrically connected to the column common electrode 1050 and row common electrode 1054.

By using the column common electrode 1050 and row common electrode 1054 simultaneously, the uniformity of the electric fields in the device may be improved, which in turn improves the display quality.

In addition, in the embodiment shown in FIG. 10A, although the light-emitting diode chip 1010A partially covers the display region 102, the light-emitting diode chip 1010A completely covers the first transistor 1016A, second transistor 1016B, third transistor 1016C and fourth transistor 1016D which the light-emitting diode chip 1010A corresponds to.

Figure 10:
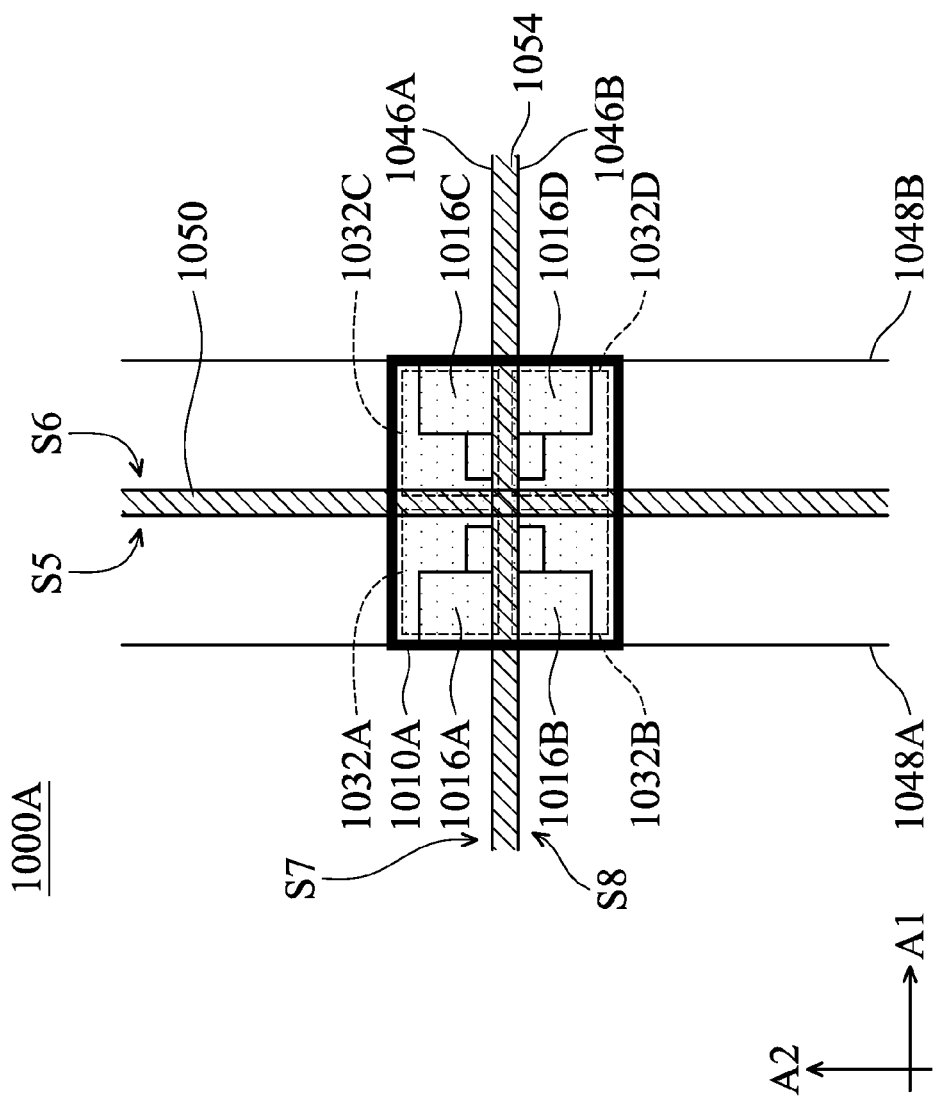
FIG. 10A is a partial top view of a display device in accordance with another embodiment of the present disclosure.
FIG. 10B is a partial top view of a display device in accordance with another embodiment of the present disclosure.
FIG. 10C is a partial top view of a display device in accordance with another embodiment of the present disclosure.
FIG. 10D is a partial top view of a display device in accordance with another embodiment of the present disclosure.
Figure 10B:
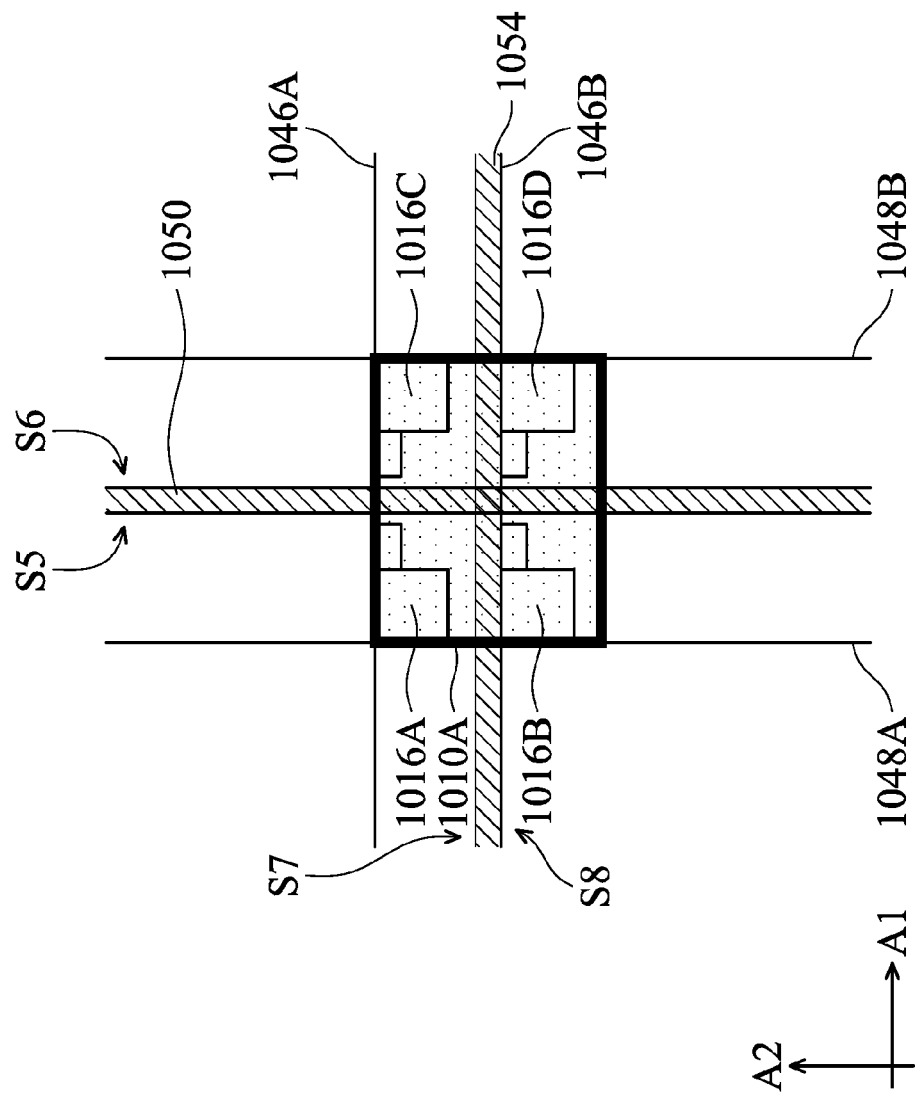
Figure 10C:
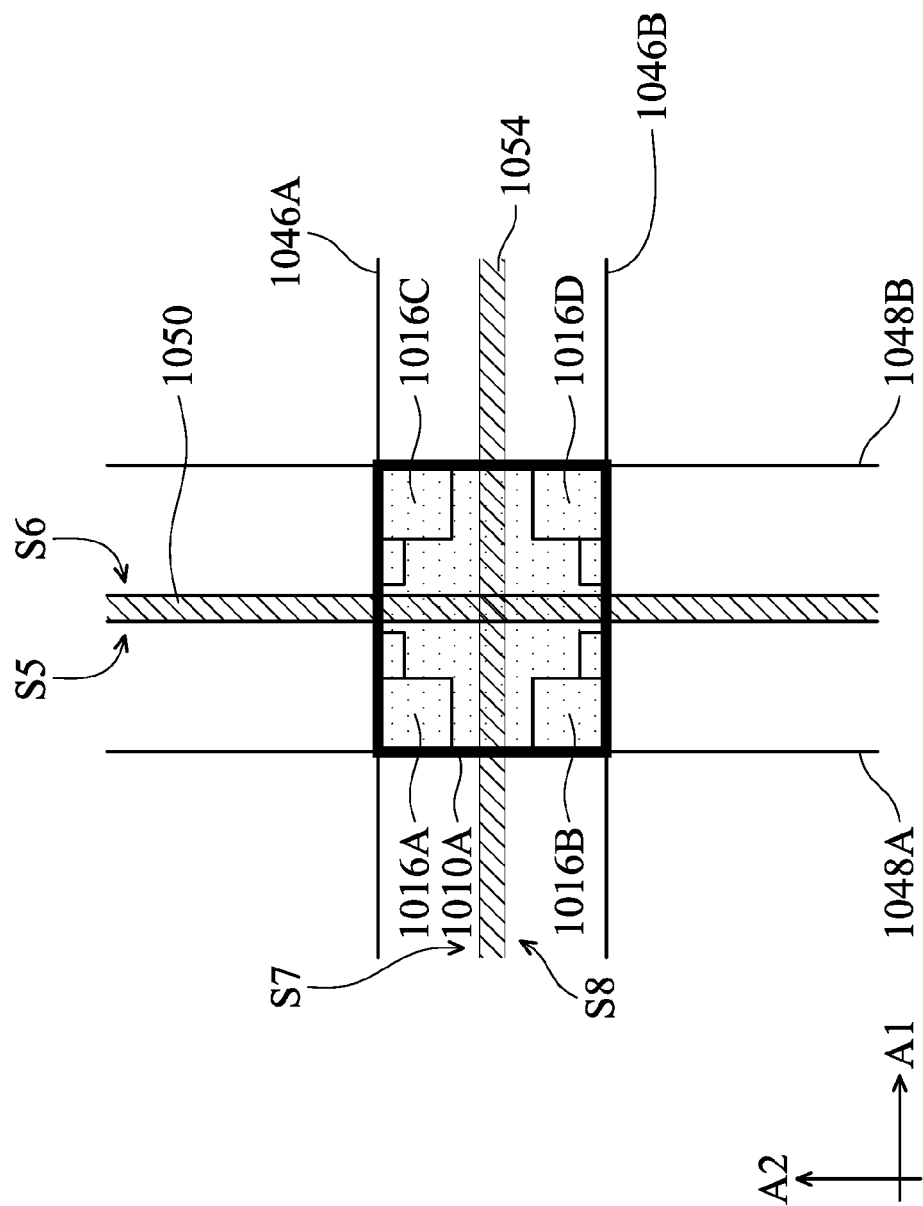

It should be noted that the exemplary embodiment set forth in FIG. 10A is merely for the purpose of illustration. In addition to the embodiment set forth in FIG. 10A, the light-emitting diode chip may have other configurations as shown in FIGS. 10B-10C. This will be described in detail in the following description. Therefore, the inventive concept and scope are not limited to the exemplary embodiment shown in FIG. 10A. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 10D:
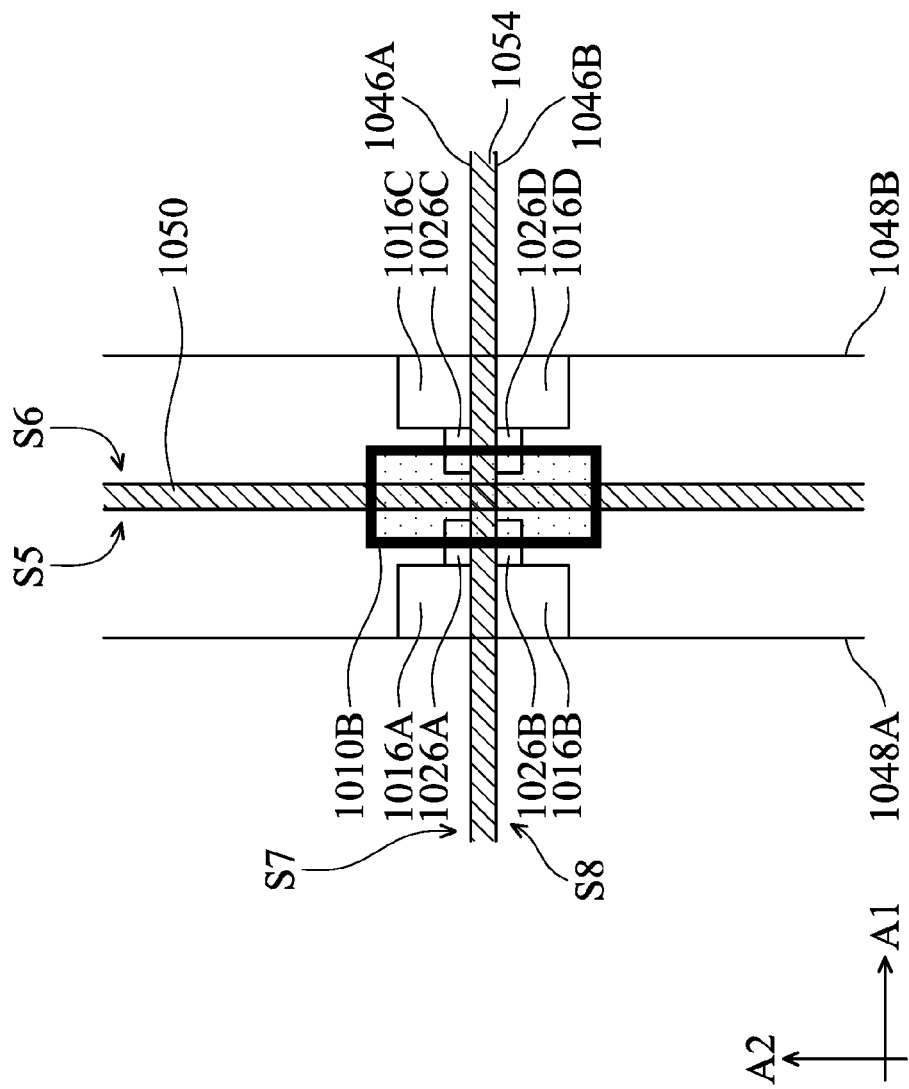

It should be noted that the exemplary embodiment set forth in FIGS. 10A-10C is merely for the purpose of illustration. In addition to the embodiment set forth in FIGS. 10A-10C, the light-emitting diode chip may have other configurations as shown in FIG. 10D. This will be described in detail in the following description. Therefore, the inventive concept and scope are not limited to the exemplary embodiment shown in FIGS. 10A-10C. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

The difference between the embodiment shown in FIG. 10D and the embodiment shown in FIGS. 10A-10C is that the light-emitting diode chip 1010B partially covers the display region 102. The light-emitting diode chip 1010B also partially covers the first transistor 1016A, second transistor 1016B, third transistor 1016C and fourth transistor 1016D which the light-emitting diode chip 1010A corresponds to. In particular, the light-emitting diode chip 1010B covers the connection electrodes 1026A, 1026B, 1026C and 1026D of the transistors 1016A, 1016B, 1016C and 1016D. However, in other embodiments in which there are no connection electrodes 1026A, 1026B, 1026C and 1026D, the light-emitting diode chip 1010B covers the drain electrodes of the transistors 1016A, 1016B, 1016C and 1016D.

It should be noted that the exemplary embodiment set forth in FIGS. 6A-10D is merely for the purpose of illustration. In addition to the embodiment set forth in FIGS. 6A-10D, the gate line and the data line may have other configurations as shown in FIGS. 11A-11D. This will be described in detail in the following description. Therefore, the inventive concept and scope are not limited to the exemplary embodiment shown in FIGS. 6A-10D. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 11A:
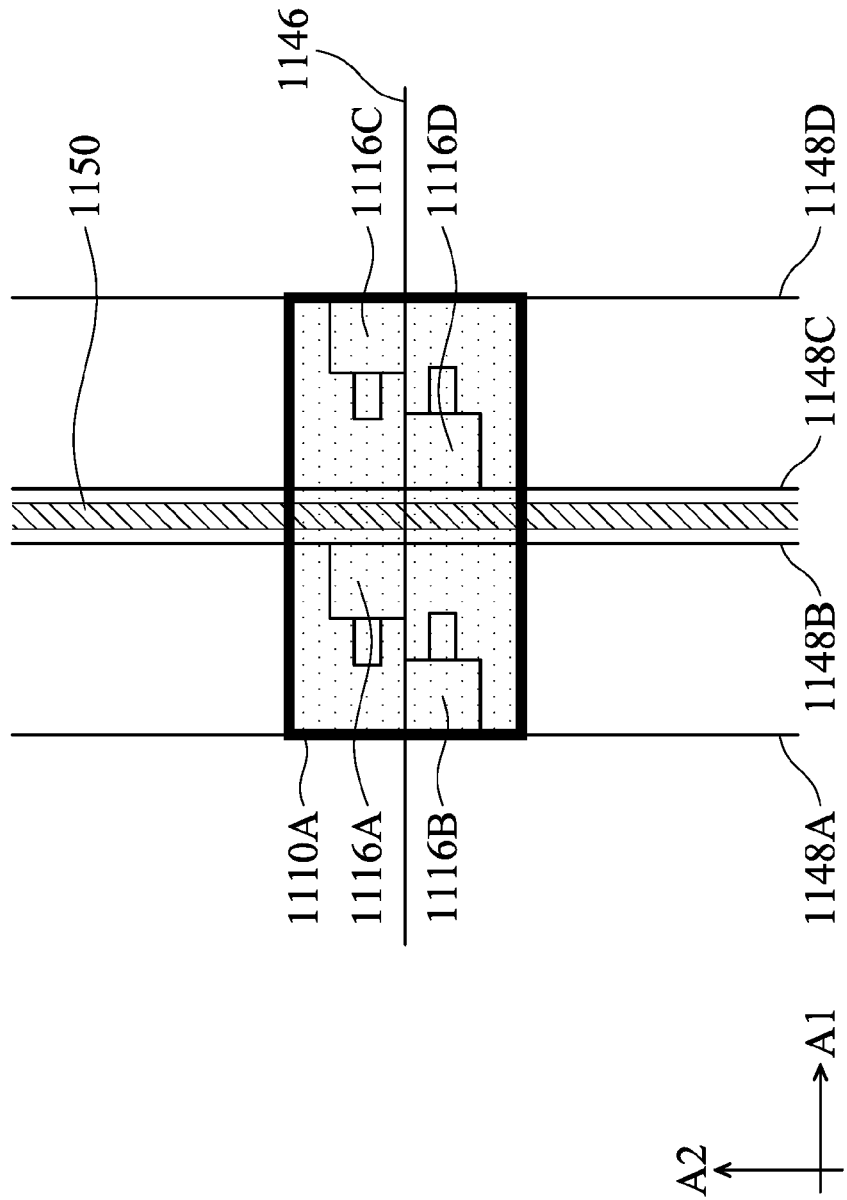
FIG. 11A is a partial top view of a display device in accordance with another embodiment of the present disclosure.

FIG. 11A is a partial top view of a display device 1100A in accordance with another embodiment of the present disclosure. As shown in FIG. 11A, the plurality of transistors of the display device 1100A includes a first transistor 1116A, a second transistor 1116B, a third transistor 1116C and a fourth transistor 1116D.

In addition, the display device 1100A includes a gate line 1146 and four data lines 1148A, 1148B, 1148C and 1148D. The gate line 1146 and the four data lines 1148A, 1148B, 1148C and 1148D together control the first transistor 1116A, second transistor 1116B, third transistor 1116C and fourth transistor 1116D.

By using one gate line 1146 and four data lines 1148A, 1148B, 1148C and 1148D to control the four transistors, the scan frequency of the device or the scan time of each scan may be increased, which in turn improves the display quality.

Figure 11B:
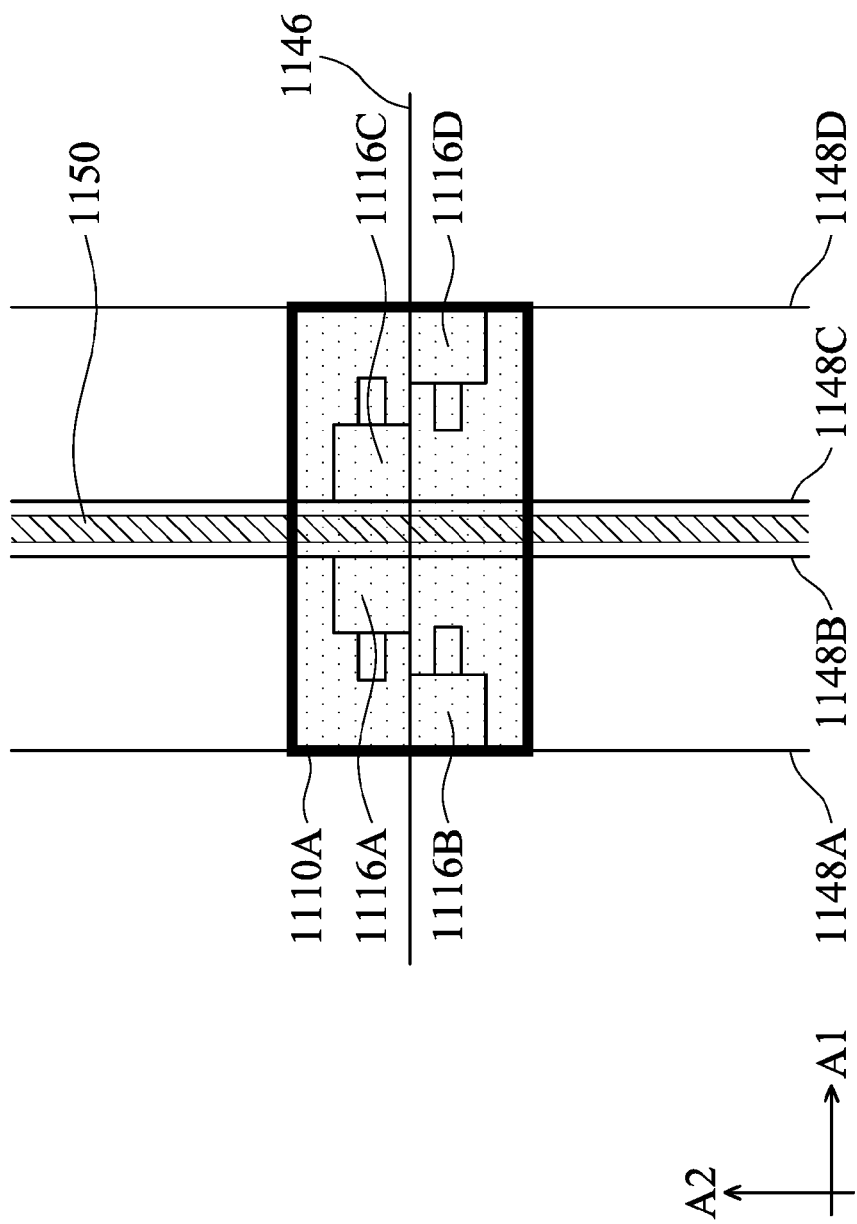
FIG. 11B is a partial top view of a display device in accordance with another embodiment of the present disclosure.
Figure 11:
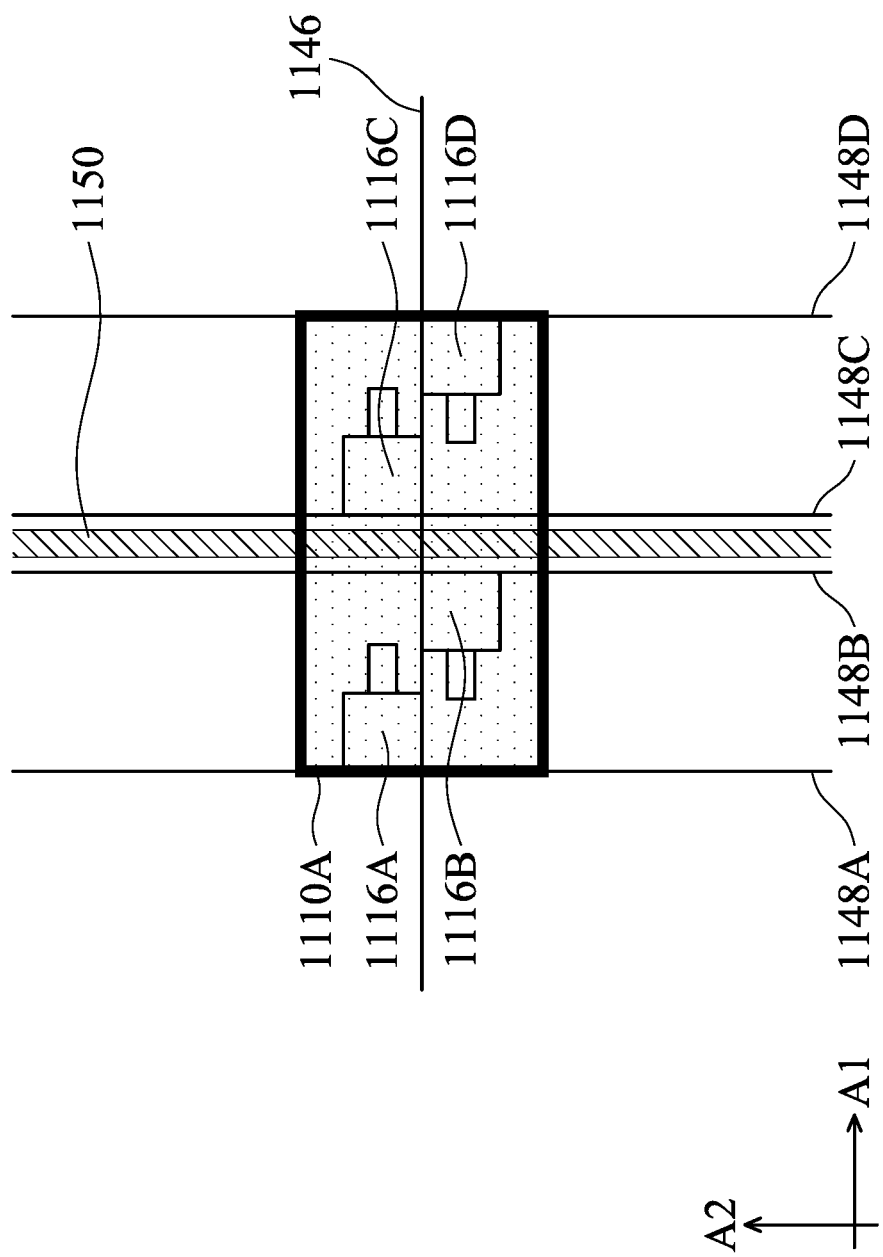
FIG. 11C is a partial top view of a display device in accordance with another embodiment of the present disclosure.
FIG. 11D is a partial top view of a display device in accordance with another embodiment of the present disclosure.
FIG. 11E is a partial top view of a display device in accordance with another embodiment of the present disclosure.
Figure 11D:
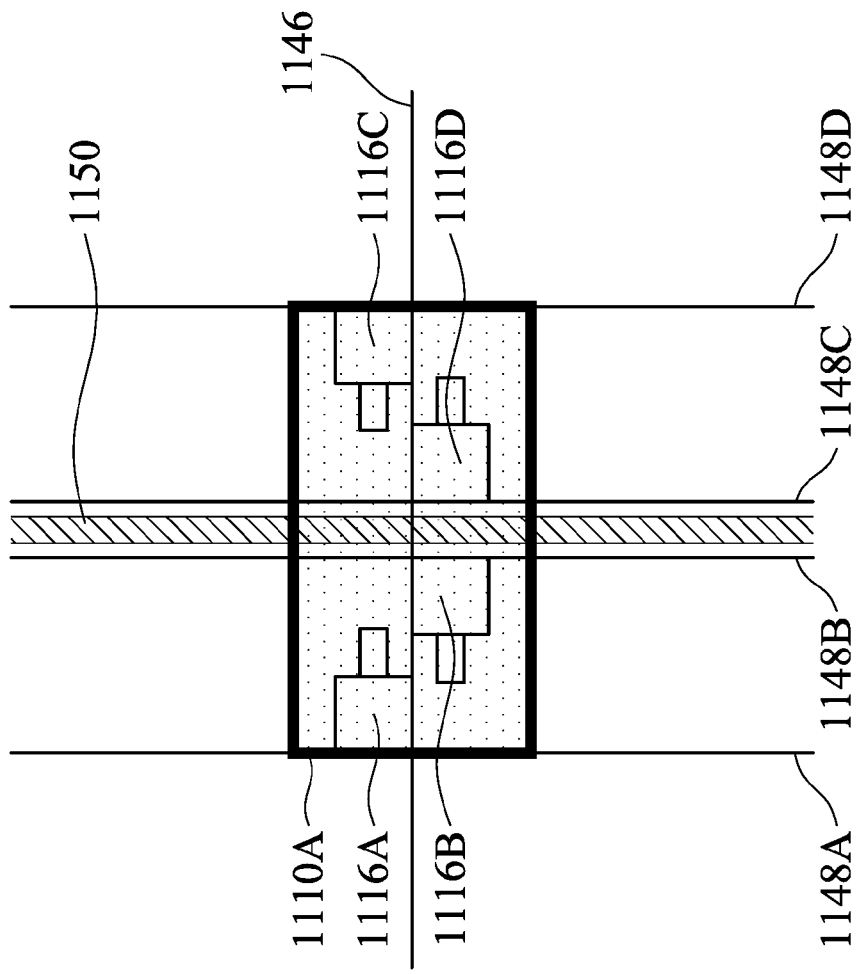

It should be noted that the exemplary embodiment set forth in FIG. 11A is merely for the purpose of illustration. In addition to the embodiment set forth in FIG. 11A, the light-emitting diode chip may have other configurations as shown in FIGS. 11B-11D. This will be described in detail in the following description. Therefore, the inventive concept and scope are not limited to the exemplary embodiment shown in FIG. 11A. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

Figure 11E:
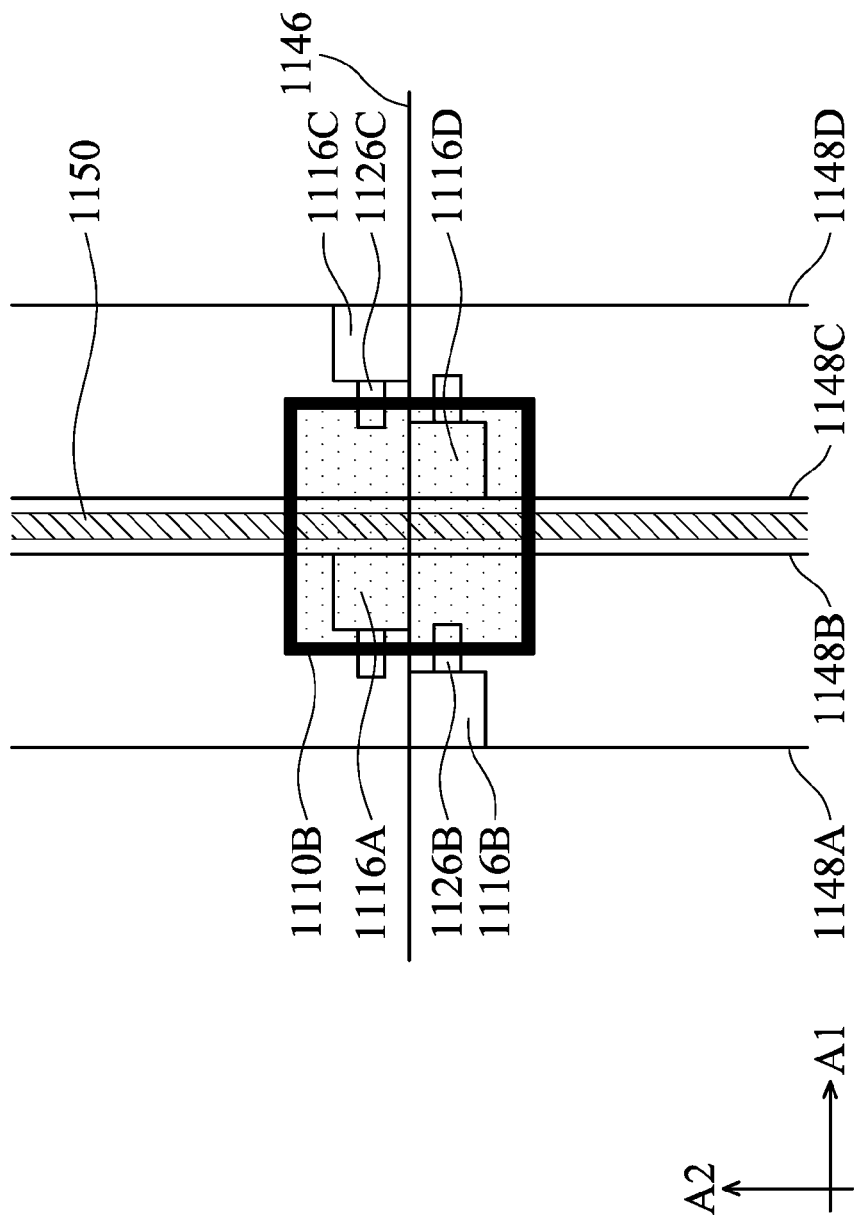

It should be noted that the exemplary embodiment set forth in FIGS. 11A-11D is merely for the purpose of illustration. In addition to the embodiment set forth in FIGS. 111A-11D, the light-emitting diode chip may have other configurations as shown in FIG. 11E. This will be described in detail in the following description. Therefore, the inventive concept and scope are not limited to the exemplary embodiment shown in FIGS. 11A-11D. This will be described in detail in the following description. Note that the same or similar elements or layers corresponding to those of the semiconductor device are denoted by like reference numerals. The same or similar elements or layers denoted by like reference numerals have the same meaning and will not be repeated for the sake of brevity.

The difference between the embodiment shown in FIG. 11E and the embodiment shown in FIGS. 11A-11D is that the light-emitting diode chip 1110B partially covers the display region 102. The light-emitting diode chip 1110B also partially covers the first transistor 1116A, second transistor 1116B, third transistor 1116C and fourth transistor 1116D which the light-emitting diode chip 1110A corresponds to. In particular, the light-emitting diode chip 1110B covers the connection electrodes 1126B and 1126C of the transistors 1116B and 1116C. However, in other embodiments in which there are no connection electrodes 1126B and 1126C, the light-emitting diode chip 1110B covers the drain electrodes of the transistors 1116B and 1116C.

Figure 12:
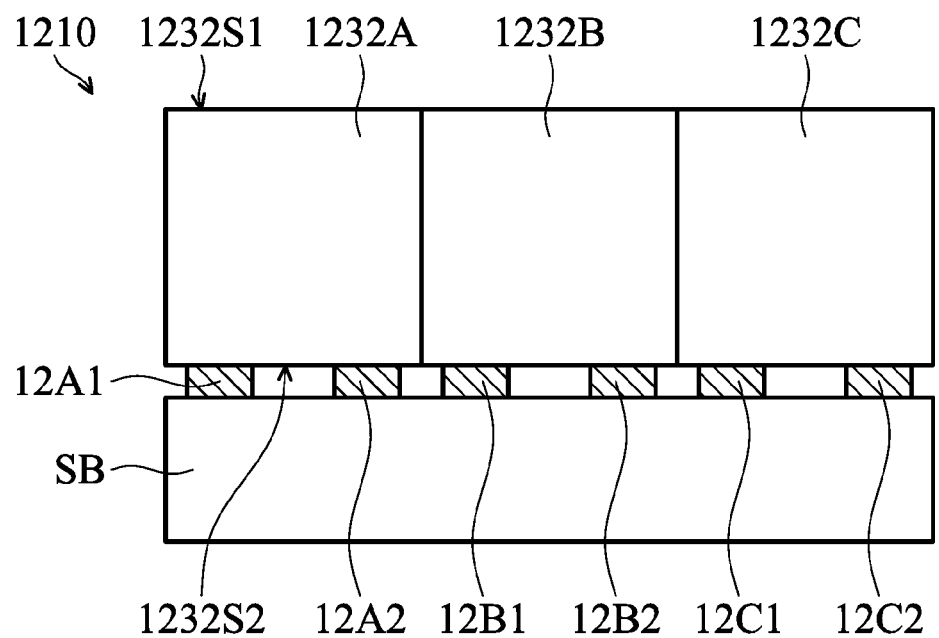
FIG. 12A is a side view of a light-emitting diode chip and a substrate in accordance with another embodiment of the present disclosure.
FIG. 12B is a bottom view of a light-emitting diode chip in accordance with another embodiment of the present disclosure.
Figure 12:
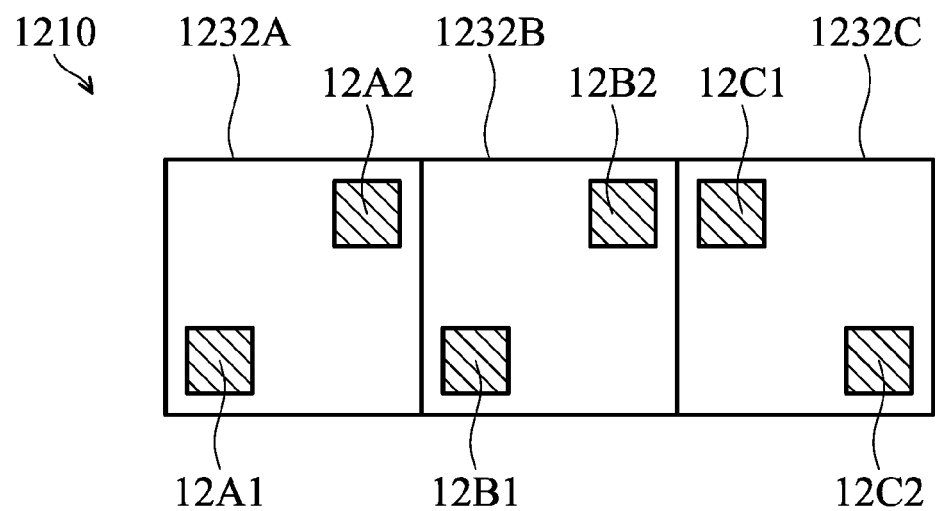

FIG. 12A is a side view of a light-emitting diode chip 1210 and a substrate SB in accordance with another embodiment of the present disclosure. FIG. 12B is a bottom view of the light-emitting diode chip 1210 in accordance with another embodiment of the present disclosure. As shown in FIGS. 12A-12B, in some embodiments of the present disclosure, one light-emitting diode chip 1210 is disposed over the substrate SB. In some embodiments of the present disclosure, the substrate SB may be a transistor substrate.

The light-emitting diode chip 1210 includes three light-emitting units 1232A, 1232B and 1232C. The light-emitting units 1232A, 1232B and 1232C are also referred to as light-emitting regions. In this embodiment, the light-emitting units 1232A, 1232B and 1232C are disposed in the same light-emitting diode chip 1210. In other words, the light-emitting units 1232A, 1232B and 1232C are different portions of the same light-emitting diode chip 1210.

In some embodiments of the present disclosure, the light-emitting units 1232A, 1232B and 1232C of the light-emitting diode chip 1210 may be manufactured from the same wafer. In addition, the light-emitting diode chip 1210 is formed by the light-emitting units 1232A, 1232B and 1232C in one piece.

In some embodiments of the present disclosure, the light-emitting unit 1232A emits blue light, the light-emitting unit 1232B emits green light, and the light-emitting unit 1232C emits red light. In addition, the light-emitting diode chip 1210 may emit white light or any other color of light by controlling the light-emitting units 1232A, 1232B and 1232C.

In this disclosure, the color emitted by the light-emitting units is not limited to the primary colors (red, blue, and green). Any other color which may be produced theoretically or practically by the electroluminescent element may be emitted by the light-emitting units.

Still referring to FIGS. 12A-12B, in some embodiments of the present disclosure, the light-emitting units of the light-emitting diode chip 1210 includes a top surface 1232S1 and a bottom surface 1232S2. The light-emitting diode chip 1210 may include a plurality of electrodes disposed over the bottom surface 1232S2 of the light-emitting units. In particular, the light-emitting diode chip 1210 includes the electrode 12A1 and electrode 12A2 disposed over the bottom surface 1232S2 of the light-emitting unit 1232A. The electrode 12A1 and electrode 12A2 are electrically connected to the light-emitting unit 1232A. The electrode 12A1 and electrode 12A2 may be a P-type electrode and an N-type electrode, respectively. The light-emitting unit 1232A may be bonded to the substrate SB through the electrode 12A1 and electrode 12A2, and may be electrically connected to the substrate SB.

The light-emitting diode chip 1210 further includes the electrode 12B1 and electrode 12B2 disposed over the bottom surface 1232S2 of the light-emitting unit 1232B. The electrode 12B1 and electrode 12B2 are electrically connected to the light-emitting unit 1232B. The electrode 12B 1 and electrode 12B2 may be a P-type electrode and an N-type electrode, respectively. The light-emitting unit 1232B may be bonded to the substrate SB through the electrode 12B1 and electrode 12B2, and may be electrically connected to the substrate SB.

The light-emitting diode chip 1210 further includes the electrode 12C1 and electrode 12C2 disposed over the bottom surface 1232S2 of the light-emitting unit 1232C. The electrode 12C1 and electrode 12C2 is electrically connected to the light-emitting unit 1232C. The electrode 12C1 and electrode 12C2 may be a P-type electrode and an N-type electrode, respectively. The light-emitting unit 1232C may be bonded to the substrate SB through the electrode 12C1 and electrode 12C2, and may be electrically connected to the substrate SB.

Still referring to FIG. 12A, in some embodiments of the present disclosure, the electrode 12A1, electrode 12A2, electrode 12B1, electrode 12B2, electrode 12C1 and electrode 12C2 are all disposed over the bottom surface 1232S2 of the light-emitting units of the light-emitting diode chip 1210. In other words, the electrode 12A1, electrode 12A2, electrode 12B1, electrode 12B2, electrode 12C1 and electrode 12C2 are all disposed over the same side of the light-emitting diode chip 1210. In addition, in some embodiments of the present disclosure, the light-emitting diode chip 1210 is bonded to the substrate SB using the flip chip method.

In some embodiments of the present disclosure, since the light-emitting diode chip includes a plurality of light-emitting units at the same time, and the light-emitting diode chip may emit white light or any other color of light by itself, the amount of light-emitting diode chips used in the display device in some embodiments of the present disclosure may be reduced compared to the display device using the light-emitting diode chip which can only emit a single color. Therefore, the number of times that the light-emitting diode chips are attached onto the transistor substrate during the manufacturing process may be reduced, which in turn reduces manufacturing time and cost, and improves the yield.

In addition, since the embodiments of the present disclosure use only one light-emitting diode chip to represent the color of one pixel, rather than using three light-emitting diode chips to represent the color of one pixel, the embodiments of the present disclosure may improve the resolution. In addition, since the embodiments of the present disclosure do not need wavelength-converting material to convert the color of light emitted by the light-emitting diode chip, the thickness of the device in the embodiments of the present disclosure may be reduced.

Figure 13:
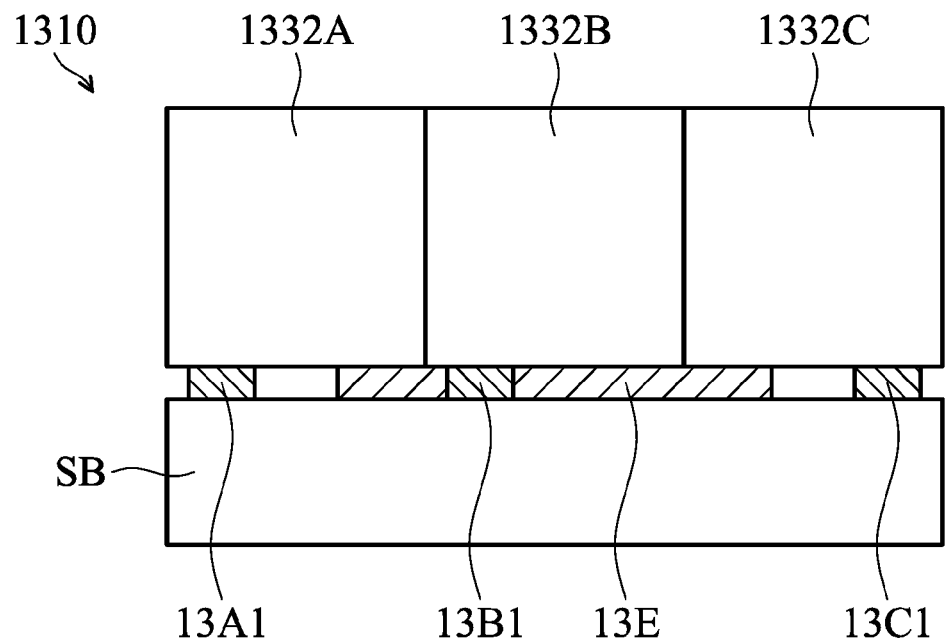
FIG. 13A is a side view of a light-emitting diode chip and a substrate in accordance with another embodiment of the present disclosure.
FIG. 13B is a bottom view of a light-emitting diode chip in accordance with another embodiment of the present disclosure.
Figure 13:
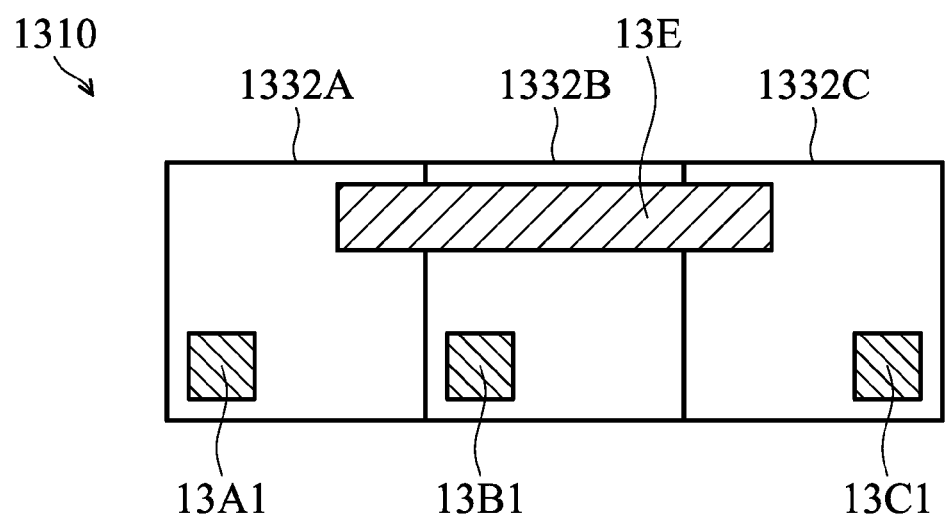

FIG. 13A is a side view of a light-emitting diode chip 1310 and a substrate SB in accordance with another embodiment of the present disclosure, FIG. 13B is a bottom view of the light-emitting diode chip 1310 in accordance with another embodiment of the present disclosure. The difference between the embodiment shown in FIGS. 13A-13B and the embodiment shown in FIGS. 12A-12B is that the light-emitting units 1332A, 1332B and 1332C are electrically connected to a common electrode 13E. In particular, the light-emitting unit 1332A is electrically connected to the electrode 13A1 and the common electrode 13E, the light-emitting unit 1332B is electrically connected to the electrode 13B1 and the common electrode 13E, and the light-emitting unit 1332C is electrically connected to the electrode 13C1 and the common electrode 13E.

Figure 14A:
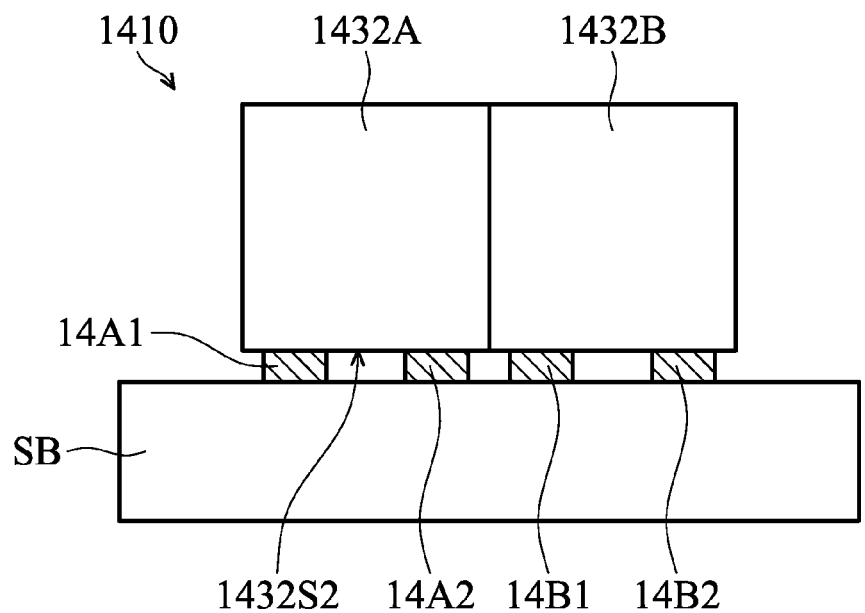
FIG. 14A is a side view of a light-emitting diode chip and a substrate in accordance with another embodiment of the present disclosure.
Figure 14B:
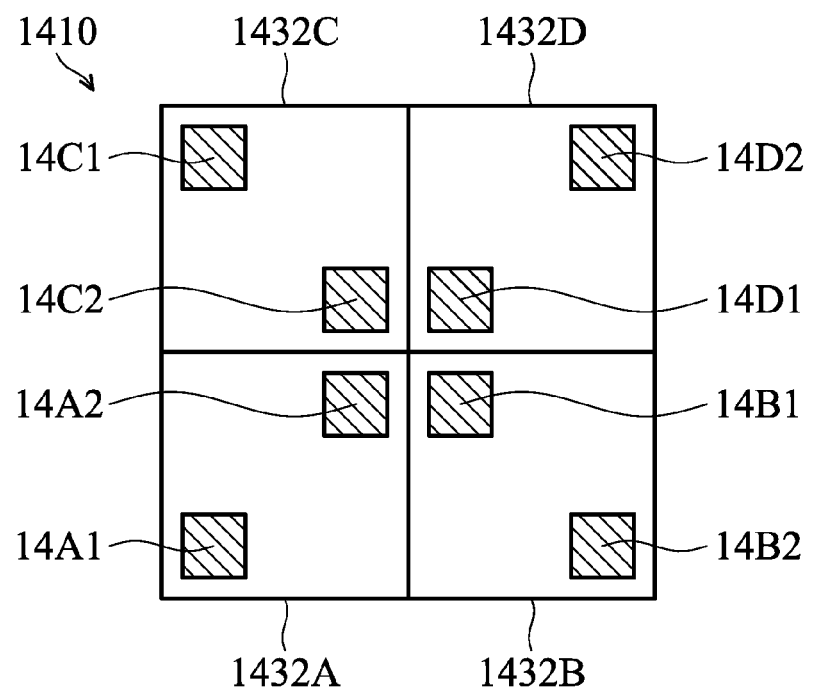
FIG. 14B is a bottom view of a light-emitting diode chip in accordance with another embodiment of the present disclosure.

FIG. 14A is a side view of a light-emitting diode chip 1410 and a substrate SB in accordance with another embodiment of the present disclosure, FIG. 14B is a bottom view of the light-emitting diode chip 1410 in accordance with another embodiment of the present disclosure. The difference between the embodiment shown in FIGS. 14A-14B and the embodiment shown in FIGS. 12A-12B is that the light-emitting diode chip 1410 includes four light-emitting units 1432A, 1432B, 1432C and 1432D.

In some embodiments of the present disclosure, the light-emitting unit 1432A emits blue light, the light-emitting unit 1432B emits green light, the light-emitting unit 1432C emits red light, and the light-emitting unit 1432D emits yellow light. The brightness of the light-emitting diode chip 1410 may be enhanced by the additional light-emitting unit 1432D.

Still referring to FIGS. 14A-14B, in some embodiments of the present disclosure, the light-emitting diode chip 1410 may include a plurality of electrodes disposed over the bottom surface 1432S2 of the light-emitting units. In particular, the light-emitting diode chip 1410 includes the electrode 14A1 and the electrode 14A2 disposed over the bottom surface 1432S2 of the light-emitting unit 1432A. The electrode 14A1 and the electrode 14A2 are electrically connected to the light-emitting unit 1432A. The electrode 14A1 and the electrode 14A2 may be a P-type electrode and an N-type electrode, respectively. The light-emitting unit 1432A may be bonded to the substrate SB through the electrode 14A1 and the electrode 14A2, and may be electrically connected to the substrate SB.

In particular, the light-emitting diode chip 1410 further includes the electrode 14B 1 and the electrode 14B2 disposed over the bottom surface 1432S2 of the light-emitting unit 1432B. The electrode 14B 1 and the electrode 14B2 are electrically connected to the light-emitting unit 1432B. The electrode 14B1 and the electrode 14B2 may be a P-type electrode and an N-type electrode, respectively. The light-emitting unit 1432B may be bonded to the substrate SB through the electrode 14B1 and the electrode 14B2, and may be electrically connected to the substrate SB.

In particular, the light-emitting diode chip 1410 further includes the electrode 14C1 and the electrode 14C2 disposed over the bottom surface 1432S2 of the light-emitting unit 1432C. The electrode 14C1 and the electrode 14C2 are electrically connected to the light-emitting unit 1432C. The electrode 14C1 and the electrode 14C2 may be a P-type electrode and an N-type electrode, respectively. The light-emitting unit 1432C may be bonded to the substrate SB through the electrode 14C1 and the electrode 14C2, and may be electrically connected to the substrate SB.

In particular, the light-emitting diode chip 1410 further includes the electrode 14D1 and the electrode 14D2 disposed over the bottom surface 1432S2 of the light-emitting unit 1432D. The electrode 14D1 and the electrode 14D2 are electrically connected to the light-emitting unit 1432D. The electrode 14D1 and the electrode 14D2 may be a P-type electrode and an N-type electrode, respectively. The light-emitting unit 1432D may be bonded to the substrate SB through the electrode 14D1 and the electrode 14D2, and may be electrically connected to the substrate SB.

Figure 15A:
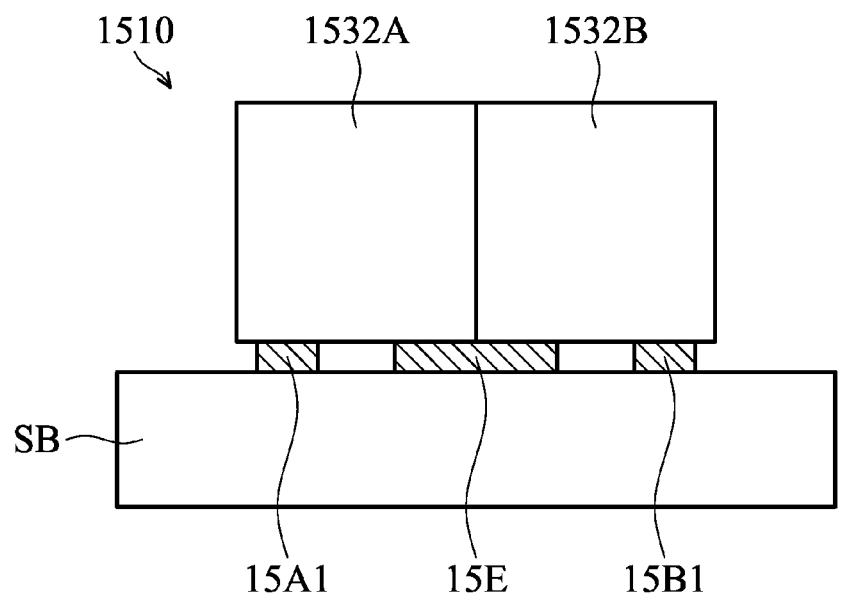
FIG. 15A is a side view of a light-emitting diode chip and a substrate in accordance with another embodiment of the present disclosure.
Figure 15B:
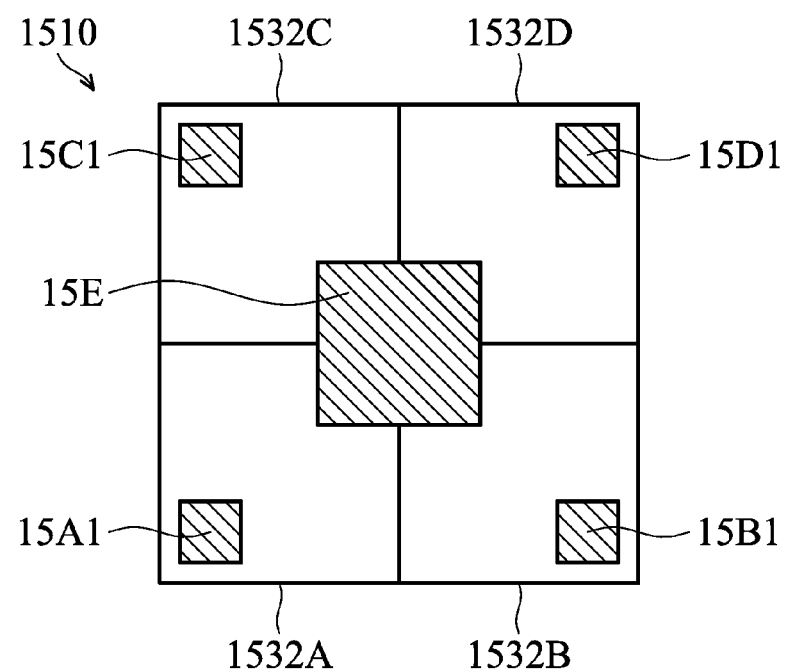
FIG. 15B is a bottom view of a light-emitting diode chip in accordance with another embodiment of the present disclosure.

FIG. 15A is a side view of a light-emitting diode chip 1510 and a substrate SB in accordance with another embodiment of the present disclosure, and FIG. 15B is a bottom view of the light-emitting diode chip 1510 in accordance with another embodiment of the present disclosure. The difference between the embodiment shown in FIGS. 15A-15B and the embodiment shown in FIGS. 12A-12B is that the light-emitting units 1532A, 1532B, 1532C and 1532D are electrically connected to a common electrode 15E. In particular, the light-emitting unit 1532A is electrically connected to the electrode 15A1 and the common electrode 15E, the light-emitting unit 1532B is electrically connected to the electrode 15B1 and the common electrode 15E, the light-emitting unit 1532C is electrically connected to the electrode 15C1 and the common electrode 15E, and the light-emitting unit 1532D is electrically connected to the electrode 15D1 and the common electrode 15E.

Figure 16A:
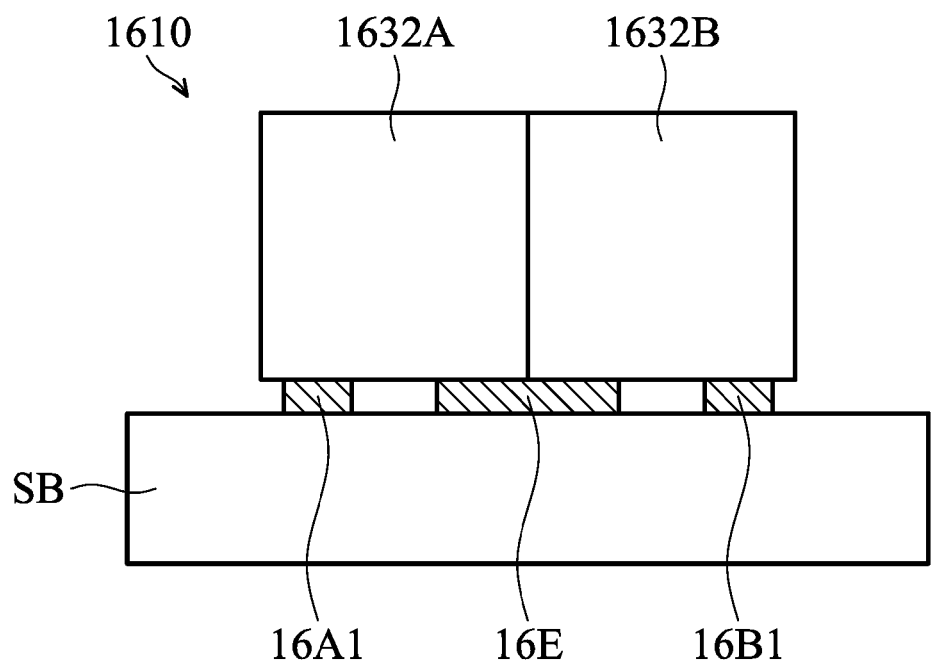
FIG. 16A is a side view of a light-emitting diode chip and a substrate in accordance with another embodiment of the present disclosure.
Figure 16B:
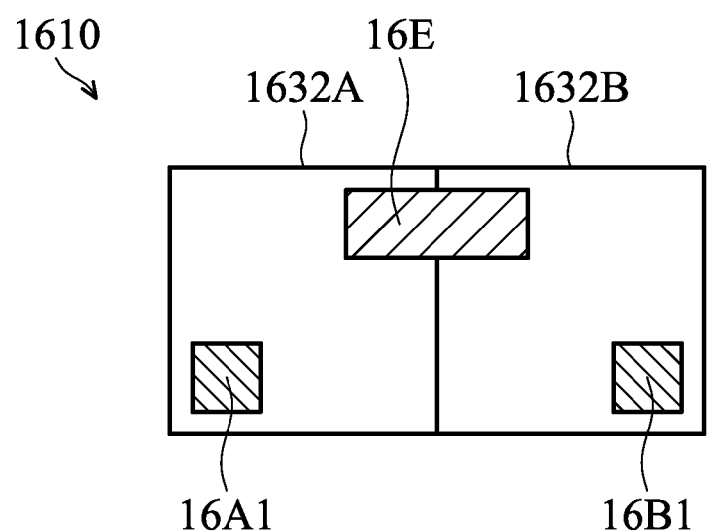
FIG. 16B is a bottom view of a light-emitting diode chip in accordance with another embodiment of the present disclosure.

FIG. 16A is a side view of a light-emitting diode chip 1610 and a substrate SB in accordance with another embodiment of the present disclosure, and FIG. 16B is a bottom view of the light-emitting diode chip 1610 in accordance with another embodiment of the present disclosure. The difference between the embodiment shown in FIGS. 16A-16B and the embodiment shown in FIGS. 12A-12B is that the light-emitting diode chip 1610 includes two light-emitting units 1632A and 1632B. The light-emitting units 1632A and 1632B are electrically connected to a common electrode 16E. In particular, the light-emitting unit 1632A is electrically connected to the electrode 16A1 and the common electrode 16E, and the light-emitting unit 1632B is electrically connected to the electrode 16B1 and the common electrode 16E.

In addition, the light-emitting unit 1632A emits blue light, and the light-emitting unit 1632B emits yellow light. In addition, the light-emitting diode chip 1610 may emit white light or any other color of light by controlling the light-emitting units 1632A and 1632B.

Figure 17A:
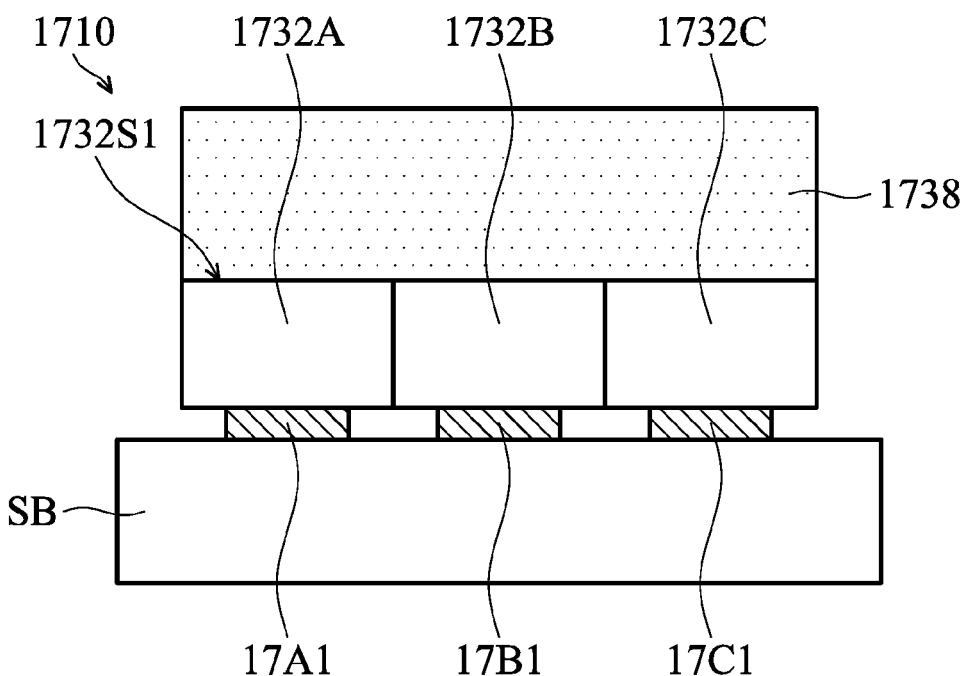
FIG. 17A is a side view of a light-emitting diode chip and a substrate in accordance with another embodiment of the present disclosure.
Figure 17B:
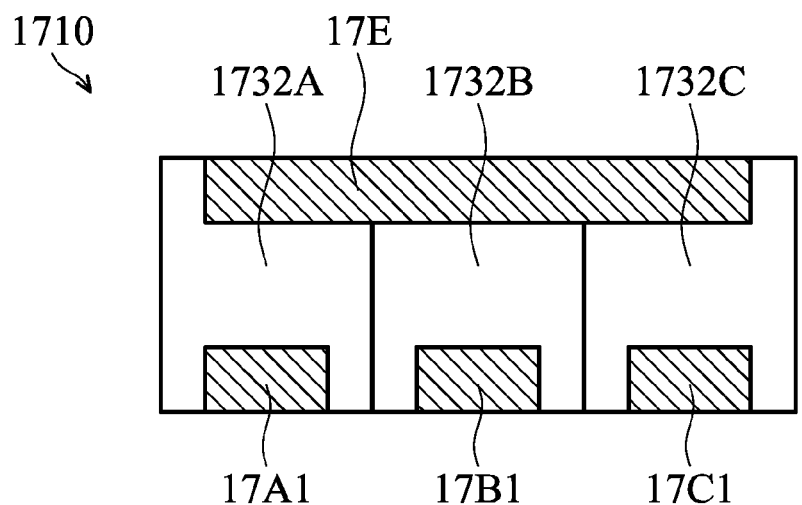
FIG. 17B is a bottom view of a light-emitting diode chip in accordance with another embodiment of the present disclosure.

FIG. 17A is a side view of a light-emitting diode chip 1710 and a substrate SB in accordance with another embodiment of the present disclosure, and FIG. 17B is a bottom view of the light-emitting diode chip 1710 in accordance with another embodiment of the present disclosure. The difference between the embodiment shown in FIGS. 17A-17B and the embodiment shown in FIGS. 12A-12B is that the display device further includes a wavelength-converting material layer 1738 (or a photoluminescence layer 1738) disposed over the top surface 1732S1 of the light-emitting diode chip 1710.

In some embodiments of the present disclosure, the light-emitting units 1732A, 1732B and 1732C may emit blue light, and the wavelength-converting material layer 1738 may convert the blue light into white light.

In addition, the light-emitting unit 1732A is electrically connected to the electrode 17A1 and the common electrode 17E, the light-emitting unit 1732B is electrically connected to the electrode 17B1 and the common electrode 17E, and the light-emitting unit 1732C is electrically connected to the electrode 17C1 and the common electrode 17E.

Figure 18:
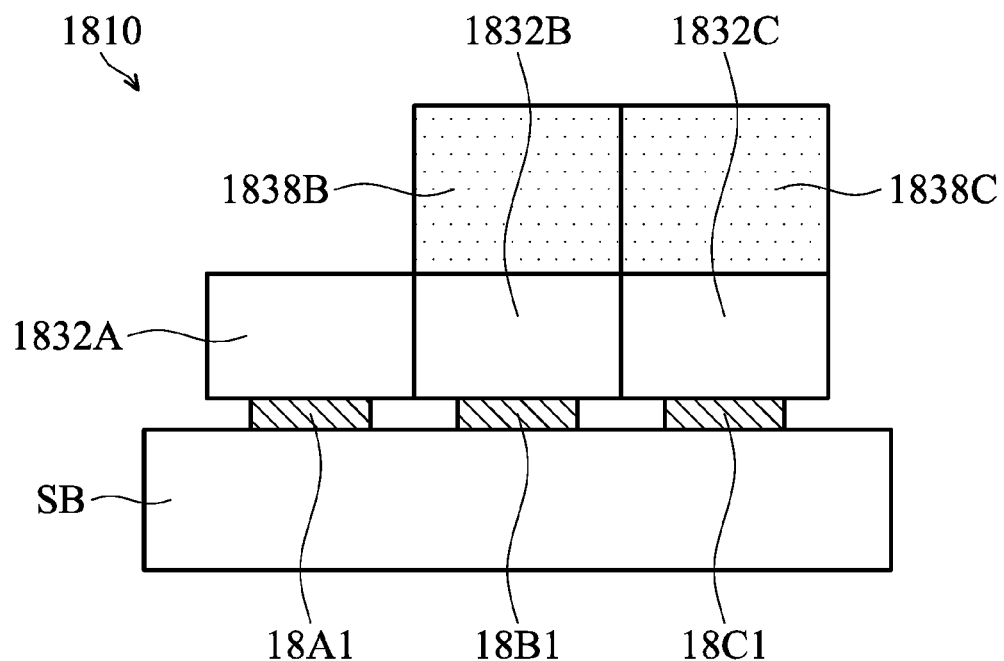
FIG. 18A is a side view of a light-emitting diode chip and a substrate in accordance with another embodiment of the present disclosure.
FIG. 18B is a bottom view of a light-emitting diode chip in accordance with another embodiment of the present disclosure.
Figure 18:
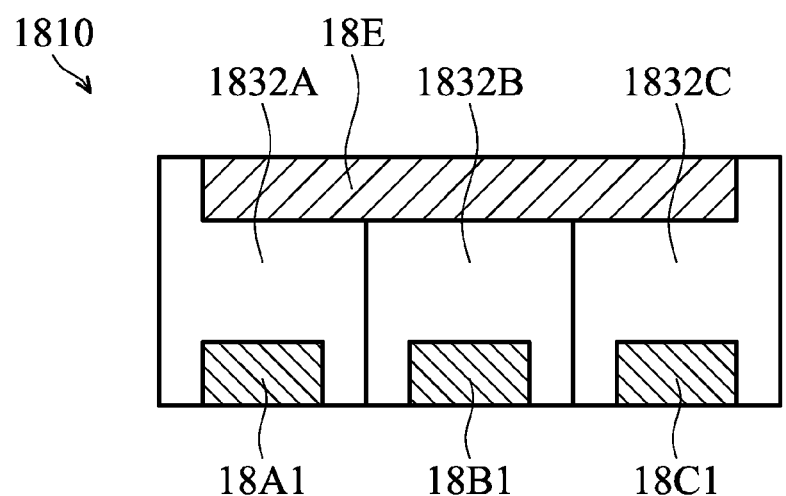

FIG. 18A is a side view of a light-emitting diode chip 1810 and a substrate SB in accordance with another embodiment of the present disclosure, and FIG. 18B is a bottom view of the light-emitting diode chip 1810 in accordance with another embodiment of the present disclosure. The difference between the embodiment shown in FIGS. 18A-18B and the embodiment shown in FIGS. 17A-17B is that there is no wavelength-converting material layer disposed over the light-emitting unit 1832A of the light-emitting diode chip 1810. And there is a wavelength-converting material layer 1838B disposed over the light-emitting unit 1832B, and a wavelength-converting material layer 1838C disposed over the light-emitting unit 1832C.

In some embodiments of the present disclosure, the light-emitting units 1832A, 1832B and 1832C may emit blue light. The wavelength-converting material layer 1838B may convert the blue light emitted from the light-emitting unit 1832B into green light, and the wavelength-converting material layer 1838C may convert the blue light emitted from the light-emitting unit 1832C into red light. The red light, the green light, and the blue light emitted from the light-emitting unit 1832A may be mixed to produce white light or any other color of light.

In addition, the light-emitting unit 1832A is electrically connected to the electrode 18A1 and the common electrode 18E, the light-emitting unit 1832B is electrically connected to the electrode 18B1 and the common electrode 18E, and the light-emitting unit 1832C is electrically connected to the electrode 18C1 and the common electrode 18E.

Figure 19:
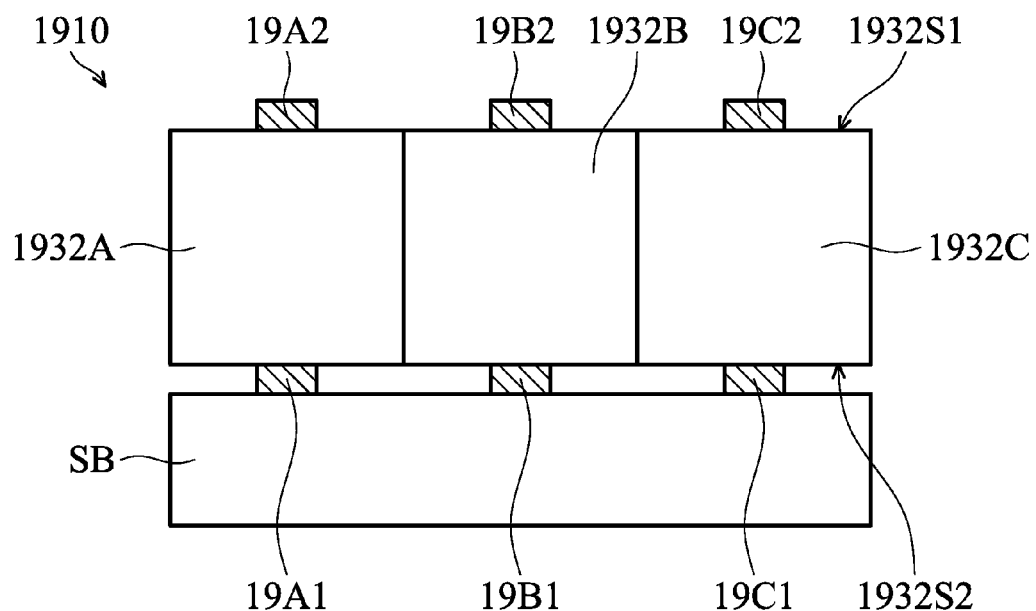
FIG. 19A is a side view of a light-emitting diode chip and a substrate in accordance with another embodiment of the present disclosure.
FIG. 19B is a bottom view of a light-emitting diode chip in accordance with another embodiment of the present disclosure.
Figure 19:
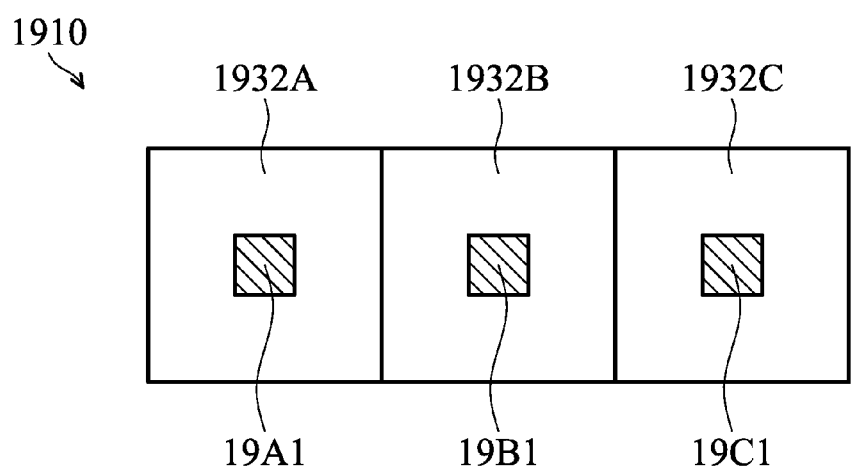

FIG. 19A is a side view of a light-emitting diode chip 1910 and a substrate SB in accordance with another embodiment of the present disclosure, and FIG. 19B is a bottom view of the light-emitting diode chip 1910 in accordance with another embodiment of the present disclosure. The difference between the embodiment shown in FIGS. 19A-19B and the embodiment shown in FIGS. 12A-12B is that the electrode 19A1 and the electrode 19A2 are disposed over the bottom surface 1932S2 and the top surface 1932S1 of the light-emitting unit 1932A, respectively. The electrode 19B1 and the electrode 19B2 are disposed over the bottom surface 1932S2 and the top surface 1932S1 of the light-emitting unit 1932B, respectively. The electrode 19C1 and the electrode 19C2 are disposed over the bottom surface 1932S2 and the top surface 1932S1 of the light-emitting unit 1932C, respectively.

Figure 20:
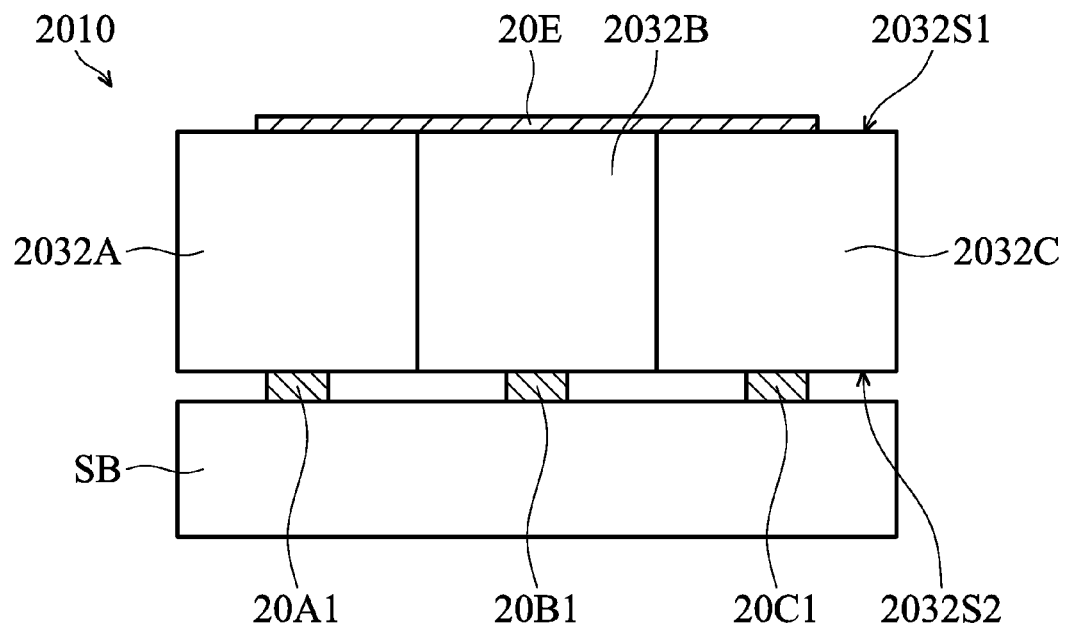
FIG. 20A is a side view of a light-emitting diode chip and a substrate in accordance with another embodiment of the present disclosure.
FIG. 20B is a bottom view of a light-emitting diode chip in accordance with another embodiment of the present disclosure.
Figure 20:
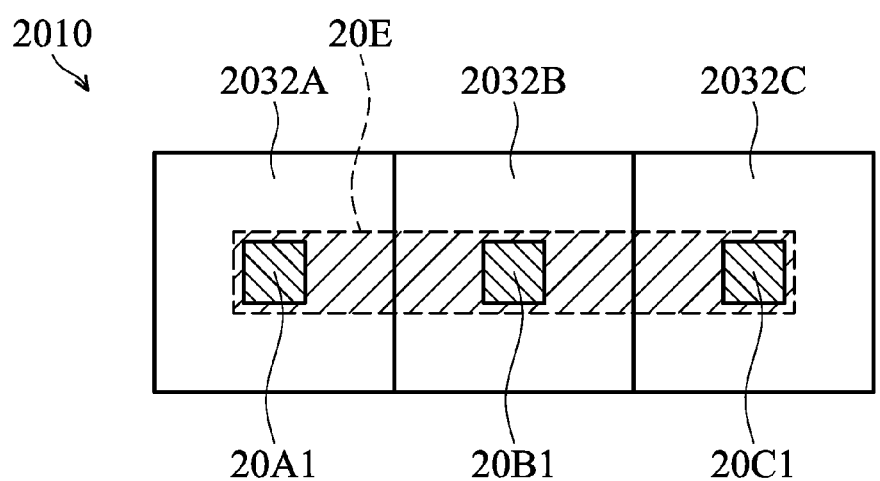

FIG. 20A is a side view of a light-emitting diode chip 2010 and a substrate SB in accordance with another embodiment of the present disclosure, and FIG. 20B is a bottom view of the light-emitting diode chip 2010 in accordance with another embodiment of the present disclosure. The difference between the embodiment shown in FIGS. 20A-20B and the embodiment shown in FIGS. 13A-13B is that the common electrode 20E is disposed over the top surface 2032S1 of the light-emitting unit 2032A, the light-emitting unit 2032B and the light-emitting unit 2032C. The electrode 20A1, the electrode 20B1 and the electrode 20C1 are disposed over the bottom surface 2032S2 of the light-emitting unit 2032A, the light-emitting unit 2032B and the light-emitting unit 2032C, respectively.

Figure 21:
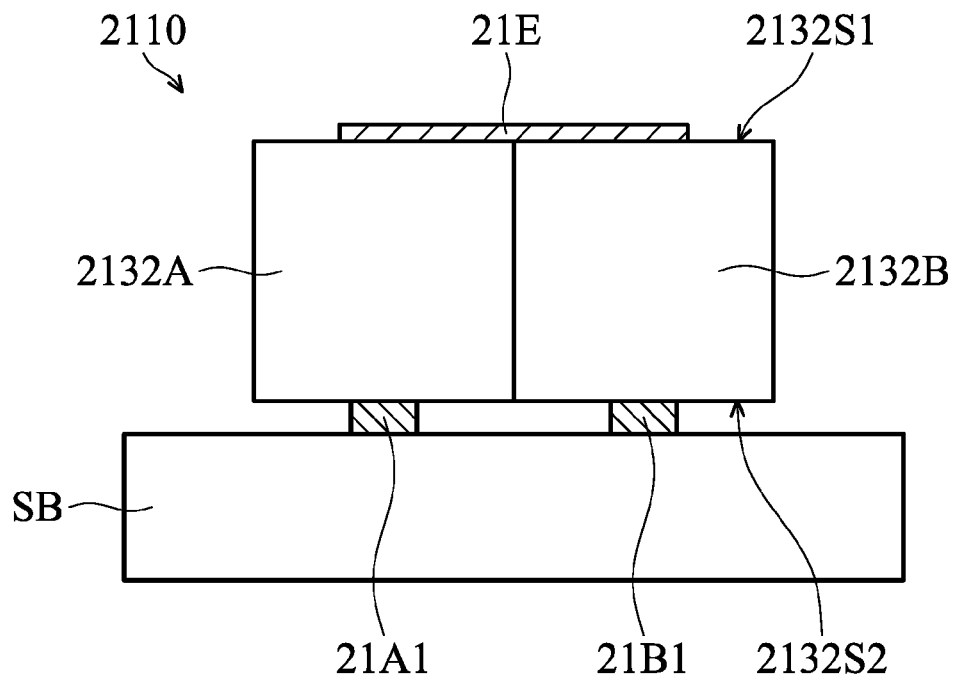
FIG. 21A is a side view of a light-emitting diode chip and a substrate in accordance with another embodiment of the present disclosure.
FIG. 21B is a bottom view of a light-emitting diode chip in accordance with another embodiment of the present disclosure.
Figure 21:
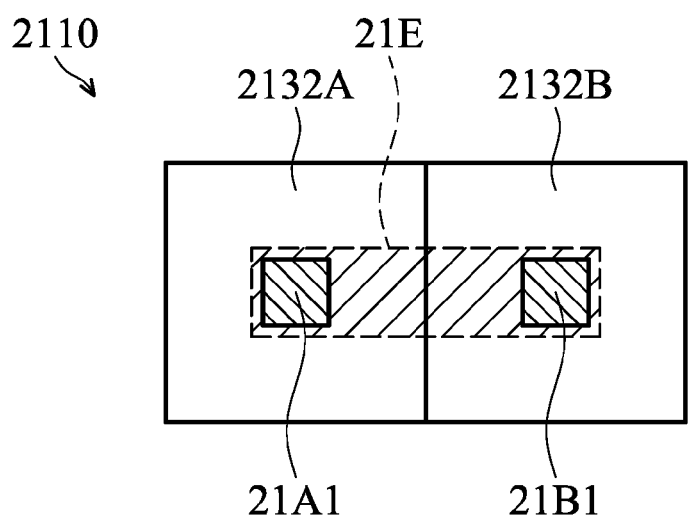

FIG. 21A is a side view of a light-emitting diode chip 2110 and a substrate SB in accordance with another embodiment of the present disclosure, FIG. 21B is a bottom view of the light-emitting diode chip 2110 in accordance with another embodiment of the present disclosure. The difference between the embodiment shown in FIGS. 21A-21B and the embodiment shown in FIGS. 16A-16B is that the common electrode 21E is disposed over the top surface 2132S1 of the light-emitting unit 2132A and the light-emitting unit 2132B. The electrode 21A1 and the electrode 21B1 are disposed over the bottom surface 2132S2 of the light-emitting unit 2132A and the light-emitting unit 2132B, respectively.

Figure 22:
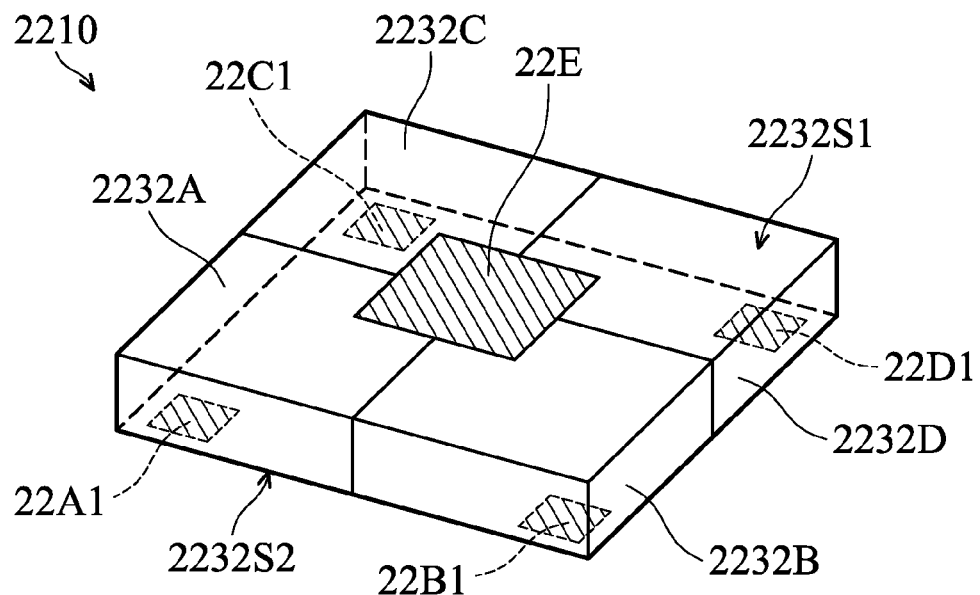
FIG. 22 is a side view of a light-emitting diode chip in accordance with another embodiment of the present disclosure.

FIG. 22 is a side view of a light-emitting diode chip 2210 in accordance with another embodiment of the present disclosure. The difference between the embodiment shown in FIG. 22 and the embodiment shown in FIGS. 15A-15B is that the common electrode 22E is disposed over the top surface 2232S1 of the light-emitting unit 2232A, the light-emitting unit 2232B, the light-emitting unit 2232C and the light-emitting unit 2232D. The electrode 22A1, the electrode 22B1, the electrode 22C1 and the electrode 22D1 are disposed over the bottom surface 2232S2 of the light-emitting unit 2232A, the light-emitting unit 2232B, the light-emitting unit 2232C and the light-emitting unit 2232D, respectively.

Figure 23:
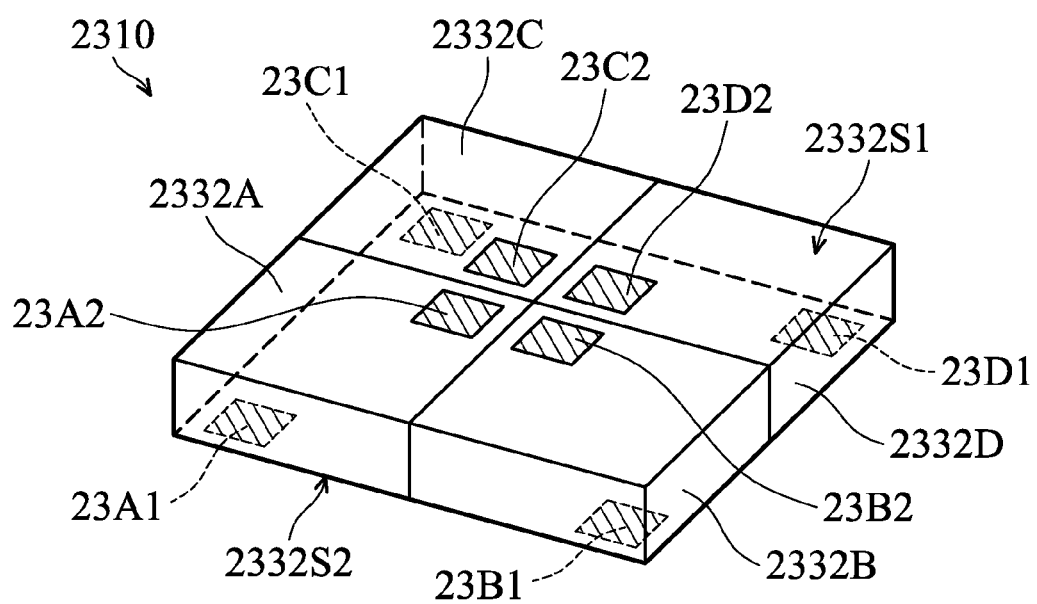
FIG. 23 is a side view of a light-emitting diode chip in accordance with another embodiment of the present disclosure.

FIG. 23 is a side view of a light-emitting diode chip 2310 in accordance with another embodiment of the present disclosure. The difference between the embodiment shown in FIG. 23 and the embodiment shown in FIGS. 14A-14B is that the electrode 23A2, the electrode 23B2, the electrode 23C2 and the electrode 23D2 are disposed over the top surface 2332S1 of the light-emitting unit 2332A, the light-emitting unit 2332B, the light-emitting unit 2332C and the light-emitting unit 2332D, respectively. The electrode 23A1, the electrode 23B1, the electrode 23C1 and the electrode 23D1 are disposed over the bottom surface 2332S2 of the light-emitting unit 2332A, the light-emitting unit 2332B, the light-emitting unit 2332C and the light-emitting unit 2332D, respectively.

Figure 24:
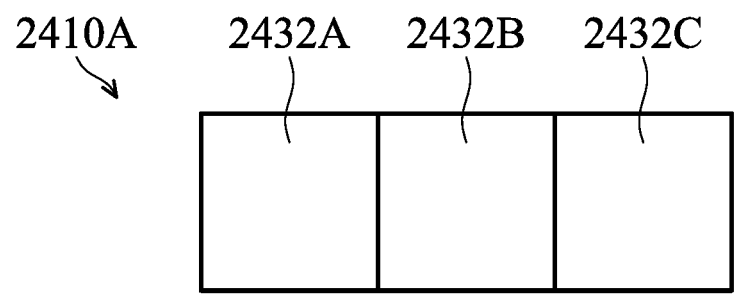
FIG. 24A is a top view of a light-emitting diode chip in accordance with another embodiment of the present disclosure.
FIG. 24B is a top view of a light-emitting diode chip in accordance with another embodiment of the present disclosure.
FIG. 24C is a top view of a light-emitting diode chip in accordance with another embodiment of the present disclosure.
FIG. 24D is a top view of a light-emitting diode chip in accordance with another embodiment of the present disclosure.
Figure 24:
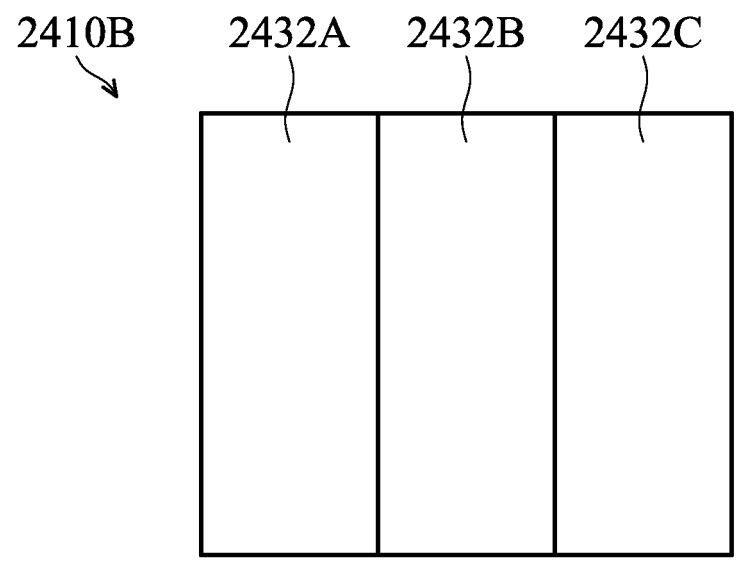
Figure 24:
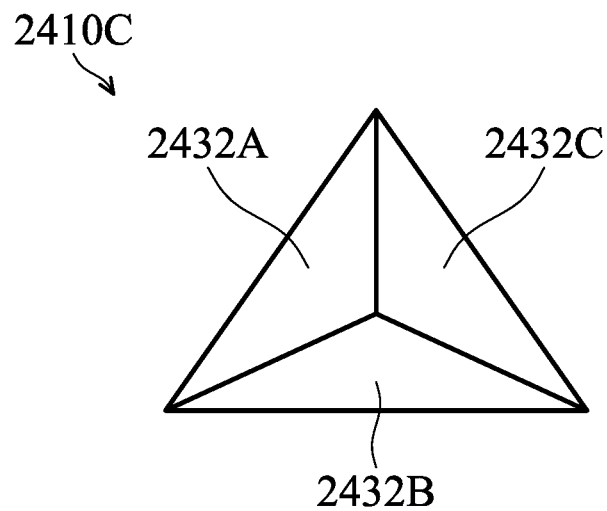
Figure 24:
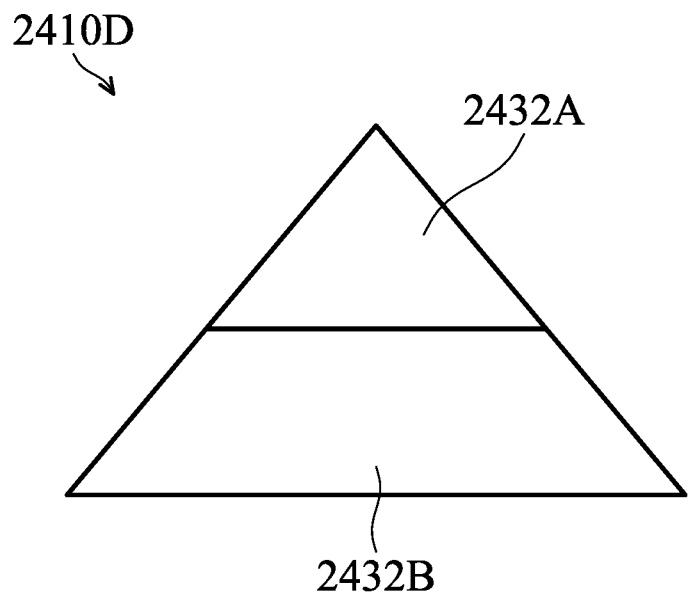

FIG. 24A is a top view of a light-emitting diode chip 2410A in accordance with another embodiment of the present disclosure. As shown in FIG. 24A, in accordance with some embodiments of the present disclosure, the light-emitting diode chip 2410A has a rectangular shape, and the light-emitting unit 2432A, the light-emitting unit 2432B and the light-emitting unit 2432C each has a substantially square shape.

FIG. 24B is a top view of a light-emitting diode chip 2410B in accordance with another embodiment of the present disclosure. As shown in FIG. 24B, in accordance with some embodiments of the present disclosure, the light-emitting diode chip 2410B has a rectangular shape, and the light-emitting unit 2432B, the light-emitting unit 2432B and the light-emitting unit 2432C each has a substantially rectangular shape.

FIG. 24C is a top view of a light-emitting diode chip 2410C in accordance with another embodiment of the present disclosure. As shown in FIG. 24C, in accordance with some embodiments of the present disclosure, the light-emitting diode chip 2410C has a triangular shape, and the light-emitting diode chip 2410C includes three light-emitting units, which are the light-emitting unit 2432A, the light-emitting unit 2432B and the light-emitting unit 2432C.

FIG. 24D is a top view of a light-emitting diode chip 2410D in accordance with another embodiment of the present disclosure. As shown in FIG. 24D, in accordance with some embodiments of the present disclosure, the light-emitting diode chip 2410D has a triangular shape, and the light-emitting diode chip 2410D includes two light-emitting units, which are the light-emitting unit 2432A and the light-emitting unit 2432B.

Figure 25:
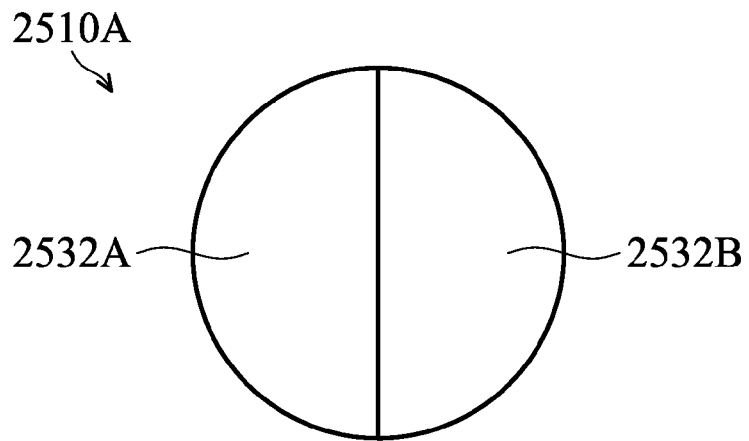
FIG. 25A is a top view of a light-emitting diode chip in accordance with another embodiment of the present disclosure.
FIG. 25B is a top view of a light-emitting diode chip in accordance with another embodiment of the present disclosure.
Figure 25:
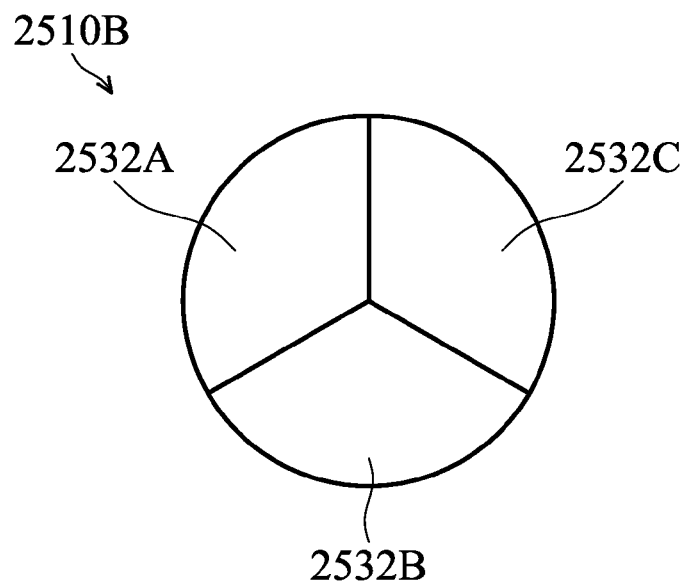

FIG. 25A is a top view of a light-emitting diode chip 2510A in accordance with another embodiment of the present disclosure. As shown in FIG. 25A, in accordance with some embodiments of the present disclosure, the light-emitting diode chip 2510A has a circular shape, and the light-emitting diode chip 2510A includes two light-emitting units, which are the light-emitting unit 2532A and the light-emitting unit 2532B.

FIG. 25B is a top view of a light-emitting diode chip 2510B in accordance with another embodiment of the present disclosure. As shown in FIG. 25B, in accordance with some embodiments of the present disclosure, the light-emitting diode chip 2510B has a circular shape, and the light-emitting diode chip 2510B includes three light-emitting units, which are the light-emitting unit 2532A, the light-emitting unit 2532B and the light-emitting unit 2532C.

Note that the above element sizes, element parameters, and element shapes are not limitations of the present disclosure. Those skilled in the art can adjust these settings or values according to different requirements. It is understood that the display device and method for manufacturing the same of the present disclosure are not limited to the configurations of FIGS. 1A-25B. The present disclosure may merely include any one or more features of any one or more embodiments of FIGS. 1A-25B. In other words, not all of the features shown in the figures should be implemented in the display device and method for manufacturing the same of the present disclosure.

In some embodiments of the present disclosure, the common electrode preferably includes the column common electrode, the row common electrode or the common electrode covering the full surface. However, the present disclosure is not limited thereto.

In some embodiments of the present disclosure, the light-emitting unit preferably includes a P-type semiconductor layer, N-type semiconductor layer, a first electrode connected to the P-type semiconductor layer and a second electrode connected to the N-type semiconductor layer. However, the present disclosure is not limited thereto.

In summary, the embodiment of the present disclosure disposes the light-emitting diode chip corresponding to at least two transistors in the display device such that the amount of light-emitting diode chips used in the display device may be reduced. Therefore, the number of times that the light-emitting diode chips are attached onto the array substrate during the manufacturing process may be reduced, which in turn reduces manufacturing time and cost, and improves the yield. In some embodiments of the present disclosure, the light-emitting diode chips emitting different light (for example red light, blue light or green light) are disposed over the array substrate. However, due to the variation in the manufacturing process, the spectrum between the light-emitting diode chips substantially emitting the same light may be different. In addition, before bonding the light-emitting diode chip onto the array substrate, selection for the light-emitting diode chip with suitable spectrum is needed. In addition, in the bonding processes, the light-emitting diode chips emitting different light are bonded in different step respectively, which in turn increases the manufacturing time. Therefore, in some embodiments of the present disclosure, by using the light-emitting diode chips emitting the same light with the color filter layer and/or the photoluminescence layer, the full-color may be achieved and the manufacturing time may be greatly reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
a first substrate;
a first transistor and a second transistor disposed over the first substrate;
a common electrode disposed over the first substrate; and
a light-emitting diode chip (LED chip) disposed over the first substrate and disposed corresponding to the first transistor and the second transistor, wherein the light-emitting diode chip comprises a first light-emitting unit and a second light-emitting unit,
wherein the first light-emitting unit is electrically connected to the first transistor and the common electrode, and the second light-emitting unit is electrically connected to the second transistor and the common electrode,
wherein the common electrode is positioned below the first light-emitting unit and the second light-emitting unit.

2. The display device as claimed in claim 1, wherein the light-emitting diode chip (LED chip) is disposed over the first substrate and is disposed corresponding to 2N transistors, wherein N is a positive integer which is 1 or higher.

3. The display device as claimed in claim 1, further comprising:
a third transistor disposed over the first substrate, wherein the light-emitting diode chip is disposed over the first substrate and is further disposed corresponding to the third transistor, wherein the light-emitting diode chip further comprises a third light-emitting unit, and the third light-emitting unit is electrically connected to the third transistor and the common electrode.

4. The display device as claimed in claim 3, wherein the light-emitting diode chip (LED chip) is disposed over the first substrate and is disposed corresponding to 3N transistors, wherein N is a positive integer which is 1 or higher.

5. The display device as claimed in claim 1, further comprising:
a fluorescent layer disposed over a light-emitting surface of the light-emitting diode chip.

6. The display device as claimed in claim 5, further comprising:

a second substrate disposed opposite the first substrate; and
a color filter layer disposed between the first substrate and the second substrate, wherein the color filter layer comprises a first color filter unit and a second color filter unit, wherein the first color filter unit is disposed at a light-emitting path of the first light-emitting unit, and the second color filter unit is disposed at a light-emitting path of the second light-emitting unit.

7. The display device as claimed in claim 1, further comprising:
a second substrate disposed opposite the first substrate; and
a quantum dot film disposed between the first substrate and the second substrate, wherein the quantum dot film comprises a first quantum dot film and a second quantum dot film, wherein the first quantum dot film is disposed at a light-emitting path of the first light-emitting unit, and the second quantum dot film is disposed at a light-emitting path of the second light-emitting unit.

8. The display device as claimed in claim 1, further comprising:
a first scan line disposed over the first substrate and extending along a first direction;
a second scan line disposed over the first substrate and extending along the first direction; and
a data line disposed over the first substrate and extending along a second direction, wherein the first direction is substantially perpendicular to the second direction,
wherein the first transistor is electrically connected to the first scan line and the data line, and the second transistor is electrically connected to the second scan line and the data line.

9. The display device as claimed in claim 1, further comprising:
a scan line disposed over the first substrate and extending along a first direction;
a first data line disposed over the first substrate and extending along a second direction; and
a second data line disposed over the first substrate and extending along the second direction, wherein the first direction is substantially perpendicular to the second direction,
wherein the first transistor is electrically connected to the first data line and the scan line, and the second transistor is electrically connected to the second data line and the scan line.

10. The display device as claimed in claim 1, further comprising:
a third transistor and a fourth transistor disposed over the first substrate;
wherein the light-emitting diode chip (LED chip) is disposed over the first substrate and is further disposed corresponding to the third transistor and the fourth transistor, the light-emitting diode chip further comprises a third light-emitting unit and a fourth light-emitting unit, and the common electrode comprises a first common electrode and a second common electrode which intersect to each other,
wherein the third light-emitting unit is electrically connected to the third transistor and the common electrode, and the fourth light-emitting unit is electrically connected to the fourth transistor and the common electrode.

11. The display device as claimed in claim 1, further comprising:

a scan line disposed over the first substrate;

a first data line disposed over the first substrate;

a second data line disposed over the first substrate;

a third data line disposed over the first substrate;

a fourth data line disposed over the first substrate; and a third transistor and a fourth transistor disposed over the first substrate, wherein the light-emitting diode chip (LED chip) is disposed over the first substrate and is further disposed corresponding to the third transistor and the fourth transistor, the light-emitting diode chip further comprises a third light-emitting unit and a fourth light-emitting unit, and the third light-emitting unit is electrically connected to the third transistor and the common electrode, and the fourth light-emitting unit is electrically connected to the fourth transistor and the common electrode, wherein the first transistor is electrically connected to the first data line and the scan line, the second transistor is electrically connected to the second data line and the scan line, the third transistor is electrically connected to the third data line and the scan line, and the fourth transistor is electrically connected to the fourth data line and the scan line.

12. The display device as claimed in claim 1, wherein the light-emitting diode chip completely covers the first transistor and the second transistor in a direction of a normal line of the first substrate.

13. The display device as claimed in claim 1, wherein the light-emitting diode chip partially covers the first transistor and the second transistor in a direction of a normal line of the first substrate.

14. The display device as claimed in claim 1, further comprising:

a second substrate disposed opposite the first substrate; and a spacer disposed between the first substrate and the second substrate.

15. The display device as claimed in claim 14, wherein the spacer is disposed at a non-display region of the display device.

16. The display device as claimed in claim 14, wherein the spacer is disposed at a display region of the display device.

17. The display device as claimed in claim 1, wherein the first light-emitting unit comprises a first electrode electrically connected to the first transistor and a second electrode electrically connected to the common electrode.

18. The display device as claimed in claim 17, wherein the first transistor is a thin film transistor, wherein the thin film transistor comprises a gate electrode, a source electrode and a drain electrode.

19. The display device as claimed in claim 18, wherein the thin film transistor further comprises a connection electrode electrically connected to the drain electrode and the first electrode.

20. The display device as claimed in claim 1, wherein the first light-emitting unit and the second light-emitting unit respectively comprise an inorganic light-emitting diode.

\* \* \* \* \*